(12) United States Patent
Koyama et al.

(10) Patent No.: US 7,088,322 B2
(45) Date of Patent: Aug. 8, 2006

(54) SEMICONDUCTOR DEVICE

(75) Inventors: Jun Koyama, Kanagawa (JP); Kiyoshi Kato, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 258 days.

(21) Appl. No.: 09/851,433

(22) Filed: May 9, 2001

(65) Prior Publication Data

US 2002/0126108 A1     Sep. 12, 2002

(30) Foreign Application Priority Data

May 12, 2000   (JP)   .............................. 2000-139458

(51) Int. Cl.
*G09G 5/00*   (2006.01)

(52) U.S. Cl. .................. 345/87; 345/204; 345/205; 345/206; 345/531; 345/538; 345/547

(58) Field of Classification Search .................. 345/98, 345/99, 204, 205, 206, 211, 219, 87, 531, 345/538, 547, 905; 349/151, 153; 348/766
See application file for complete search history.

(56) References Cited

U.S. PATENT DOCUMENTS

| | | |
|---|---|---|
| 5,043,714 A | 8/1991 | Perlman |
| 5,130,833 A | 7/1992 | Mase |
| 5,148,301 A | 9/1992 | Sawatsubashi et al. |
| 5,168,270 A | 12/1992 | Masumori et al. |
| 5,192,945 A | 3/1993 | Kusada |
| 5,196,738 A | 3/1993 | Takahara et al. |
| 5,200,847 A | 4/1993 | Mawatari et al. |
| 5,206,749 A | 4/1993 | Zavracky et al. |
| 5,261,156 A | 11/1993 | Mase et al. |
| 5,317,236 A | 5/1994 | Zavracky et al. |
| 5,376,561 A | 12/1994 | Vu et al. |
| 5,457,482 A | 10/1995 | Rhoden et al. |
| 5,534,884 A | 7/1996 | Mase et al. |
| 5,543,824 A | 8/1996 | Priem et al. |
| 5,545,577 A | 8/1996 | Tada |
| 5,552,618 A | 9/1996 | Taniguchi et al. |
| 5,574,475 A | 11/1996 | Callahan, Jr. et al. |
| 5,585,816 A | 12/1996 | Scheffer et al. |
| 5,598,180 A | 1/1997 | Suzuki et al. |
| 5,643,826 A | 7/1997 | Ohtani et al. |
| 5,648,277 A | 7/1997 | Zhang et al. |
| 5,654,811 A | 8/1997 | Spitzer et al. |
| 5,705,829 A | 1/1998 | Miyanaga et al. |
| 5,710,612 A | 1/1998 | Mase |

(Continued)

*Primary Examiner*—Bipin Shalwala
*Assistant Examiner*—Vincent E. Kovalick
(74) *Attorney, Agent, or Firm*—Eric J. Robinson; Robinson Intellectual Property Law Office, P.C.

(57) ABSTRACT

A semiconductor device capable of displaying a still image with low consumption power is provided. In the semiconductor device incorporated with a semiconductor display device capable of displaying the still image, a memory portion is mounted on a substrate on which a pixel portion is formed. As a mounting method, the memory portion is formed on the substrate on which the pixel portion is formed or a stick driver including the memory portion is used. When the still image is displayed using image data stored in such a memory portion, the still image can be displayed by inputting only simple control signals from the outside of the semiconductor device. Thus, there are provided the semiconductor display device capable of displaying the still image with low consumption power and the semiconductor device incorporated with the semiconductor display device.

18 Claims, 29 Drawing Sheets

U.S. PATENT DOCUMENTS

| | | | |
|---|---|---|---|
| 5,771,031 A | 6/1998 | Kinoshita et al. | |
| 5,781,164 A | 7/1998 | Jacobsen et al. | |
| 5,793,344 A * | 8/1998 | Koyama | 345/87 |
| 5,801,674 A | 9/1998 | Shimizu | |
| 5,821,138 A | 10/1998 | Yamazaki et al. | |
| 5,834,327 A | 11/1998 | Yamazaki et al. | |
| 5,841,497 A * | 11/1998 | Sato et al. | 349/128 |
| 5,907,313 A | 5/1999 | Kubota et al. | |
| 5,923,962 A | 7/1999 | Ohtani et al. | |
| 5,949,397 A | 9/1999 | Koyama et al. | |
| 6,025,901 A | 2/2000 | Adachi et al. | |
| 6,040,826 A * | 3/2000 | Furukawa | 345/534 |
| 6,043,800 A | 3/2000 | Spitzer et al. | |
| 6,069,793 A * | 5/2000 | Maruyama et al. | 361/687 |
| 6,118,502 A * | 9/2000 | Yamazaki et al. | 349/45 |
| 6,147,667 A | 11/2000 | Yamazaki et al. | |
| 6,165,824 A | 12/2000 | Takano et al. | |
| 6,323,836 B1 * | 11/2001 | Shin | 345/99 |
| 6,362,866 B1 | 3/2002 | Yamazaki et al. | |
| 6,465,268 B1 | 10/2002 | Hirakata et al. | |
| 6,646,288 B1 * | 11/2003 | Yamazaki et al. | 257/72 |
| 6,798,394 B1 * | 9/2004 | Chimura | 345/98 |
| 2003/0058195 A1 * | 3/2003 | Adachi et al. | 345/67 |
| 2003/0160236 A1 * | 8/2003 | Yamazaki et al. | 257/53 |

\* cited by examiner

[Fig. 1]
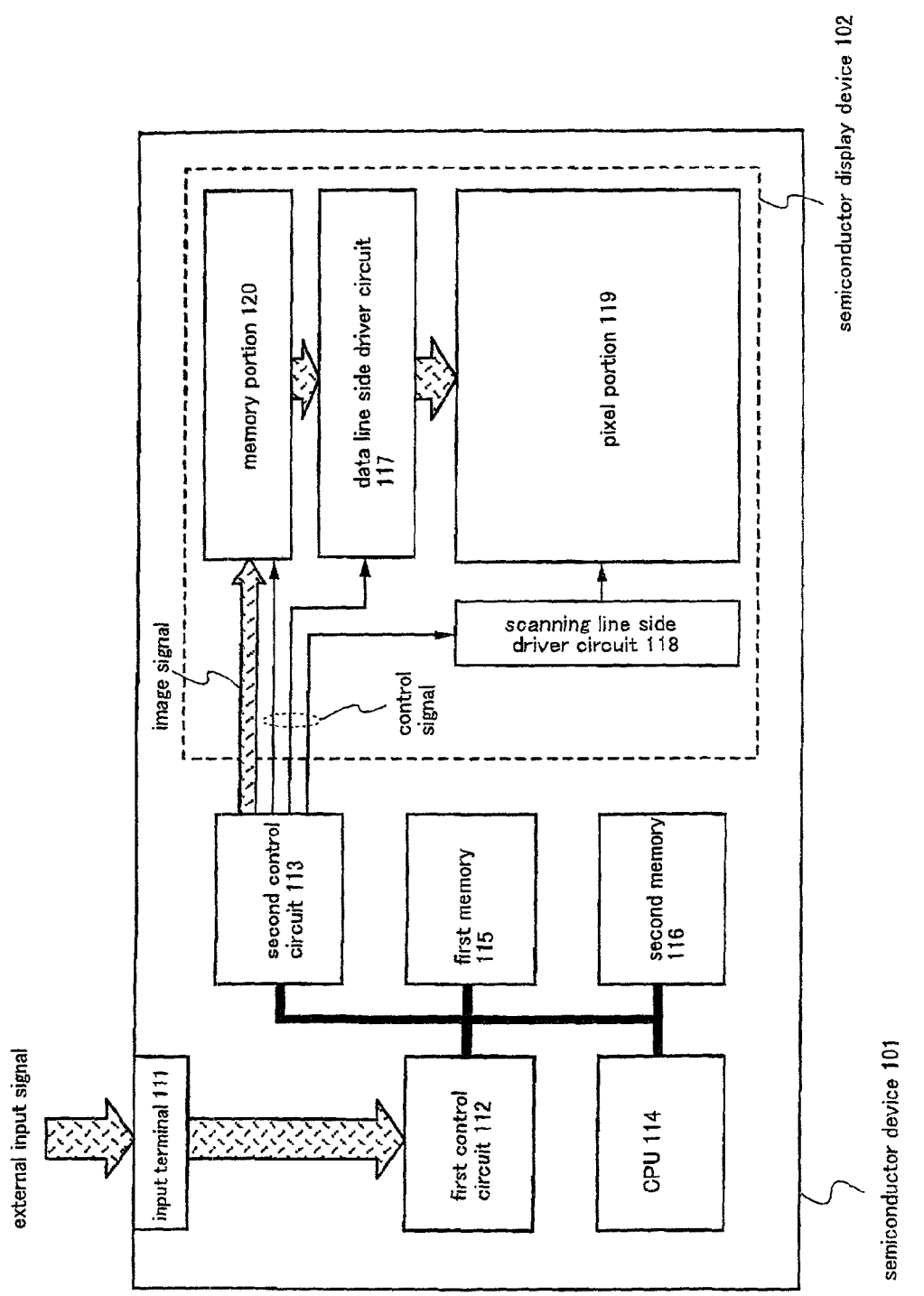

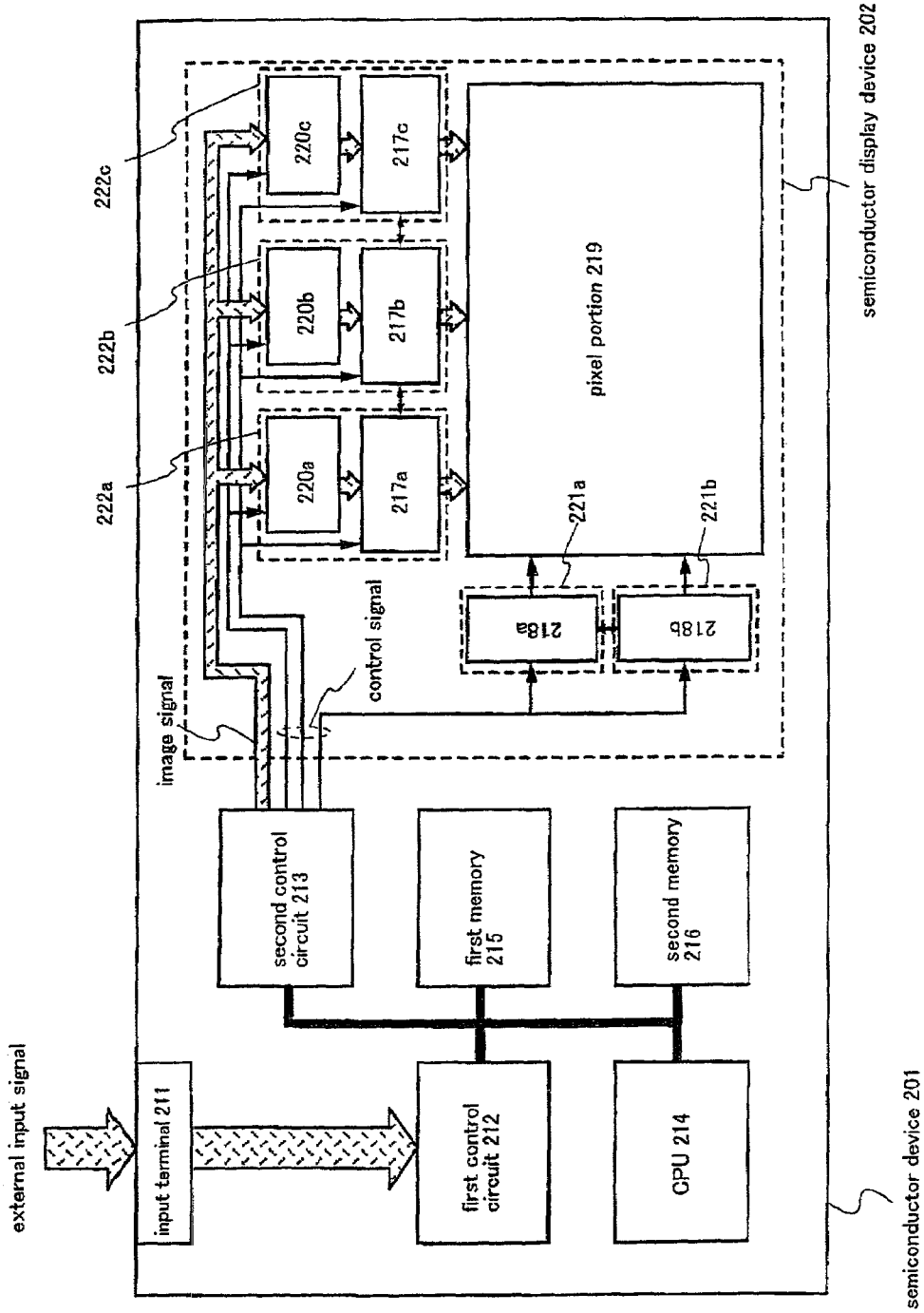
[Fig. 2]

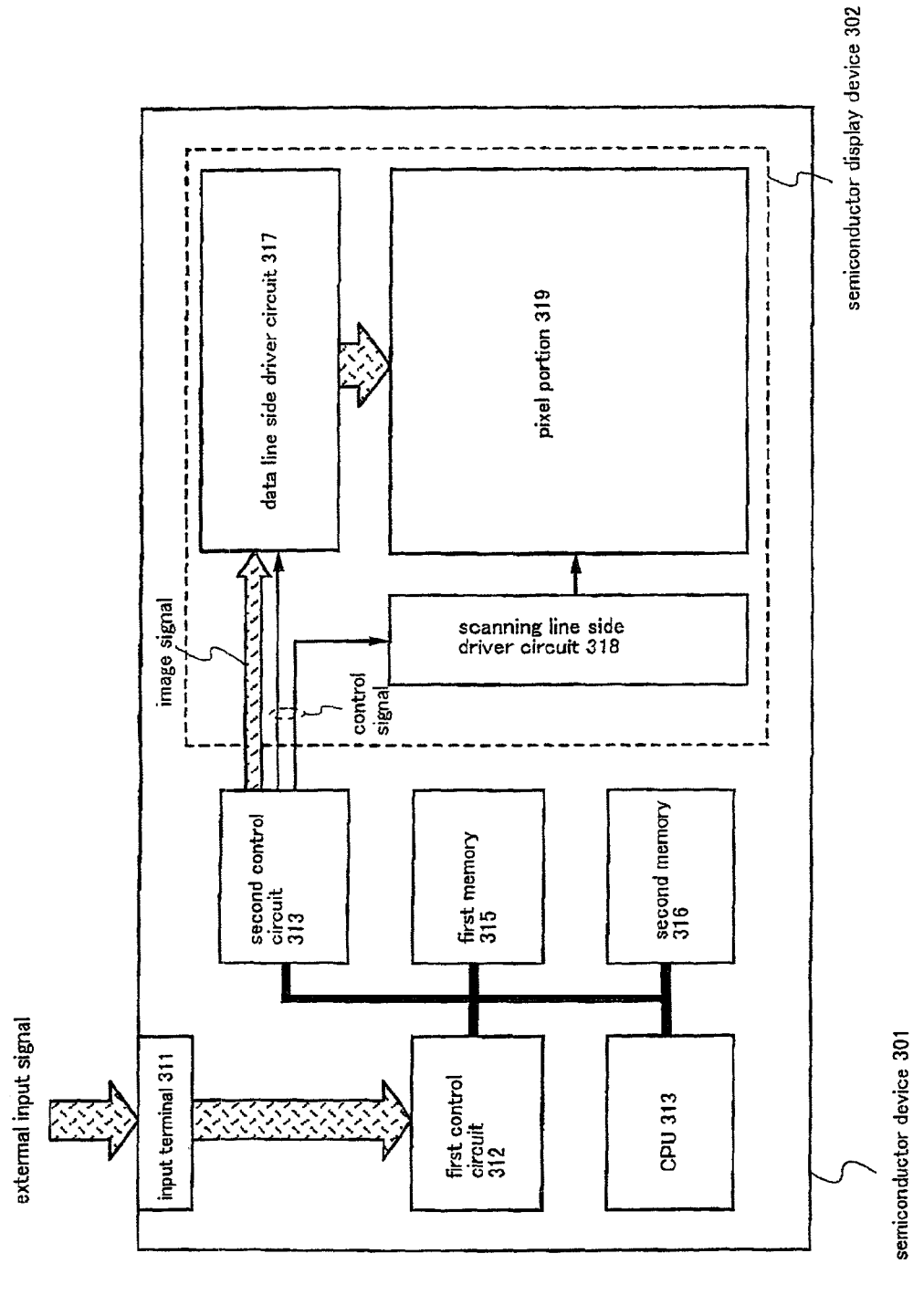
[Fig. 3]

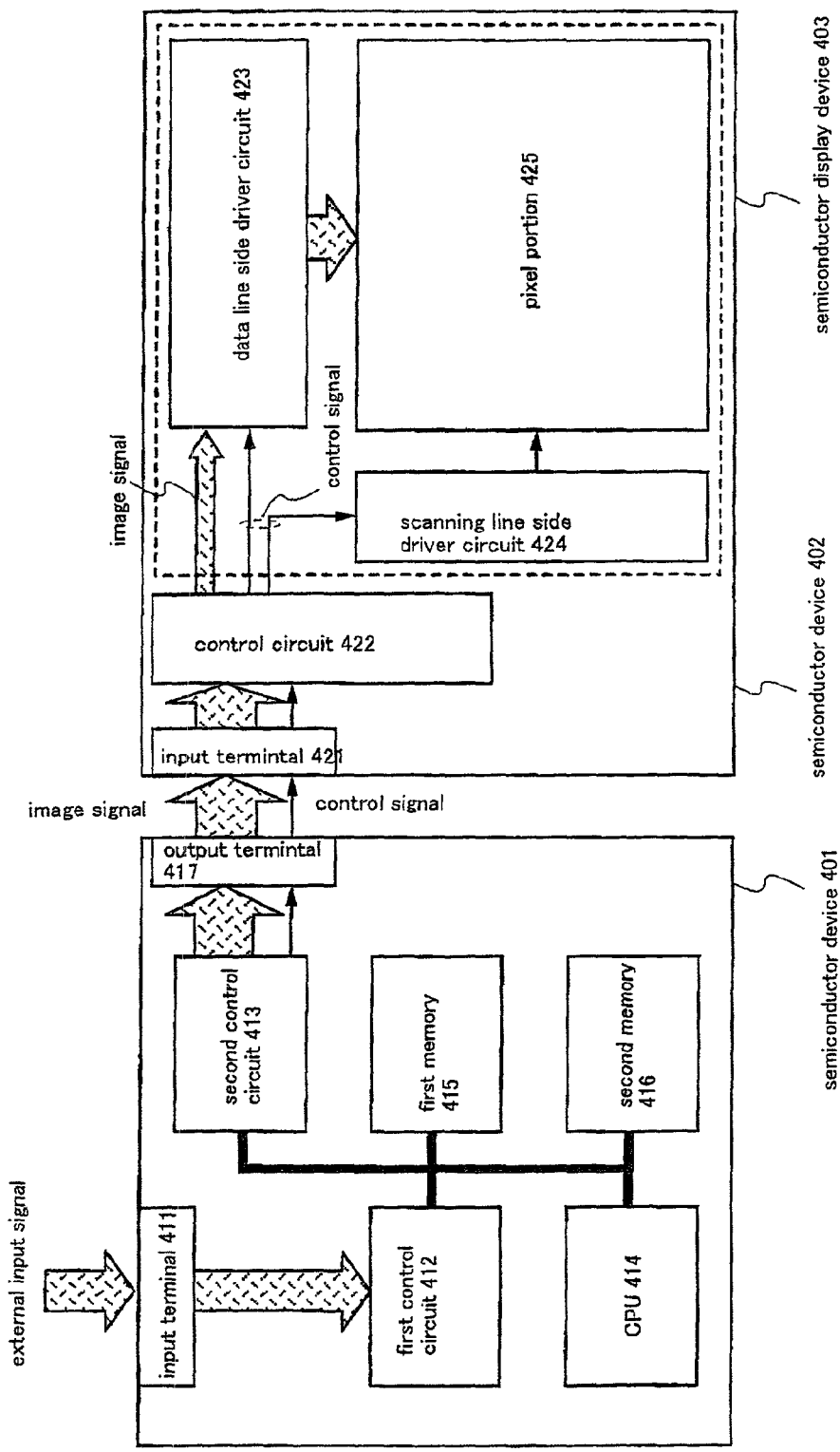
[Fig. 4]

[Fig. 5]
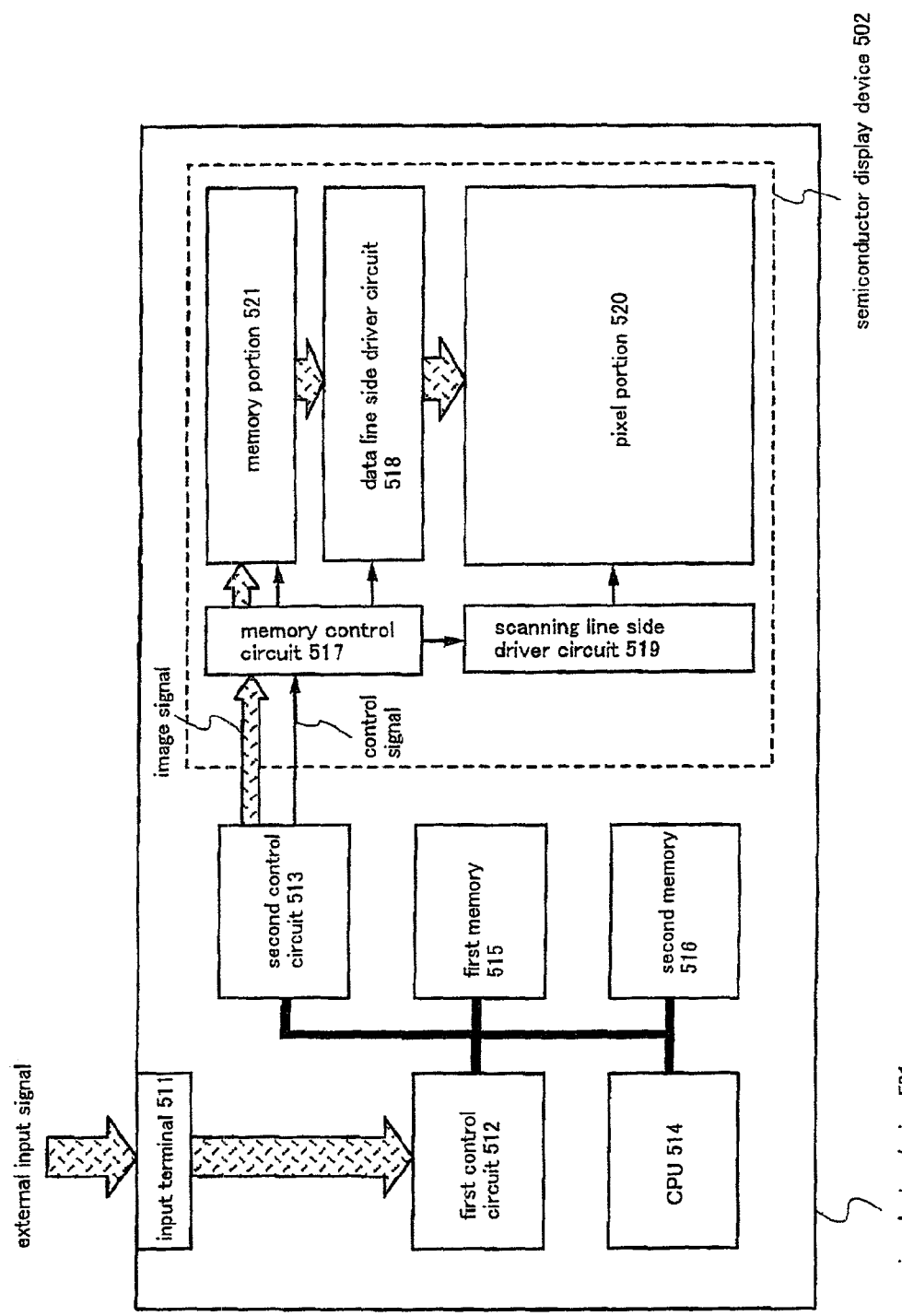

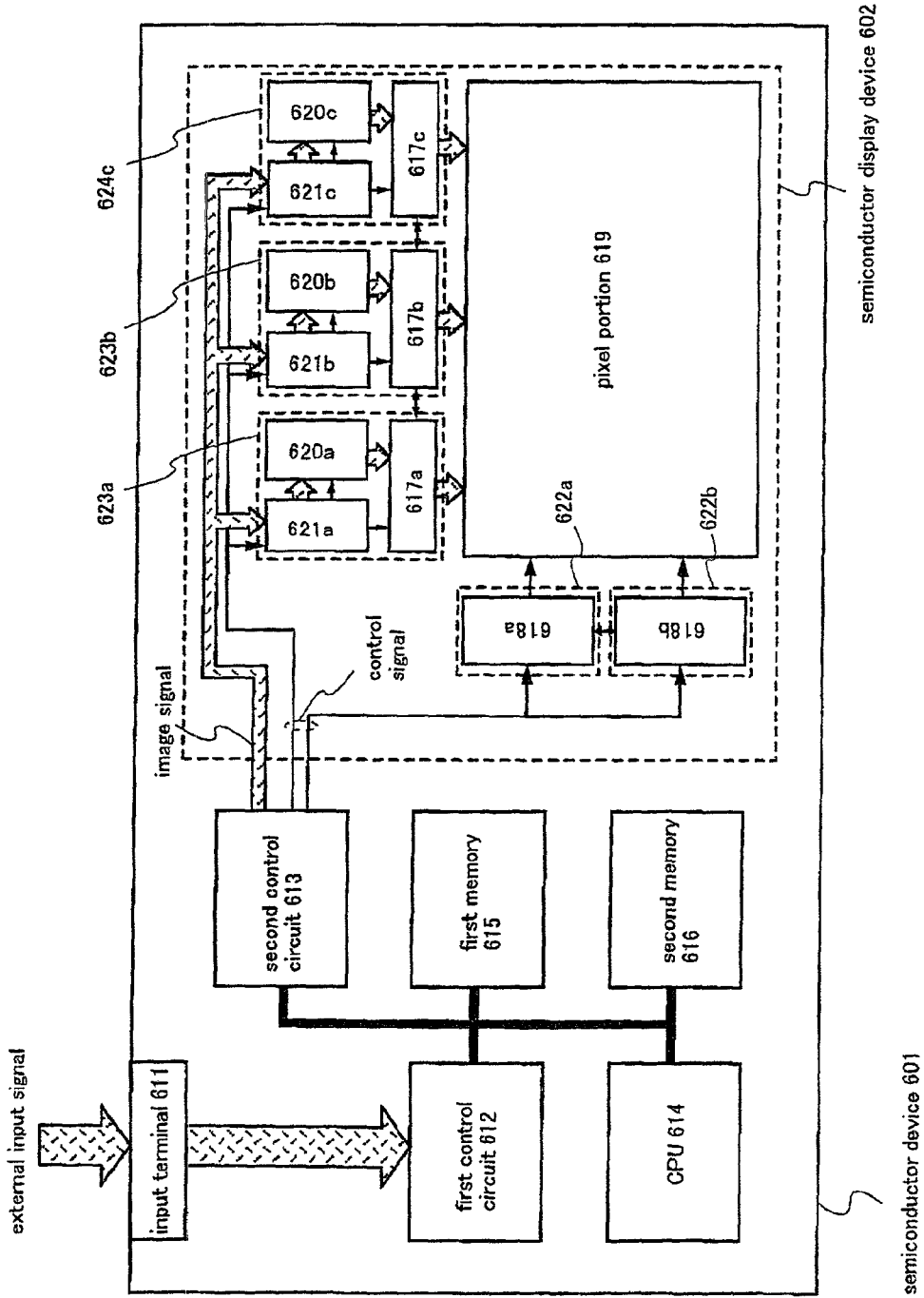

[Fig. 7]
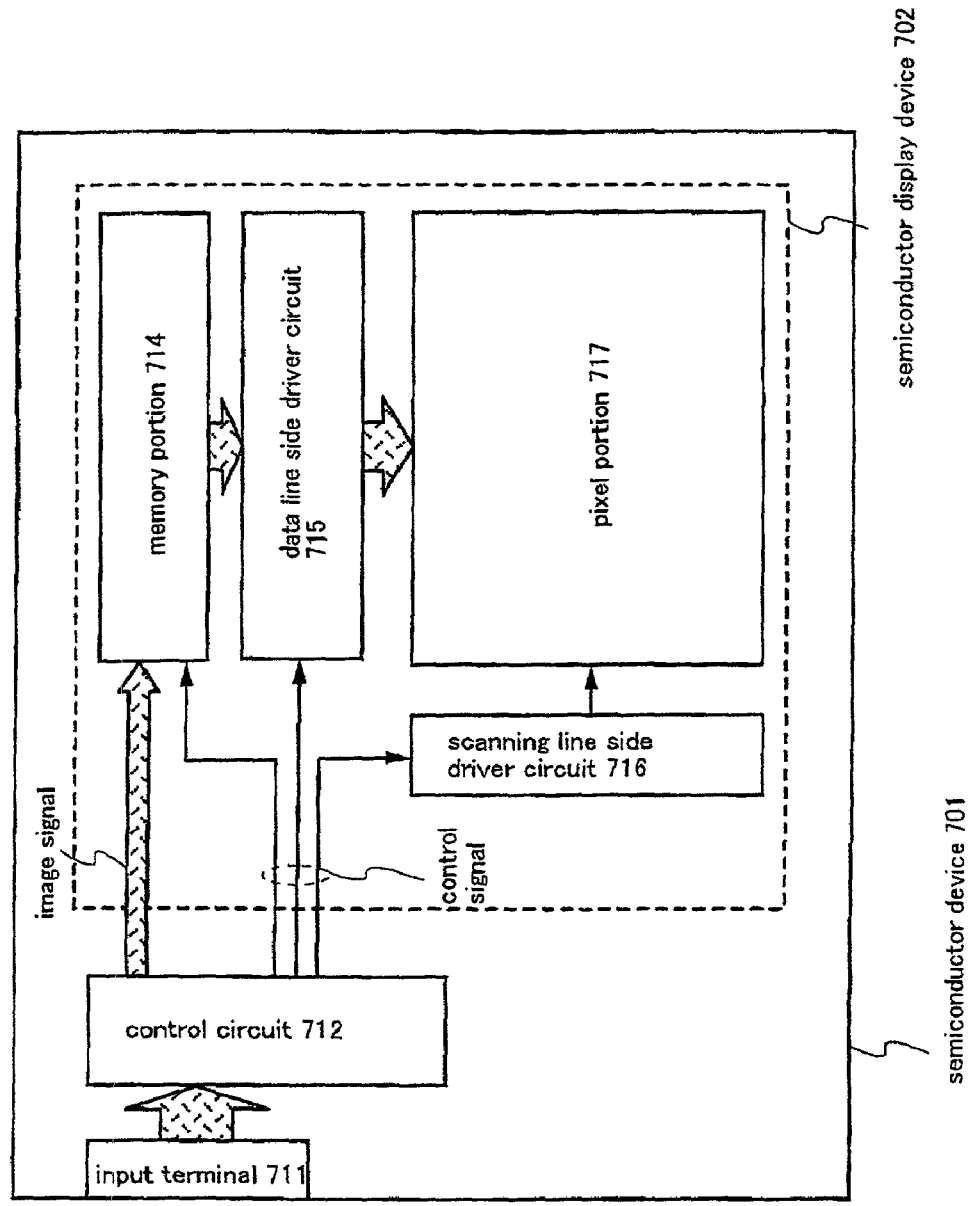

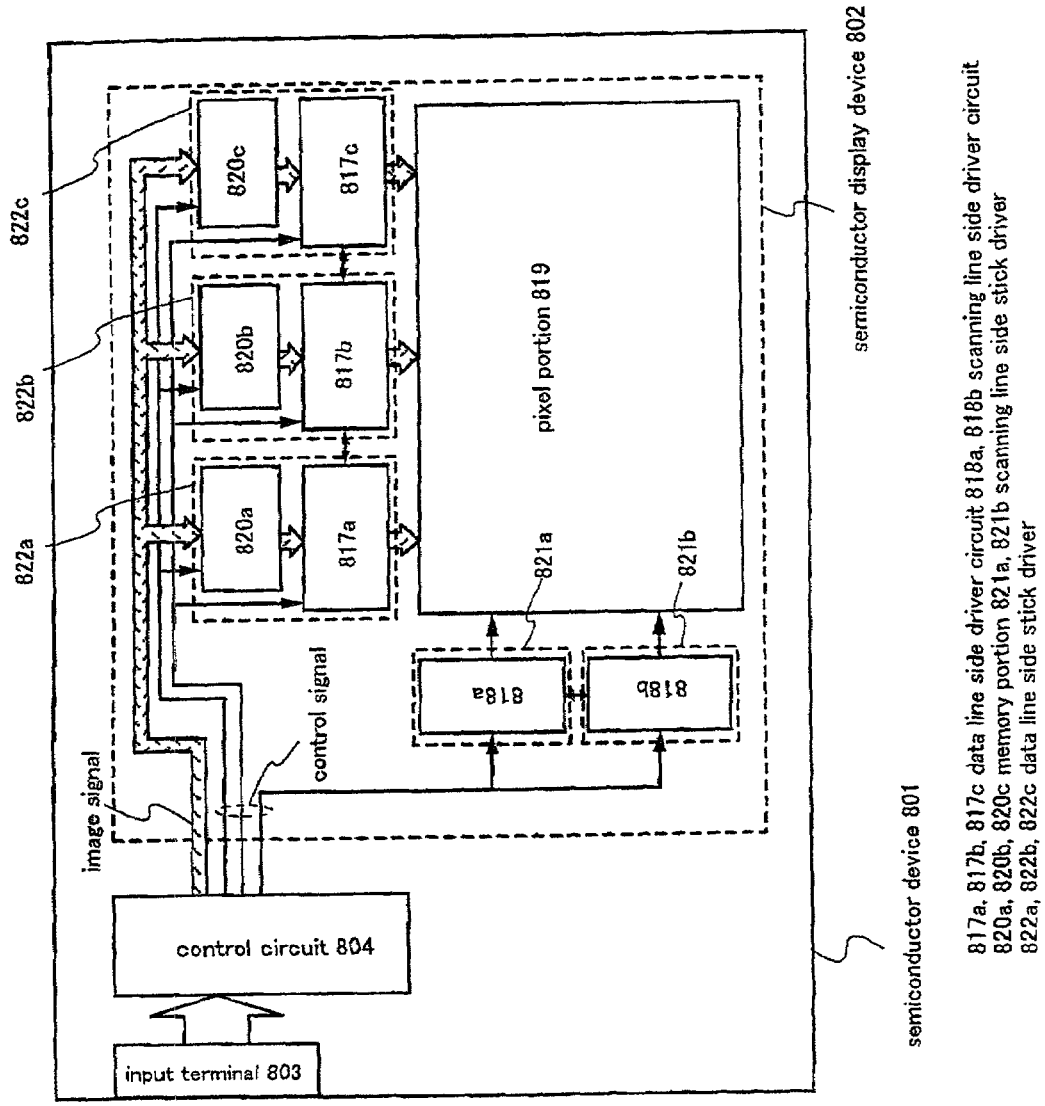
[Fig. 8]

904 pixel 908 capacitor line 906 data line
907 scanning line 911 switching TFT
914 liquid crystal element 915 capacitor 916
counter electrode 1103a, 1103b scanning line side driver circuit
1104a, 1104b, 1104c data line side driver circuitc
1105a, 1105b, 1105c memory portion
1111a, 1111b scanning line side stick driver
1112a, 1112b, 1112c data line side stick driver 1204 pixel 1206 data line 1207 scanning line
1208 power source supply line 1211 switchin TFT
1214 EL driving TFT 1216 EL element 1217
counter electrode 1403a, 1403b scanning line side driver circuit
1404a, 1404b, 1404c data line side driver circuit
1405a, 1405b, 1405c memory portion
1411a, 1411b scanning line side stick driver
1412a, 1412b, 1412c data line side stick driver

[Fig. 16]
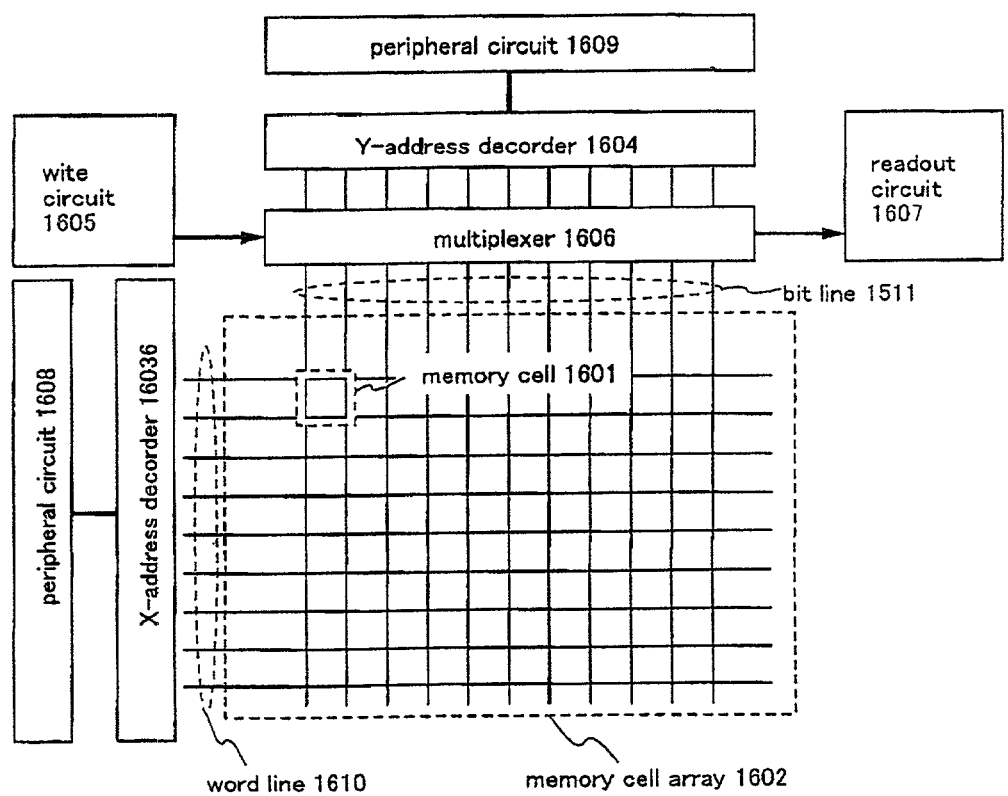

flip flop
1707 flip flop
1717

[Fig. 18]
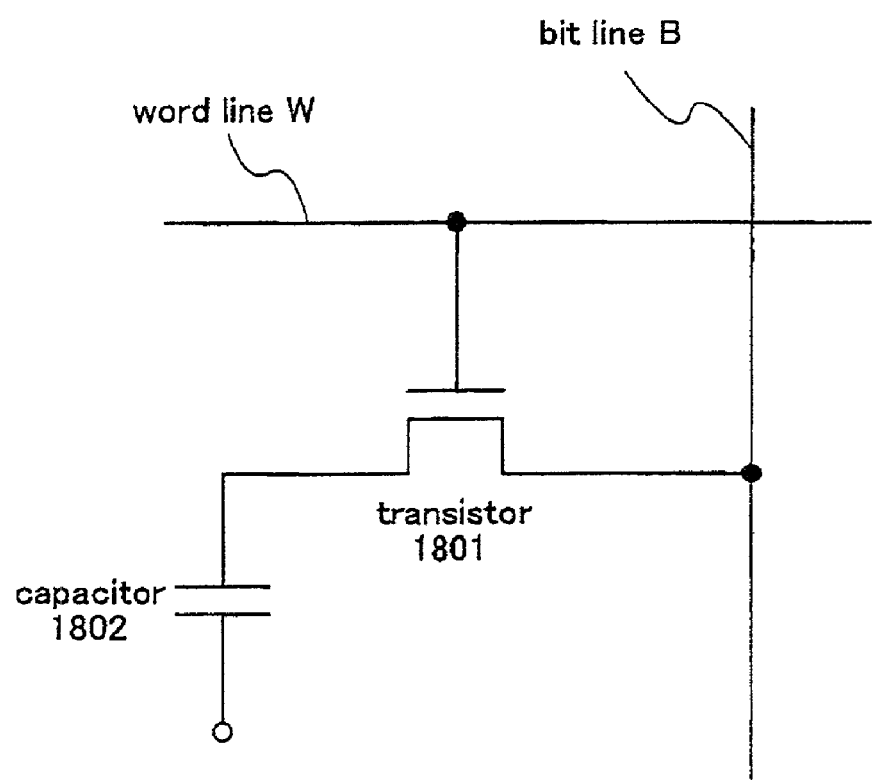

[Fig. 19]
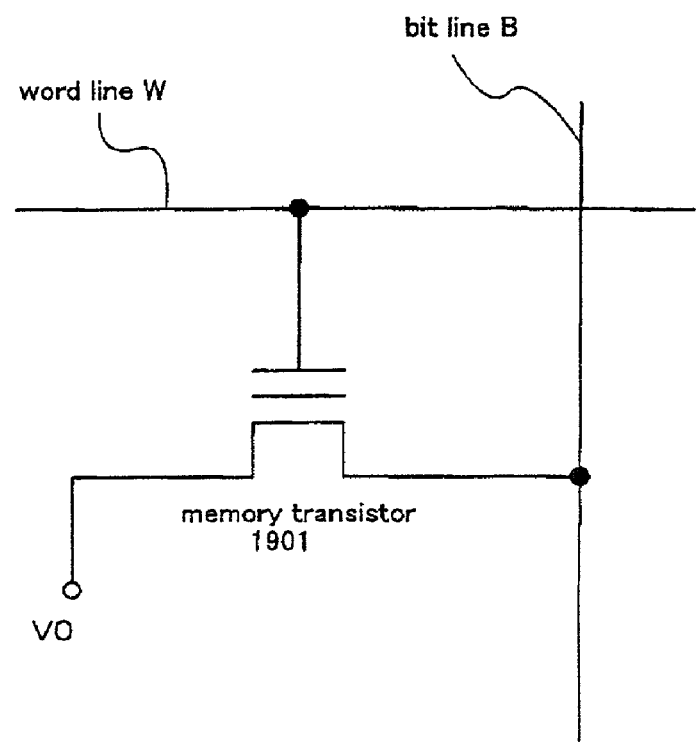

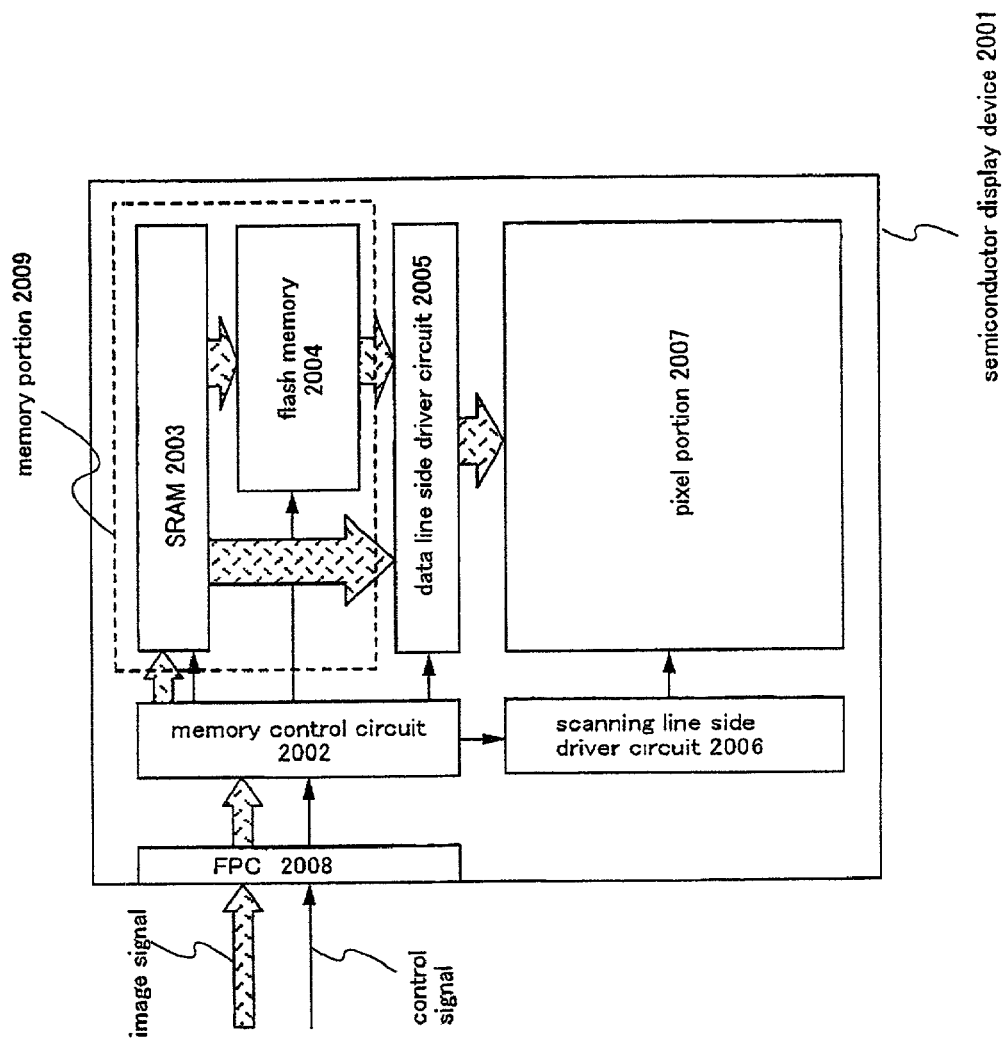
[Fig. 20]

[Fig. 21]
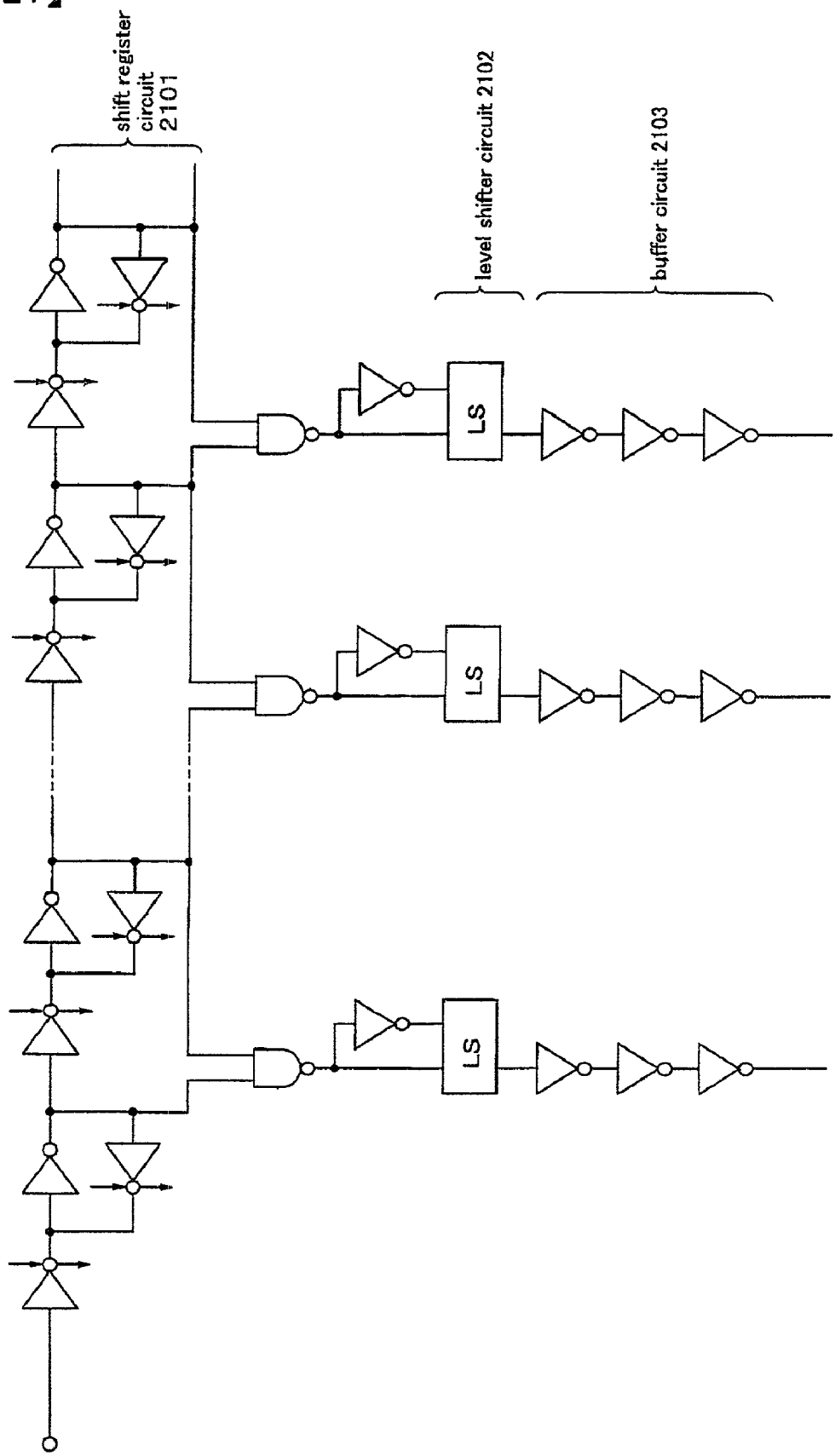

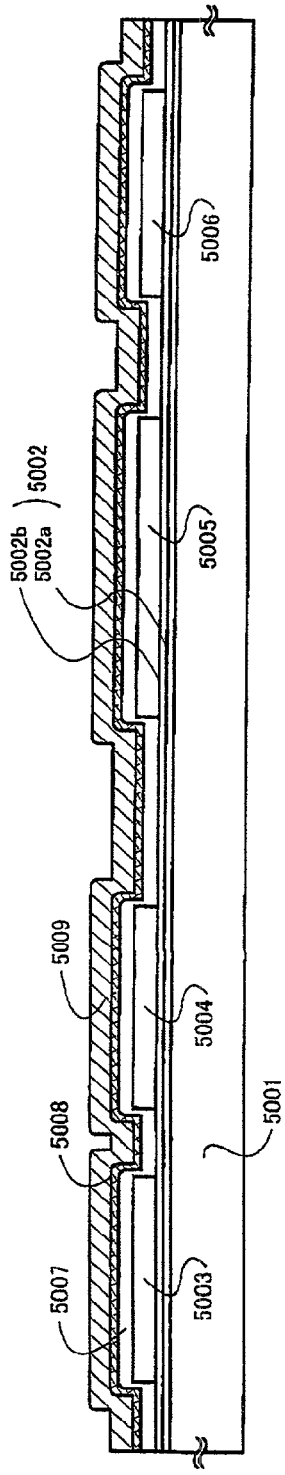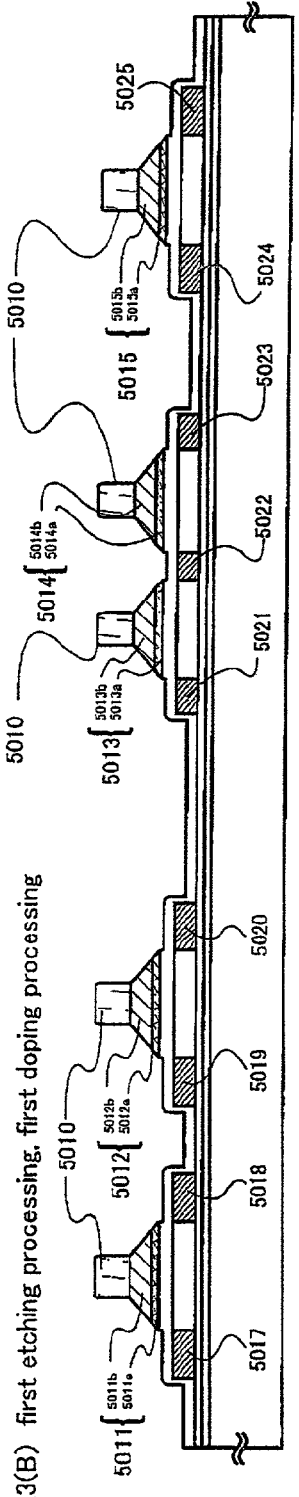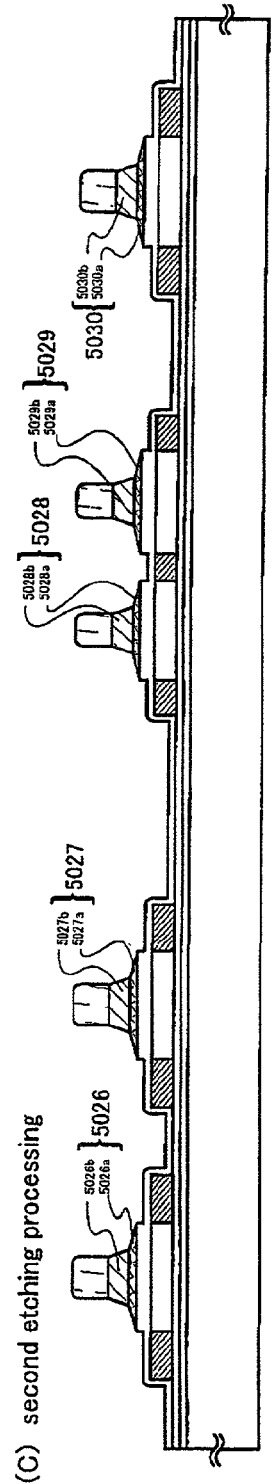

[Fig. 24]
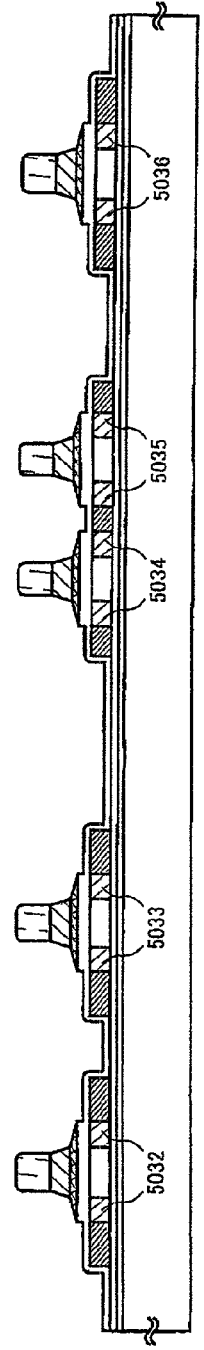
Fig. 24(A) second doping processing
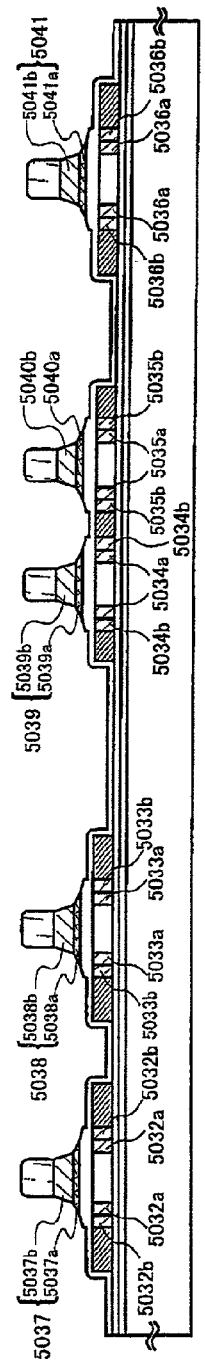
Fig. 24(B) third etching processing
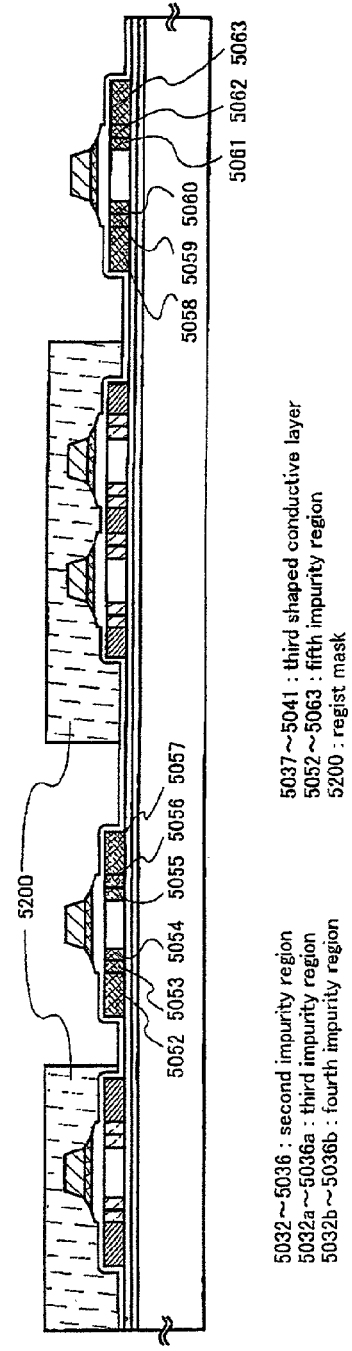
Fig. 24(C) third doping processing
5032~5036 : second impurity region
5032a~5036a : third impurity region
5032b~5036b : fourth impurity region
5037~5041 : third shaped conductive layer
5052~5063 : fifth impurity region
5200 : regist mask

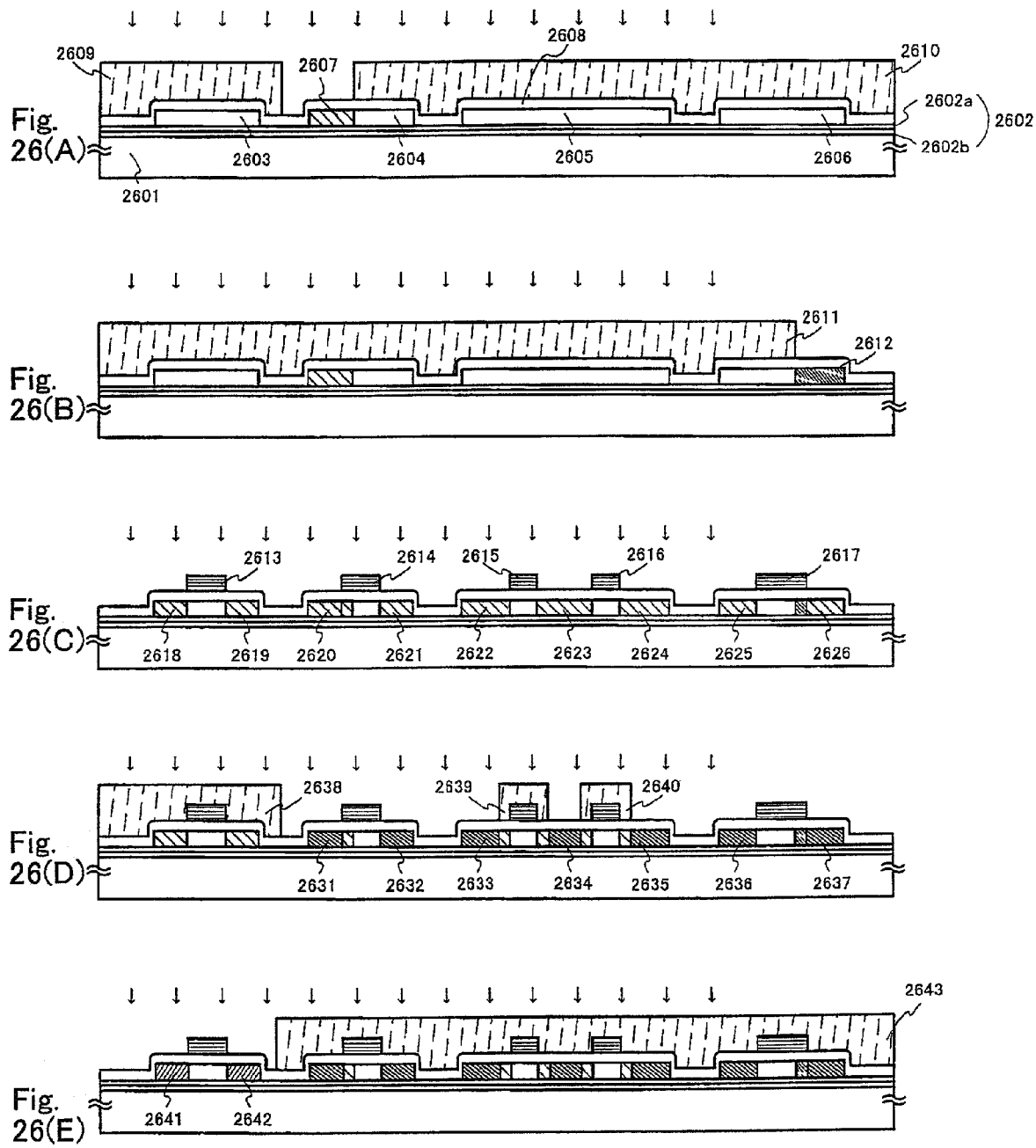

SEMICONDUCTOR DEVICE

TECHNICAL FIELD TO WHICH THE INVENTION BELONGS

The present invention in the application relates to a semiconductor device having a pixel portion, a driver circuits for the pixel portion, and a memory portion.

In particular, the present invention relates to a semiconductor display device in which a pixel portion, driver circuits for the pixel portion, and a memory portion are integrally formed on the same substrate, a semiconductor display device in which a second substrate is mounted on a first substrate for forming a pixel portion, driver circuits for the pixel portion and a memory portion are integrally formed in the second substrate, and an electronic equipment in which such a semiconductor display device is incorporated.

Note that a semiconductor device in this specification indicates a device in general, which functions by utilizing a semiconductor characteristic, and includes for example, a semiconductor display device which represents a liquid crystal display device and an EL display device and an electronic equipment in which the semiconductor display device is incorporated, under its category. As a word synonymous with the electronic equipment in which the semiconductor display device is incorporated, a word "the semiconductor device in which the semiconductor display device is incorporated" is also used. Further, a stick driver (or a stick circuit) in this specification refers to a small piece including at least one circuit, which is cut from a substrate after a large number of circuits are formed using a glass substrate, an SOI substrate, an Si substrate, or the like.

PRIOR ART

In recent years, a semiconductor device, in particular, an electronic equipment in which a semiconductor display device is incorporated is remarkably developed and as its application examples are a notebook personal computer, a mobile equipment including a mobile telephone, a liquid crystal television, a liquid crystal display, and the like. Further, research and development with respect to a semiconductor display device having a self luminescent layer (typically, an EL display device) are also increased. The semiconductor display device is characterized in that weight reduction and thinness are allowed relatively to a conventional CRT and consumption power is small (especially, the liquid crystal display device).

As a conventional semiconductor display device, an active matrix semiconductor display device having a pixel portion in which thin film transistors (hereinafter referred to as TFTs) are arranged in matrix and a passive matrix semiconductor display device having a pixel portion in which stripe shaped electrodes are formed to intersect one another in upper and lower positions sandwiching a liquid crystal layer or a self luminescent layer are known. As the active matrix semiconductor display device, there are a device in which the pixel portion is composed of TFTs using polysilicon films and a device in which the pixel portion is composed of TFTs using amorphous silicon films. In the case of the active matrix display device using the polysilicon films, as compared with the case using the amorphous silicon films, an electric field effect mobility of the TFT is high and high speed operation is allowed. Thus, the pixel portion and driver circuits for the pixel portion can be formed on the same substrate. On the other hand, in the active matrix display device using the amorphous silicon films and the passive matrix display device, it is difficult to integrally form the driver circuits on a substrate on which the pixel portion is formed. Therefore, it is constructed that a stick driver in which the driver circuits for the pixel portion are formed on a silicon substrate is mounted on the substrate on which the pixel portion is formed.

Note that the thin film transistor (TFT) in the specification indicates all transistors formed by using an SOI technique. Of course, these may be formed on a substrate having an insulating surface or may be formed on an SOI substrate.

In an electronic equipment in which a conventional semiconductor display device is incorporated, signal processing steps until an image is displayed will be described briefly. FIG. 3 is a block diagram of a portion related to image display in such an electronic equipment.

In FIG. 3, a semiconductor device 301 is a device for taking or preparing image data, performing processing and format conversion of the image data, and then displaying an image. As the semiconductor device 301, for example, a video camera, a car navigation, a personal computer, or the like can be considered.

The semiconductor device 301 is constructed by an input terminal 311, a first control circuit 312, a second control circuit 313, a CPU 314, a first memory 315, a second memory 316, and a semiconductor display device 302. Data as a basis of image data is input from the input terminal 311 in accordance with respective electronic equipments. For example, in the case of a broadcast receiver, the data is input data from an antenna. Further, in the case of the video camera, the data is input data from a CCD. This may be input data from a DC tape or a memory card. The data input from the input terminal 311 is converted into an image signal by the first control circuit 312. In the first control circuit 312, compound processing of image data compression-encoded in accordance with MPEG standards, tape formats, or the like and image signal processing such as image interpolation or image resizing are performed. An image signal output from the first control circuit 312 or an image signal prepared or processed by the CPU 314 is input to the second control circuit 313 and converted into a format (for example, a scan format or the like) suitable for the semiconductor display device 302. The format-converted image signal and a control signal are output from the second control circuit 313.

The CPU 314 efficiently controls signal processing in the first control circuit 312, the second control circuit 313, and other interface circuits and also prepares and processes image data. The first memory 315 is used as a memory area for storing the image data output from the first control circuit 312 and the image data output from the second control circuit 313, a work memory area when controlling by the CPU, a work memory area when preparing image data by the CPU and the like. As the first memory 315, a DRAM or an SRAM is used. The second memory 316 is a memory area for storing color data and character data, which are required in the case where the image data is prepared or processed by the CPU 314 and made from a mask ROM or an EPROM.

The semiconductor display device 302 is constructed by a data line side driver circuit 317, a scanning line side driver circuit 318, and a pixel portion 319. The data line side driver circuit 317 receives the image signal and the control signals (clock signal and start pulse) from the second control circuit 313 and the scanning line side driver circuit 318 receives the control signals (clock signal and start pulse) from the second control circuit 313, respectively, and thus an image is displayed in the pixel portion 319.

With the above construction, the semiconductor device 301 takes or prepares the image data and then displays the image. However, such a semiconductor device can be considered as two independent semiconductor devices. The two independent semiconductor devices can be indicated with a block diagram as shown in FIG. 4. In FIG. 4, an image signal with a general format such as a color signal, an intensity signal, and a signal for adjusting image quality and control signals are output from a semiconductor device 401 through a second control circuit. The image signal and the control signals, which are output from the semiconductor device 401, are input to a semiconductor device 402 and converted into an image signal and control signals such as a clock signal and a start pulse, which has format suitable for a semiconductor display device 403, by a control circuit 422. Then, the semiconductor display device 403 receives the image signal and the control signals from the control circuit 422 and performs image display. Note that the control circuit 422 is composed of a chip different from a pixel portion 425. As the semiconductor device 401, for example, a broadcast receiver or a game machine can be considered, and as the semiconductor device 402, for example, a liquid crystal display or an EL display can be considered.

PROBLEMS TO SOLVED BY THE INVENTION

When, an area expansion of the semiconductor display device is progressed and a portable electronic equipment in which the semiconductor display device is incorporated is widely spread, it is important to suppress consumption power of the semiconductor device to be low.

For example, in the semiconductor device in which a conventional semiconductor display device is incorporated, the case where a still image is displayed is considered. When the still image is displayed in accordance with the block diagram of the semiconductor device shown in FIG. 3, the CPU 314 reads image data from the first memory 315 in which still image data is stored and makes the second control circuit 313 perform format conversion or the like. The image signal and the control signals, which are output from the second control circuit 313, are input to the semiconductor display device 302 and display is performed in the pixel portion 319.

Thus, even in the case where the still image is displayed, the large amount of data to be transferred and the large number of procedures of the CPU and the control circuit are required, and thus it is found that power similar to the case of moving image display is consumed. A similar matter applies to the block diagram of the two semiconductor devices shown in FIG. 4.

An object is to provide a semiconductor device capable of suppressing consumption power to be low in the case where, in particular, a still image is displayed in the present invention in the application.

MEANS FOR SOLVING THE PROBLEM

As described above, in a conventional semiconductor device, when a still image is displayed, power similar to the case of moving image display is consumed. This is because a memory for storing image data is provided outside the semiconductor display device. Here, even in the case of the still image or the moving image, it is necessary to always supply image data to the semiconductor display device. Thus, the amount of data to be transferred and the number of procedures for the image data become the same degree. Therefore, it is difficult for the conventional semiconductor device to greatly reduce consumption power in the case where the still image is displayed.

In the present invention in the application, in order to solve the above problem, a memory portion is mounted on a substrate on which a pixel portion is formed and a still image is displayed using image data stored in the memory portion. Then, the amount of signals to be transferred from the outside of the semiconductor display device is decreased and a burden to circuits (CPU and the like) provided outside the semiconductor display device is reduced, and thus the consumption power is greatly reduced.

In the present invention in the application, a mode that the memory portion, the pixel portion, and the driver circuits for the pixel portion are integrally formed on the same substrate and a mode that a stick driver in which the memory portion and the driver circuits for the pixel portion are integrally formed on the same substrate is mounted on the substrate on which the pixel portion is formed are considered as a mode that the memory portion is mounted on the substrate on which the pixel portion is formed. The mode that the memory portion, the pixel portion, and the driver circuits for the pixel portion are integrally formed on the same substrate is mainly used for the active matrix semiconductor display device composed of the TFTs using the polysilicon films. Further, the mode that a stick driver in which the memory portion and the driver circuits for the pixel portion are integrally formed on the same substrate is mounted on the substrate on which the pixel portion is formed is mainly used for the active matrix semiconductor display device composed of the TFTs using the amorphous silicon films and the passive matrix semiconductor display device.

In the present invention in the application, when the still image is displayed, the image data stored in the memory portion mounted on the substrate on which the pixel portion is formed can be used. As a result, most procedures for displaying an image can be performed on the substrate on which the pixel portion is formed. Thus, the power is consumed not in the entire semiconductor device as conventional but on mainly the substrate on which the pixel portion is formed.

In this case, the consumption power can be made to be 70% or lower, as compared with the case where image data is input from the outside of the substrate on which the pixel portion is formed and displayed. Further, the power consumed on the substrate on which the pixel portion is formed can be made to be 50% of the whole or more (preferably, 90% or more). Only a simple control signal from the outside of the substrate on which the pixel portion is formed is required, and in some cases, in many circuits (including the CPU) provided outside the semiconductor display device stopping power source is also possible. Thus, the consumption power can be greatly suppressed as compared with the conventional semiconductor device. Note that the control signals from the outside include a clock signal, a start pulse, a signal related to an address of a memory and readout, and the like.

The semiconductor device according to the present invention in the application, it is preferable that a memory control circuit is mounted on the substrate on which the pixel portion is formed. In this case, the memory control circuit is preferably formed together with the memory portion on the same substrate. That is, when a memory is mounted by using the stick driver, the memory control circuit is formed on the substrate composing the stick driver. When the memory portion is formed on the same substrate as the pixel portion, the memory control circuit is formed on the same substrate as the pixel portion.

As a result, in the case where the still image is displayed, when calculation related to an address of the memory and the like are performed by the memory control circuit, the control signals input to the substrate on which the pixel portion is formed can be further reduced. As a result, the consumption power is suppressed to be further low.

Thus, there are provided a semiconductor display device in which the still image can be displayed with low consumption power and a semiconductor device in which the semiconductor display device is incorporated.

Note that it is required for its applications that the memory portion has a memory capacity capable of storing at least one entire still image in the entire memory. It is further desirable to have a memory capacity capable of storing a plurality of still images. If possible, it is also preferable to have a memory capacity capable of storing a moving image with a short time.

A memory composing the memory portion may be any one of an SRAM, a DRAM, or an EEPROM. Further, the memory portion may be composed of a combination of an SRAM, a DRAM, and an EEPROM.

In addition, the substrate in which the stick driver is formed may be any one of a silicon substrate, an SOI substrate, and a substrate having an insulating surface. In particular, it is preferable that the substrate in which the stick driver is formed has the same thickness and the same material quality as the substrate on which the pixel portion is formed. Further, an image signal is input to only the data line side driver circuit among the driver circuits for the pixel portion. Thus, when the memory and the driver circuits are mounted by using the stick driver, the memory portion may be integrated only in a stick driver (data line side stick driver) including the data line side driver circuit. For example, as a method of manufacturing a stick driver using a glass substrate, contents disclosed in Yamazaki et al., U.S. Pat. No. 5,821,138 or Yamazaki et al., U.S. Pat. No. 6,118,502 are referred and incorporated herein.

Hereinafter, a structure of the present invention in the application is indicated.

There is provided a semiconductor device comprising at least a pixel portion, a driver circuit for the pixel portion, and a memory portion, wherein, the pixel portion, the driver circuit for the pixel portion, and the memory portion are formed on the same substrate, and the semiconductor device has a function for displaying an image based on an image data stored in the memory portion.

There is provided a semiconductor device comprising at least a pixel portion, a driver circuit for the pixel portion, and a memory portion, wherein, the pixel portion is formed on a first substrate, the driver circuit for the pixel portion and the memory portion are integrally formed on a second substrate, the second substrate is provided in a region except for the pixel portion on the first substrate, and connecting such that a signal from the driver circuit for the pixel portion is input to the pixel portion, and the semiconductor device has a function for displaying an image based on an image data stored in the memory portion.

The second substrate may have the same thickness as the first substrate.

The second substrate may be made of the same material as the first substrate.

The second substrate may be one of a substrate having an insulating surface, an SOI substrate, and a silicon substrate.

There is provided a semiconductor device comprising at least a pixel portion, a data line side driver circuit, a scanning line side driver circuit, and a memory portion, wherein, the pixel portion is formed on a first substrate, the data line side driver circuit and the memory portion are integrally formed on a second substrate, the scanning line side driver circuit is integrally formed on a third substrate, the second substrate and the third substrate are provided in a region except for the pixel portion on the first substrate, and connecting such that a signal from the data line side driver circuit and a signal from the scanning line side driver circuit are input to the pixel portion, and the semiconductor device has a function for displaying an image based on an image data stored in the memory portion.

The second substrate and the third substrate may have the same thickness as the first substrate.

The second substrate and the third substrate may be made of the same material as the first substrate.

The second substrate and the third substrate may be one of a substrate having an insulating surface, an SOI substrate, and a silicon substrate.

The semiconductor device may have a function of displaying a still image based on the image data stored in the memory portion.

The semiconductor device may include a memory control circuit, and the memory control circuit and the memory portion may be integrally formed on the same substrate.

The semiconductor device may comprise a first region having a function of displaying the image and a second region having a function of supplying the image data to the first region, the first region may include the substrate on which the pixel portion is formed, and the semiconductor device may include a first display method of displaying the image based on the image data which the second region supplies and a second display method of displaying the image based on the image data stored in the memory portion provided in the first region.

Power which the semiconductor device consumes by the second display method may be 70% or lower of power which the semiconductor device consumes by the first display method.

When the second display method is performed, 50% or higher of power which the semiconductor device consumes may be consumed in the first region.

When the second display method is performed, 90% or higher of power which the semiconductor device consumes may be consumed in the first region.

The first display method may be controlled by a CPU provided in the second region, the second display method may be controlled by a control circuit provided in the first region, and the second display method may be able to be performed with a state in which a power source of the CPU is turned off.

There is provided a semiconductor device group comprising the semiconductor device (a first semiconductor device) having a function of displaying an image and the semiconductor device (a second semiconductor device) having a function of supplying image data to the first semiconductor device, wherein, the semiconductor device group includes a first display method of displaying the image data from which the second semiconductor device supplies and a second display method of displaying the image based on the image data stored in the memory portion which the first semiconductor device includes.

Power which the entire semiconductor device group consumes by the second display method may be 70% or lower of power which the entire semiconductor device group consumes by the first display method.

When the second display method is performed, 50% or higher of power which the entire semiconductor device group consumes may be consumed in the first semiconductor device.

When the second display method is performed, 90% or higher of power which the entire semiconductor device group consumes may be consumed in the first semiconductor device.

The second display method may be performed by only the first semiconductor device.

It is preferable that the memory portion has a memory capacity of 100 kbits to 10 Gbits.

It is more prefatable that the memory portion has a memory capacity of 1 Mbits to 128 Mbits.

The memory portion may comprise any one of an SRAM, a DRAM, and an EEPROM.

The memory portion may comprise a combination of an SRAM, a DRAM, and an EEPROM.

The semiconductor device may be any one of an active matrix liquid crystal display device, a passive matrix liquid crystal display device, an active matrix EL display device, and a passive matrix EL display device.

The semiconductor device may be one selected from a display, a video camera, a head mount display, a DVD player, a goggle type display, a personal computer, a mobile telephone, and a car audio.

BRIEF DESCRIPTION OF THE DRAWINGS

FIG. 1 A block diagram of a semiconductor device according to the present invention in the application.

FIG. 2 A block diagram of a semiconductor device according to the present invention in the application.

FIG. 3 A block diagram of a conventional semiconductor device.

FIG. 4 A block diagram of a conventional semiconductor device.

FIG. 5 A block diagram of a semiconductor device according to the present invention in the application.

FIG. 6 A block diagram of a semiconductor device according to the present invention in the application.

FIG. 7 A block diagram of a semiconductor device according to the present invention in the application.

FIG. 8 A block diagram of a semiconductor device according to the present invention in the application.

FIGS. 13(A) and 13(B) Top and cross sectional views of an active matrix EL display device.

FIGS. 14(A) and 14(B) Top and cross sectional views of an active matrix EL display device.

FIG. 16 A block diagram of a memory portion composing a semiconductor device according to the present invention in the application.

FIG. 18 A circuit diagram of a memory cell of a DRAM.

FIG. 19 A circuit diagram of a memory cell of an EEPROM.

FIG. 20 A block diagram of a semiconductor device according to the present invention in the application.

FIG. 21 A view showing a structure of a scanning line side driver circuit.

FIGS. 23(A) to 23(C) Views showing manufacturing steps of the semiconductor device according to the present invention in the application.

FIGS. 24(A) to 24(C) Views showing manufacturing steps of the semiconductor device according to the present invention in the application.

FIGS. 26(A) to 26(E) Views showing manufacturing steps of the semiconductor device according to the present invention in the application.

EMBODIMENT MODE OF THE INVENTION

Figure 9A:
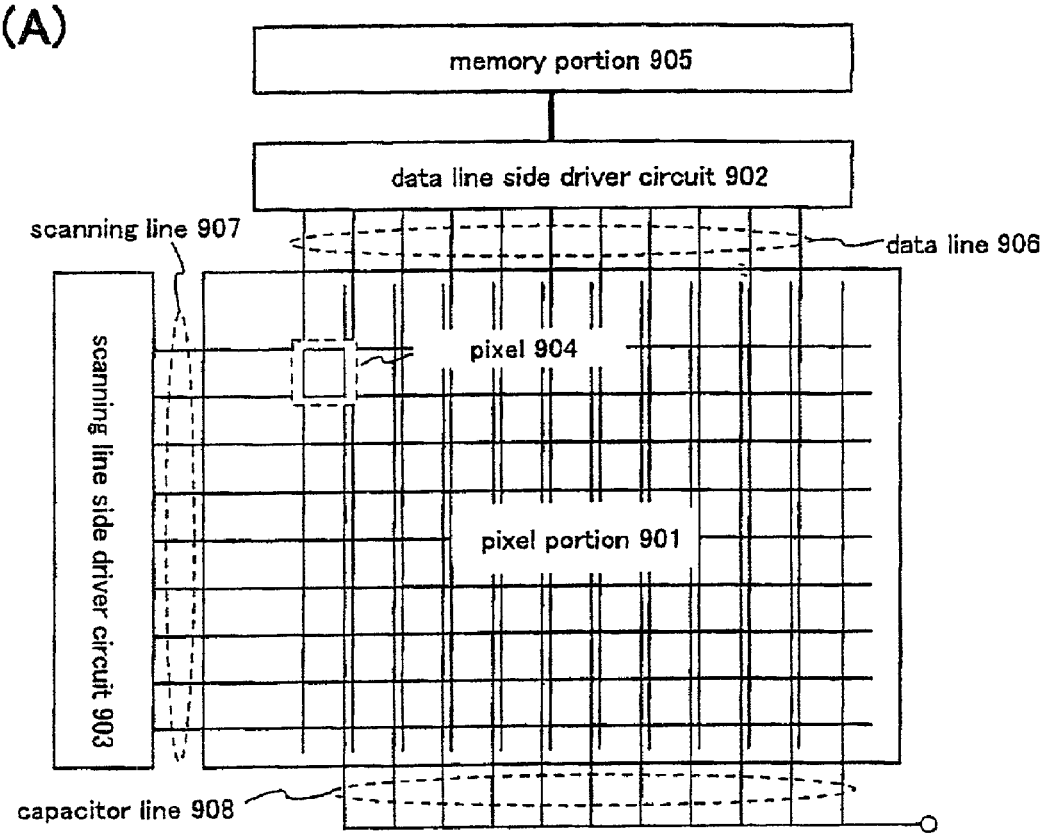
FIGS. 9(A) and 9(B) Views showing a structure of an active matrix liquid crystal display device.

The present invention in the application is characterized in that in a semiconductor device, a memory portion is mounted on a substrate on which a pixel portion is formed and thus a still image or a moving image in a short time can be displayed with low consumption power. In this embodiment mode, a block diagram of a semiconductor device in which a semiconductor display device is incorporated and a flow of image data until an image is displayed will be described briefly. Note that respective blocks composing the present invention in the application, such as the memory portion, a driver circuit, and a the pixel portion (circuit structures and the like) can be described in details with reference to embodiments.

The description is made using FIGS. 1 and 2. FIG. 1 is a block diagram of a semiconductor device in which a memory portion is integrally formed on a substrate on which a pixel portion is formed. FIG. 2 is a block diagram of a semiconductor device in which a stick driver having the memory portion is mounted on the substrate on which the pixel portion is formed.

First, FIG. 1 is referred to. A semiconductor device 101 comprises an input terminal 111, a first control circuit 112, a second control circuit 113, a CPU 114, a first memory 115, a second memory 116, and a semiconductor display device 102. Further, the semiconductor display device 102 comprises a memory portion 120, a data line side driver circuit 117, a scanning line side driver circuit 118, and a pixel portion 119. The memory portion 120, the data line side driver circuit 117, the scanning line side driver circuit 118, and the pixel portion 119 are all formed on the same substrate.

In the semiconductor device 101, a portion except for semiconductor display device 102 is similar to the semiconductor device shown in FIG. 3 (see Prior Art) and thus the description of the portion is omitted here. Note that an output signal from the second control circuit includes control signals (signals related to an address of a memory, write, and readout) for controlling the memory portion in addition to the image signal and the control signals (clock signal, start pulse, and the like), which are described in Prior Art.

When an image (in particular, a moving image) is displayed, the image signal and the control signals are input to the semiconductor display device 102. First, the image signal and the control signals related to an address of a memory, write, and readout are input to the memory portion. The image signal is stored in the memory portion 120. Image data stored in the memory portion 120 is again read out in accordance with the control signals and transferred to the data line side driver circuit 117. Simultaneously, the control signals such as the clock signal and the start pulse are input to the data line side driver circuit 117 and the scanning line side driver circuit 118. In the pixel portion 119, the image signal read out from the memory portion 120 is displayed.

When a still image is displayed, only the control signals are input to the semiconductor display device 102. Then, in accordance with the control signals related to an address of a memory, write, and readout, the image data stored in the memory portion 120 is read out and transferred to the data line side driver circuit 117. Simultaneously, the control signals such as the clock signal and the start pulse are input to the data line side driver circuit 117 and the scanning line side driver circuit 118. In the pixel portion 119, the image signal read out from the memory portion 120 is displayed.

Thus, according to the present invention in the application, when the still image is displayed, the image data stored in the memory portion mounted on the substrate on which the pixel portion is formed can be used. As a result, as described above, only simple control signals from the outside of the substrate on which the pixel portion is formed are required and a large amount of data to be transferred in the case where the image signal is transferred from the outside of the semiconductor display device is not required. Thus, the power consumed in the outside of the substrate on which the pixel portion is formed can be greatly reduced. In some cases, the consumption power can be made to be 70% or lower, as compared with the case where image data is input from the outside of the substrate on which the pixel portion is formed and displayed. Further, the power consumed on the substrate on which the pixel portion is formed can be made to be 50% of the whole or more (preferably, 90% or more). Further, in the semiconductor device 101, all or a part of circuits (the first control circuit 112, the first memory 115, the second memory 116, and the CPU 114) except for the semiconductor display device 102 and the second control circuit 113 can also stop power source completely. Thus, the consumption power can be greatly suppressed as compared with the conventional semiconductor device.

Further, according to the present invention in the application, a memory control circuit may be integrally formed on the substrate on which the pixel portion is formed (see Embodiment 1). Such a structure is used and simple calculation related to an address of the memory is performed by the memory control circuit on the substrate on which the pixel portion is formed. Thus, when the still image is displayed, the control signals input to the semiconductor display device become further simple. Therefore, the consumption power is suppressed to be low more.

Note that the semiconductor display device in which the memory portion, the pixel portion, and the driver circuits for the pixel portion are integrally formed, as shown in FIG. 1, is mainly used for an active matrix display device comprising TFTs using polysilicon films. The display device may be the liquid crystal display device or the display device having a self luminescent layer (typically, the EL display device). An example of the active matrix liquid crystal display device, Embodiments 3 and 4 can be referred to. Further, as an example of the active matrix EL display device, Embodiments 6 and 7 can be referred to.

Next, FIG. 2 is referred to. A semiconductor device 201 is constructed by an input terminal 211, a first control circuit 212, a second control circuit 213, a CPU 214, a first memory 215, a second memory 216, and a semiconductor display device 202.

The semiconductor device 201 is similar to the semiconductor device 101 shown in FIG. 1 except for the semiconductor display device 202. Control signals (signals related to an address of a memory, write, and readout) for controlling memory portions in addition to the image signal and the control signals (clock signal, start pulse, and the like) are output from the second control circuit.

Further, the semiconductor display device 202 comprises data line side stick drivers (portions surrounded by wave lines) 222a, 222b, and 222c in which pairs of memory portions and data line side driver circuits (220a, 217a), (220b, 217b), and (220c, 217c) are formed on the same substrate, scanning line side stick drivers (portions surrounded by wave lines) 221a and 221b including scanning line side driver circuits 218a and 218b respectively, and a pixel portion 219. The stick drivers are mounted on the substrate on which the pixel portion is formed.

Then, as in the case of the semiconductor display device 102, when the moving image is displayed, the image signal and the control signals are input. Further, when the still image is displayed, only control signals are input. Thus, the image is displayed in the pixel portion 219. Note that in the semiconductor display device 202, the driver circuits for the pixel portion and the memory portions are divided into a plurality of stick drivers. Thus, the signals input to the semiconductor display device 202 are transferred to the respective stick drivers. For example, when the still image is displayed, the control signals (input to the memory portions) related to an address of a memory, write, and readout and the control signals (input to the data line side driver circuits) such as a clock signal and a start pulse are input to the respective data line side stick drivers. Further, the control signals (input to the scanning line side driver circuits) such as the clock signal and the start pulse are input to the respective scanning line side stick drivers.

Thus, also in the embodiment mode in which the memory is mounted by the stick drivers, when the still image is displayed, simple control signals may be only input from the outside of the substrate on which the pixel portion is formed. Thus, the consumption power with the transfer of a large amount of data, in which the image signal is transferred from the outside of the semiconductor display device, is greatly reduced. In some cases, the consumption power can be made to be 70% or lower, as compared with the case where image data is input from the outside of the substrate on which the pixel portion is formed and displayed. Also, the power consumed on the substrate on which the pixel portion is formed can be made to be 50% of the whole or more (preferably, 90% or more). Further, in the semiconductor device 201, all or a part of circuits (the first control circuit 212, the first memory 215, the second memory 216, and the CPU 214) except for the semiconductor display device 202 and the second control circuit 213 can also stop power source completely. Thus, the consumption power can be greatly suppressed as compared with the conventional semiconductor device.

Further, memory control circuit may be integrally formed on the substrate in which the stick drivers are formed (see Embodiment 1). Simple calculation related to an address of the memory is performed by the memory control circuits provided in the stick drivers. Thus, when the still image is displayed, the control signals input to the substrate on which the pixel portion is formed become further simple. Therefore, the consumption power is suppressed to be low more.

Note that the semiconductor display device in which the stick drivers having the memory portions and the driver circuits for the pixel portion are mounted, as shown in FIG. 2, is mainly used for an active matrix display device comprising TFTs using amorphous silicon films and a passive matrix display device. (However, the device is not limited to them.) The display device may be the liquid crystal display device or a display device having the self luminescent layer (typically, the EL display device). As an example of the active matrix liquid crystal display device, Embodiments 3 and 5 can be referred to. Further, as an example of the active matrix EL display device, Embodiments 6 and 8 can be referred to. Further, as an example of the passive matrix display device, Embodiment 9 can be referred to.

Note that the substrate on which the stick drivers are formed may be a silicon substrate, an SOI substrate, or a substrate having an insulating surface. The stick drivers formed on the silicon substrate or the SOI substrate are miniature and have high characteristics. Further, it is preferable in the following points that the stick drivers are formed on a substrate made of the same material as the substrate on which the pixel portion is formed and are formed on a substrate having the same thickness as a counter substrate in the liquid crystal display device. First, in the case of the same material, the thermal expansion coefficient is same. Thus, even if a change in a temperature is caused in the display device, there is not the case where thermal stress is produced and thus there is not the case where characteristics of circuits manufactured using TFTs are deteriorated. Further, when the counter substrate of the liquid crystal display device and the substrate in which the stick drivers are formed have the same thickness, thinness of the entire semiconductor display device can be provided. As a mode in which the stick drivers are mounted, Embodiments 5 and 8 can be referred to.

Thus, in the present invention in the application, the memory portions are mounted on the substrate on which the pixel portion is formed. According to the present invention in the application, there are provided the semiconductor display device in which when the still image is displayed, the consumption power can be suppressed to be low and the semiconductor device in which the semiconductor display device is incorporated.

Note that it is required for its applications that the memory portions have a memory capacity capable of storing at least one entire still image in the entire memory. It is further desirable that the memory portions have a memory capacity capable of storing a plurality of still images. If possible, it is also preferable that the memory portions have a memory capacity capable of storing a moving image with a short time.

For example, in the case of a monochrome display device with EGA standards, in which gray scale display is not performed, when one still image is displayed, about 256 kbit of data is required. In the case where 6 bit of digital signal is used as an image signal in an RGB-full-color display device with UXGA standards, when one still image is displayed, about 40 Mbit of data is required. When 60 frames per second are set and a moving image is displayed for about 1 minute in a similar display device, about 10 Gbit of data is required. In the case of the semiconductor display device in which the stick drivers are mounted, the entire data line side driver circuit comprises a plurality of stick drivers. Thus, a capacity of the memory portion integrated in the respective stick drivers may be smaller than a capacity of one still image data. When the above descriptions are considered, it is preferable that the capacity of the memory portion is 100 kbit or more. When the storage of the moving image is considered, it is preferable to have a memory capacity of about 10 Gbit. Of course, a larger memory capacity may be provided. When one to several tens of still image data and a work area are considered in the display device with XGA standards or UXGA standards, it is desirable that a capacity of the memory portion is 1 Mbit to 128 Mbit.

A memory composing the memory portions may be an SRAM, a DRAM, or an EEPROM. In the SRAM, an operational speed is very high but an integration density is low. In the DRAM, an operational speed is inferior to the SRAM but an integration density is higher than the SRAM. The EEPROM is characterized in that an operational speed is more later but an integration density is very high. As an example of a memory comprising the memory portions, Embodiments 10 to 13 can be referred to.

Further, the memory portions may comprise a combination of the SRAM, the DRAM, and the EEPROM. For example, the memory portions composed of the SRAM having a high operational speed and the EEPROM having a high integration density are provided, and the SRAM can be used as a buffer for temporarily storing data and the EEPROM can be used as a main memory (see Embodiment 14).

Note that, since image data stored in the memory portion is a digital signal, when an image signal to be input is an analog signal, it is required that a D/A converter or an A/D converter is provided if necessary. In this case, it is desirable that the D/A converter or the A/D converter is integrally formed on the substrate on which the memory portions are formed.

According to this embodiment mode, the memory portions are provided only in the data line side stick drivers. However, the memory portions may be provided in the scanning line side stick drivers. For example, in the case of a complicated driver method, information related to a driver signal in a scanning line side can be stored in the memory portions.

According to this embodiment mode, in the case where an image is displayed, image signals are temporarily stored in the memory portions and then the image is displayed. However, the present invention in the application is not limited to this. The image signals may be simultaneously input to the memory portions and the data line side driver circuits or these modes may be switched in accordance with a control signal.

Embodiment 1

In the present invention in the application, it is preferable that a memory control circuit is mounted on a substrate on which the pixel portion is formed.

FIGS. 5 and 6 are block diagrams of a semiconductor device in which a semiconductor display device having a memory control circuit is incorporated. Portions except for the semiconductor display devices comprise input terminals 511 and 611, first control circuits 512 and 612, second control circuits 513 and 613, CPUs 514 and 614, first memories 515 and 615, second memories 516 and 616, respectively, and similar to the case of the semiconductor device (see FIG. 1) described in the embodiment mode. In a semiconductor display device 502 shown in FIG. 5, a memory control circuit 517 is integrally formed with a memory portion 521, a data line side driver circuit 518, a scanning line side driver circuit 519, and a pixel portion 520 on the same substrate. Further, in a semiconductor display device 602 shown in FIG. 6, stick drivers 623a, 623b, and 623c in which respective pairs of memory control circuits, memory portions, and data line side driver circuits (620a, 621a, 617a), (620b, 621b, 617b), and (620c, 621c, 617c) are integrally formed are mounted on the substrate on which the pixel portion is formed.

The memory control circuit serves to decrease a control signal from the outside of the semiconductor display device. For example, a circuit for calculating an address of the memory is provided, and thus the control signal related to the address of the memory, which is transmitted from the outside of the semiconductor display device can be made to be a simple. It is not limited only to control of the memory portion and may include a circuit for further simplifying control signals of the scanning line side driver circuit and the data line side driver circuit. The memory control circuit may include any known circuit if it is a circuit capable of simplifying the control signal from the outside of the semiconductor display device.

Thus, the memory control circuit is mounted on the semiconductor display device, in particular, the substrate on which the pixel portion is formed, in the case where the still image is displayed, and thus there are provided a semiconductor display device in which the consumption power is low and a semiconductor device in which the semiconductor display device is incorporated.

Note that semiconductor display device (FIG. 5) in which the memory portion, the memory control circuit, the pixel portion, and the driver circuits for the pixel portion are integrally formed is used for mainly the active matrix display device composed of the TFTs using the polysilicon films. Further, the semiconductor display device (FIG. 6) in which the stick drivers having the memory portions, the memory control circuits, and the driver circuits for the pixel portion are mounted on the substrate on which the pixel portion is formed is used for mainly the active matrix display device composed of the TFTs using the amorphous silicon films and the passive matrix display device. The display device may be the liquid crystal display device or the display device having the self luminescent layer (typically, the EL display device).

Embodiment 2

The semiconductor devices (FIGS. 1 and 2) described in the embodiment mode can be also considered as two independent semiconductor devices. In this embodiment, of the two independent semiconductor devices, a semiconductor device including a semiconductor display device will be described. The description is made using FIGS. 7 and 8.

The semiconductor device 701 shown in FIG. 7 comprises an input terminal 711, a control circuit 712, and a semiconductor display device 702. In the semiconductor display device 702, a memory portion 714 is integrally formed with a pixel portion 717, a data line side driver circuit 715, and a scanning line side driver circuit 716 on the same substrate. On the other hand, the semiconductor device 801 shown in FIG. 8 comprises an input terminal 803, a control circuit 804, and a semiconductor display device 802. In the semiconductor display device 802, memory portions 820a, 820b, and 820c and data line side driver circuits 817a, 817b, and 817c are mounted on the substrate on which the pixel portion is formed, using the stick drivers. The memory portions and the data line side driver circuits (820a, 817a), (820b, 817b), and (820c, 817c), which compose the data line side stick drivers 822a, 822b, and 822c, respectively, are formed on the same substrate. Further, scanning line side driver circuits 818a and 818b may be formed using stick driver circuits.

The semiconductor device described in this embodiment has a control circuit capable of performing image signal format conversion in addition to the semiconductor display device. In FIG. 7, image signals such as a color signal, an intensity signal, and a correction signal and a control signal are input to the semiconductor device 701. The image signals and the control signal, which are input to the semiconductor device 701 are input to the control circuit 712 through the input terminal 711 and converted into an image format suitable for the semiconductor display device 702. Signals similar to the image signals and the control signal, which are input to the semiconductor display device shown in FIG. 1 (see the embodiment mode) are input to the semiconductor display device 702 and an image is displayed on the pixel portion 717. Further, in the semiconductor device 801, the same operation is performed. Note that the control circuit is composed of a chip different from the pixel portion.

Even in such a semiconductor device, when the still image is displayed, the image data stored in the memory portion mounted on the substrate on which the pixel portion is formed can be used. Thus, when a large amount of data is transferred, for example, when the image signal is transferred from the outside of the semiconductor display device, the consumption power can be greatly reduced. In some cases, the power consumed all in the first semiconductor device (701 or 801) and the second semiconductor device which supplies the image layer signals and the control signal to the first semiconductor device can be made to be 70% or lower, as compared with the case where the image data is provided from the second semiconductor display device and displayed. Further, the power consumed in the first semiconductor display device can be made to be 50% of the whole or more (preferably, 90% or more). Further, the still image can be displayed on only the first semiconductor device without using the second semiconductor device.

This embodiment can be applied to the liquid crystal display, the EL display, and the like. Further, this embodiment can be combined with Embodiment 1. That is, in the semiconductor devices shown in FIGS. 7 and 8, the memory control circuit may be mounted on the semiconductor display device.

Embodiment 3

In this embodiment, an example that the present invention in the application is applied to an active matrix liquid crystal display device will be described. The description is made using FIG. 9.

FIG. 9(A) is a block diagram of an active matrix liquid crystal display device. The active matrix liquid crystal display device shown in FIG. 9(A) has a pixel portion 901 in which pixels 904 are arranged in matrix, a data line side driver circuit 902, a scanning line side driver circuit 903, and a memory portion 905. Data lines 906 are connected with the data line side driver circuit 902. Scanning lines 907 are connected with the scanning line side driver circuit 903. A common potential is provided for a capacitor line 908.

Note that the pixel portion 901, the data line side driver circuit 902, the scanning line side driver circuit 903, and the memory portion 905 may be formed on the same substrate. Further, the data line side driver circuit 902, the memory portion 905, and the scanning line side driver circuit 903 may be mounted on the substrate on which the pixel portion is formed, using the stick drivers described in the embodiment mode.

Figure 9B:
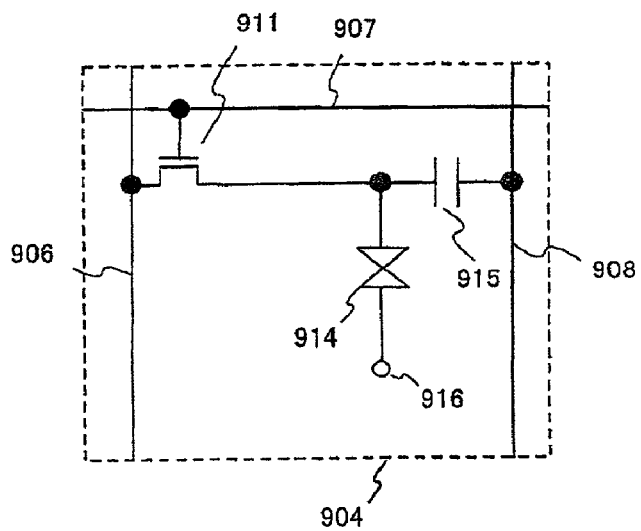

FIG. 9(B) shows a circuit diagram of the pixel 904 composing the pixel portion 901. The pixel 904 has a switching TFT 911, a liquid crystal element 914, and a capacitor 915. The gate electrode of the switching TFT 911 is connected with the scanning line 907 and one of the source and drain electrodes is connected with the data line 906. The other of the source and drain electrodes of the switching TFT 911 is connected with the liquid crystal 914 and the capacitor 915. The other electrode of the liquid crystal element 914 is connected with a counter electrode 916 and the other electrode of the capacitor 915 is connected with the capacitor line 908.

Note that one electrode of the capacitor 915 may be connected with the counter electrode 916 without providing the capacitor line 908. Further, the capacitor 915 may not be provided. Further, the switching TFT 911 may be an n-channel TFT or a p-channel TFT.

This embodiment may be combined with any structure of Embodiments 1 and 2. That is, the control circuit described in Embodiment 1 may be provided in the semiconductor display device of this embodiment. Further, the semiconductor display device of this embodiment may be incorporated in the semiconductor device of Embodiment 2.

Embodiment 4

In this embodiment, an active matrix liquid crystal display device to which the present invention in the application is applied will be described using a top view and a cross sectional view.

Figure 10:
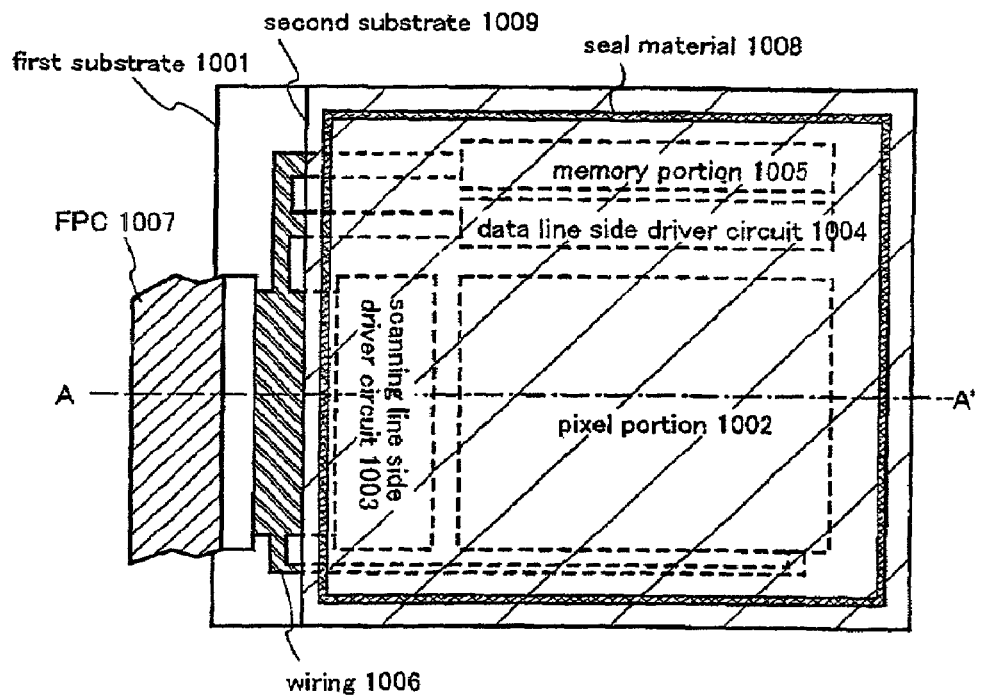
FIGS. 10(A) and 10(B) Top and cross sectional views of an active matrix liquid crystal display device.
Figure 10:
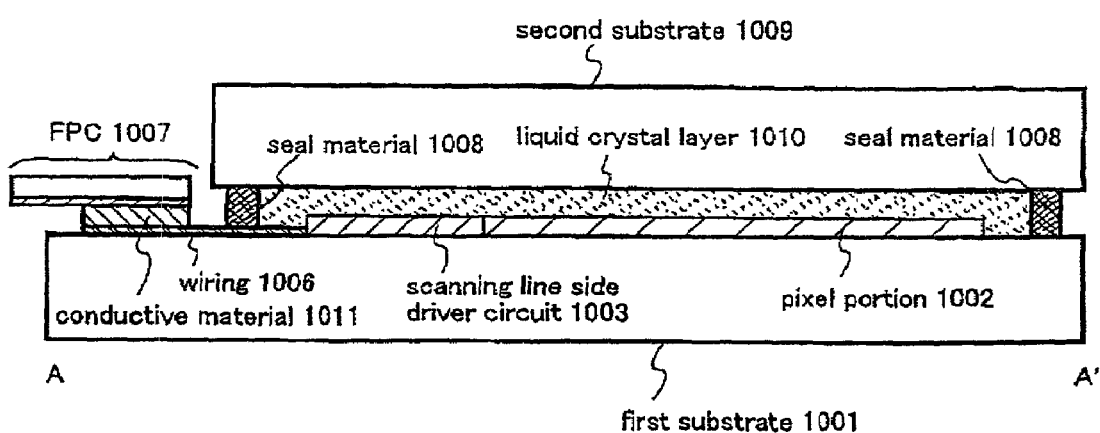

FIG. 10(A) is a top view of an active matrix liquid crystal display device indicating a state after filling of liquid crystal is made. In FIG. 10(A), a pixel portion 1002, a scanning line side driver circuit 1003, a data line side driver circuit 1004, a memory portion 1005, and a wiring 1006 are formed on a first substrate 1001. The first substrate 1001 and the second substrate 1009 are adhered to each other through a seal material 1008. The liquid crystal is filled between the two substrates, which is surrounded by the seal materials 1008 (see a liquid crystal layer 1010 in FIG. 10(B)).

The wiring 1006 is a connection wiring for transferring input signals to the scanning line side driver circuit 1003, the data line side driver circuit 1004, the memory portion 1005, and the pixel portion 1002 and receives an image signal and a control signal from an FPC (flexible printed circuit) 1007 as a connection terminal to an external semiconductor device.

Next, a cross sectional view corresponding to a cross section taken along A–A' in FIG. 10(A) is shown in FIG. 10(B). Note that in FIGS. 10(A) and 10(B), the same symbols are used for the same portions.

In FIG. 10(B), the pixel portion 1002, the scanning line side driver circuit 1003, and the wiring 1006 are formed on the first substrate 1001. The pixel portion 1002 is composed of TFTs for controlling a voltage applied to a liquid crystal layer (referred to as switching TFTs) and a plurality of pixels including capacitors electrically connected with the drain regions, pixel electrodes, and the like (not shown). Further, the scanning line side driver circuit 1003 is composed of a CMOS circuit in which an n-channel TFT and a p-channel TFT are complementarily combined with each other. Further, color filters, scallop spacers, an overcoat layer, a counter electrode, and the like are formed on the second substrate 1009.

In the liquid crystal display device shown in FIG. 10B, the above first substrate 1001 and the above second substrate 1009 are adhered to each other through the seal material 1008, the liquid crystal is injected into the region surrounded by the first substrate 1001, the second substrate 1009, and the seal material 1008 (formation of the liquid crystal layer 1010), and the wiring 1006 and the FPC 1007 are electrically connected with each other using a conductive material 1011.

Note that a known liquid crystal material may be used as the liquid crystal material. An interval between the two substrates is determined by the scallop spacers provided in the second substrate. In the case of nematic liquid crystal, it is set to be 3 to 8 μm. In the case of smetic liquid crystal, it is set to be 1 to 4 μm. A second seal material may be provided so as to cover an exposed portion of the seal material 1008 and a portion of the FPC 809.

Note that the structure of this embodiment can be freely combined with any structure of Embodiments 1 to 3.

Embodiment 5

The present invention in the application can be also applied to an active matrix liquid crystal display device using stick drivers.

Figure 11:
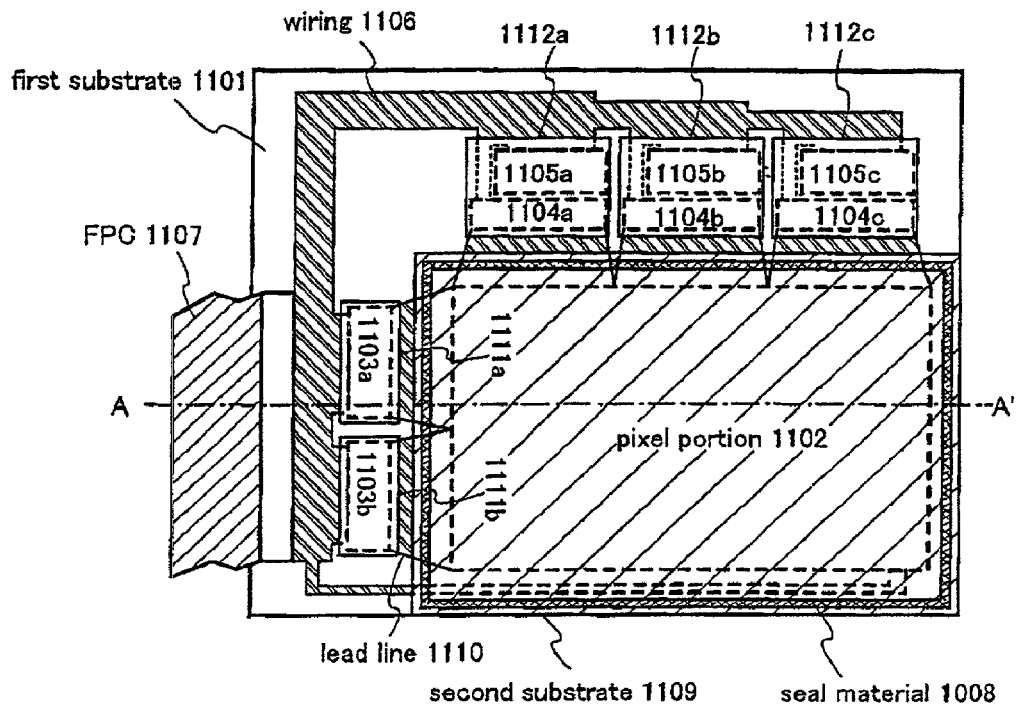
FIGS. 11(A) and 11(B) Top and cross sectional views of an active matrix liquid crystal display device.
Figure 11:
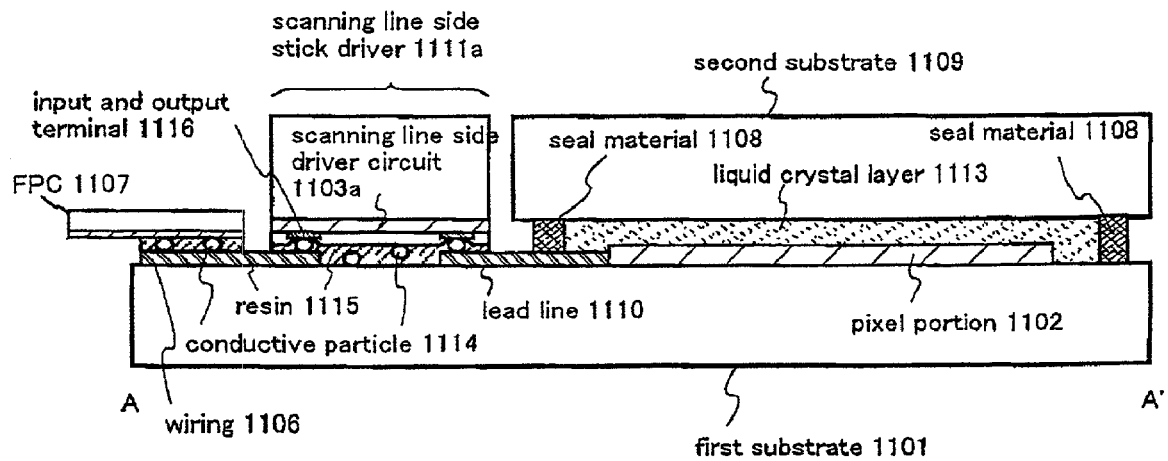

FIG. 11(A) is a top view of an active matrix liquid crystal display device indicating a state after filling of liquid crystal is made. In FIG. 11(A), on a first substrate 1101, a pixel portion 1102, a wiring 1106, and a lead line 1110 are formed and scanning line side stick drivers 1111a and 1111b and data line side stick drivers 1112a, 1112b, and 1112c are mounted. The scanning line side stick drivers 1111a and 1111b have scanning line side driver circuits 1103a and 1103b, respectively. The data line side stick drivers 1112a, 1112b, and 1112c have scanning line side driver circuit and memory portions (1104a and 1105a), (1104b and 1105b), and (1104c and 1105c), respectively. The first substrate 1101 and the second substrate 1109 are adhered to each other through the seal material 1108 and the liquid crystal is sealed between the two substrates, which is surrounded by the seal material 1108 (see a liquid crystal layer 1113 in FIG. 11(B)).

The wiring 1106 is a connection wiring for transferring signals input to the scanning line side stick drivers 1111a and 1111b, the data line side stick drivers 1112a, 1112b, and 1112c, and the pixel portion 1102 and receives an image signal and a control signal from an FPC (flexible printed circuit) 1107 as a connection terminal to an external semiconductor device. Further, the lead line 1110 is a wiring for inputting output signals from the scanning line side stick drivers 1111a and 1111b and the data line side stick drivers 1112a, 1112b, and 1112c to the pixel portion 1102.

Next, a cross sectional view corresponding to a cross section taken along A–A' in FIG. 11(A) is shown in FIG. 11(B). Note that in FIGS. 11(A) and 11(B), the same symbols are used for the same portions.

In FIG. 11(B), on the first substrate 1101, the pixel portion 1102, the wiring 1106, and the lead line 1110 are formed and the scanning line side stick driver 1111a is mounted.

Here, with respect to a region in which the two substrates are adhered to each other, as in the case of the cross sectional view shown in FIG. 10(B) (see Embodiment 4), the first substrate 1101 and the second substrate 1109 are adhered to each other through the seal material 1108 and the liquid crystal layer 1113 is formed therebetween.

Further, one edge of the wiring 1106 and the FPC 1107 are adhered to each other through an anisotropic conductive material. The anisotropic conductive material is made of a resin 1115 and conductive particles 1114 in which Au or the like is plated on the surface and which has a diameter of several tens to several hundreds μm. The wiring 1106 and the FPC 1107 are electrically connected with each other through the conductive particles 1114.

Note that a second seal material may be provided so as to cover an exposed portion of the seal material 1108, a portion of the FPC 1107, a part of the scanning line side stick drivers 1111a and 1111b, and apart of the data line side stick drivers 1112a, 1112b, and 1112c.

Here, the stick driver and its mounting method will be briefly described. A cross sectional view of the scanning line side stick drivers 1111a is shown in FIG. 11(B) and has the scanning line side driver circuit 1103a and input and output terminals 1116. The scanning line side stick drivers 1111a is mounted by a method similar to a method of connecting the FPC 1107 with the wiring 1106. That is, the scanning line side stick driver 1111a is adhered to the first substrate 1101 through the anisotropic conductive material. The input and output terminals 1116 provided in the scanning line side stick drivers 1111a are electrically connected with the lead line 1110 and the wiring 1106 through the conductive particles 1114 mixed into the resin 1115.

The above mounting method is used for all the stick drivers mounted on the semiconductor device of this embodiment. Further, the mounting method for the stick driver is not limited to the method shown in FIG. 11(B), and thus a COG method, a wire bonding method, or a TAB method, which is known, except for the method as described here can be used.

Note that the stick driver may be formed on any substrate among a silicon substrate, an SOI substrate, and a substrate having an insulating surface. In particular, when the stick driver has the same thickness as the second substrate 1109, it is preferable that thinness of the entire semiconductor display device can be provided. Further, when the stick driver is made of the same material as the first substrate 1101, even if a change in temperature is caused in the liquid crystal display device, it is preferable that there is not the case where thermal stress is produced and thus there is not the case where characteristics of circuits manufactured using TFTs are deteriorated.

Note that the structure of this embodiment can be freely combined with any structure of Embodiments 1 to 3.

Embodiment 6

In this embodiment, an example in which the present invention is applied to an active matrix EL display device will be described. The description is made with reference to FIG. 12.

Figure 12A:
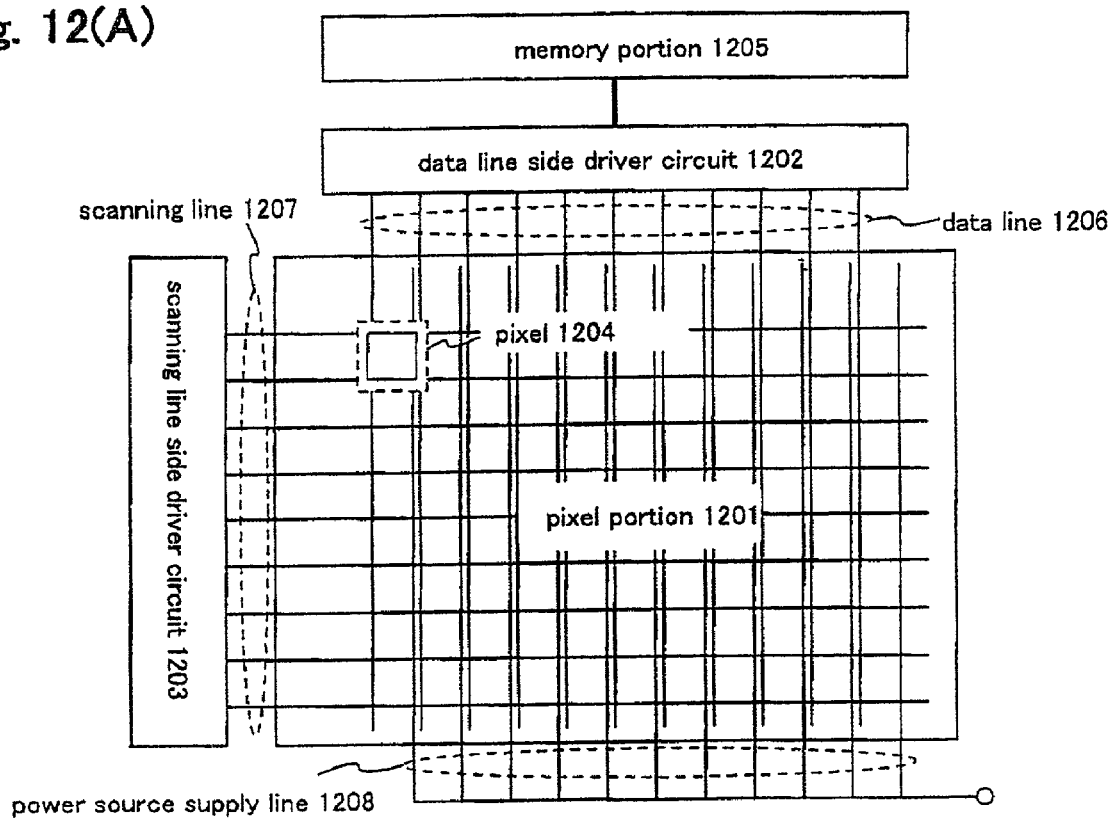
FIGS. 12(A) and 12(B) Views showing a structure of an active matrix EL display device.

FIG. 12(A) is a block diagram of an active matrix EL display device. The active matrix EL display device shown in FIG. 12(A) has a pixel portion 1201 in which pixels 1204 are arranged in matrix, a data line side driver circuit 1202, and a scanning line side driver circuit 1203. Data lines 1206 are connected with the data line side driver circuit 1202. Scanning lines 1207 are connected with the scanning line side driver circuit 1203. A predetermined potential is provided for a power source supply line 1208.

Note that the pixel portion 1201, the data line side driver circuit 1202, the scanning line side driver circuit 1203, and a memory portion 1205 may be formed on the same substrate. Also, the data line side driver circuit 1202, the memory portion 1205, and the scanning line side driver circuit 1203 may be mounted on the substrate on which the pixel portion is formed, using the stick drivers described in the embodiment mode.

Figure 12B:
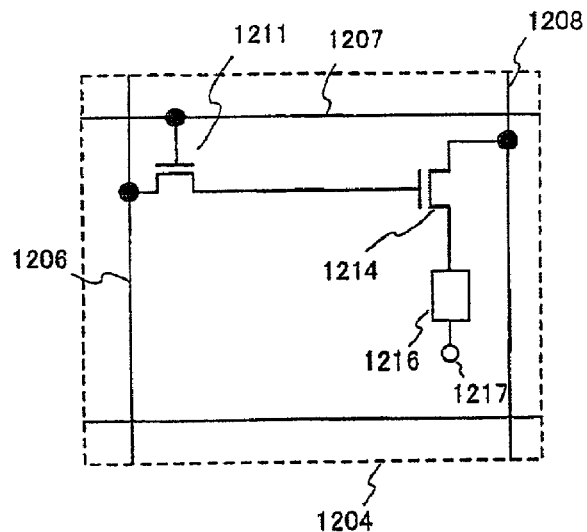

FIG. 12(B) shows a circuit diagram of the pixel 1204 composing the pixel portion 1201. The pixel 1204 has a switching TFT 1211, an EL driving TFT 1214, and an EL element 1216. The gate electrode of the switching TFT 1211 is connected with the scanning line 1207 and one of the source and drain electrodes is connected with the data line 1206. The other of the source and drain electrodes of the switching TFT 1211 is connected with the gate electrode of the EL driving TFT 1214. Further, the source electrode of the EL driving TFT 1214 is connected with the power source supply line 1208, and the drain electrode is connected with the EL element 1216. The other electrode of the EL element 1216 is connected with an opposing electrode 1217.

Note that a capacitor may be provided between the gate electrode of the EL driving TFT 1214 and the power source supply line 1208. Further, an n-channel TFT is used as the EL driving TFT. The switching TFT 1211 may be an n-channel TFT or a p-channel TFT.

This embodiment may be combined with any structure of Embodiments 1 and 2. That is, the control circuit described in Embodiment 1 may be provided in the semiconductor display device of this embodiment. Also, the semiconductor display device of this embodiment may be incorporated in the semiconductor device of Embodiment 2.

Embodiment 7

In this embodiment, an active matrix EL display device to which the present invention in the application is applied will be described using a top view and a cross sectional view.

Figure 13A:
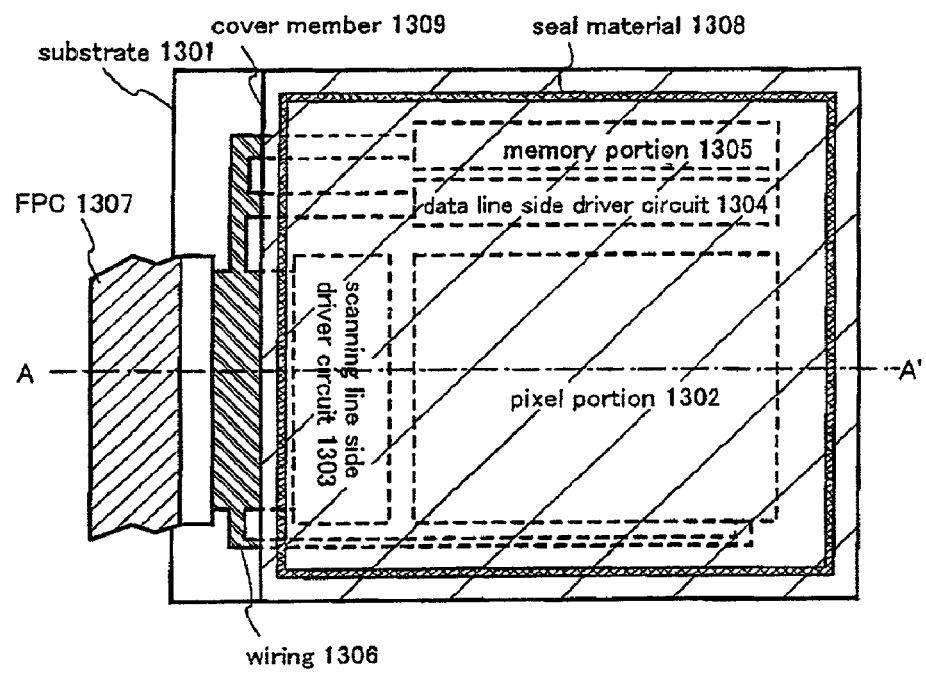

FIG. 13(A) is a top view of an active matrix EL display device indicating a state after filling of an EL element. In FIG. 13(A), a pixel portion 1302, a scanning line side driver circuit 1303, a data line side driver circuit 1304, a memory portion 1305, and a wiring 1306 are formed on a substrate 1301. Further, reference numeral 1309 indicates a cover member, and reference numeral 1308 indicates a seal material. A filling material 1310 (see FIG. 13(B)) is provided in the region between the cover member 1309 surrounded by the seal material 1308 and the substrate 1301.

The wiring, 1306 is a connection wiring for transferring signals input to the scanning line side driver circuit 1303, the data line side driver circuit 1304, the memory portion 1305, and the pixel portion 1302 and receives an image signal and a control signal from an FPC (flexible printed circuit) 1307 as a connection terminal to an external device.

Figure 13B:
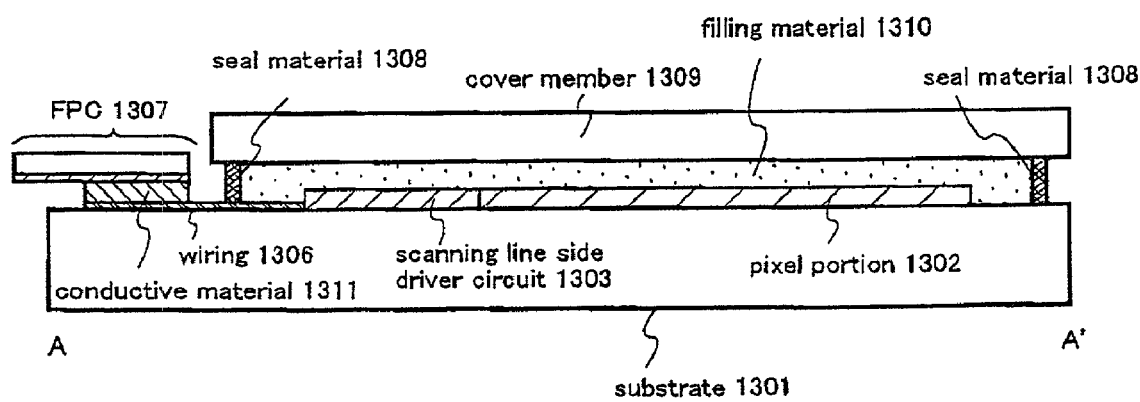

Next, a cross sectional view corresponding to a cross section taken along A–A' in FIG. 13(A) is shown in FIG. 13(B). Note that in FIGS. 13(A) and 13(B), the same symbols are used for the same portions.

In FIG. 13(B), the pixel portion 1301 and the scanning line side driver circuit 1303 are formed on the substrate 1301. The pixel portion 1301 is composed of switching TFTs, EL driving TFTs, and a plurality of pixels including pixel electrodes and the like. The respective pixels may include a color filter under the pixel electrode. An insulating film having opening portions is formed on the pixel electrodes and an EL layer and a counter electrode are formed thereon. The counter electrode is common to all the pixels and electrically connected with the FPC 1307 through the wiring 1306. Further, the scanning line side driver circuit 1303 is composed of a CMOS circuit in which an n-channel TFT and a p-channel TFT are complementarily combined with each other.

In the EL display device shown in FIG. 13(B), the seal material 1308 is formed on the above substrate 1301 and adhered to the cover member 1309 after spacers are spread, and then the filling material 11310 is injected into a region surrounded by the substrate 1301, the cover member 1309, and the seal material 1308. The wiring 1306 and the FPC 1307 are electrically connected with each other through a conductive material 1311.

Note that an EL layer 4029 may be formed with a laminate layer structure or a single layer structure by free combination of known EL materials (hole injection layer, hole transport layer, luminescent layer, electron transport layer, and electron injection layer). As the EL material, not only an organic material but also inorganic material can be used. As the cover member 1309, a plate made of the same material as the substrate 1301 may be used. Further, a second seal material (not shown) may be provided so as to cover an exposed portion of the seal material 1308 and a portion of the FPC 1307.

Note that the structure of this embodiment can be freely combined with any structure of Embodiments 1, 2 and 6.

Embodiment 8

The present invention in the application can be also applied to an active matrix EL display device using stick drivers.

Figure 14A:
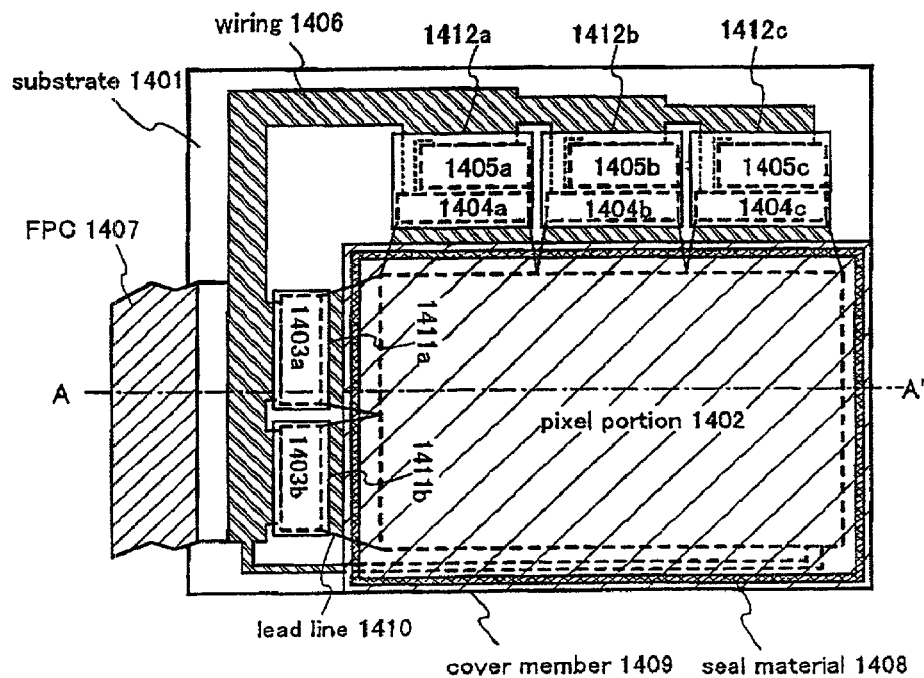

FIG. 14(A) is a top view of an active matrix EL display device indicating a state after filling of an EL element. In FIG. 14(A), on a substrate 1401, a pixel portion 1402, a wiring 1406, and a lead line 1410 are formed and scanning line side stick drivers 1411a and 1411b and data line side stick drivers 1412a, 1412b, and 1412c are mounted. The scanning line side stick drivers 1411a and 1411b have scanning line side driver circuits 1403a and 1403b. The data line side stick drivers 1412a, 1412b, and 1412c have scanning line side driver circuits and memory portions (1404a and 1405a), (1404b and 1405b), and (1404c and 1405c), respectively. Further, reference numeral 1409 indicates a cover member, and reference numeral 1408 indicates a seal material. A filling material 1410 (see FIG. 14(B)) is provided in the region between the cover member surrounded by the seal material 1408 and the substrate.

The wiring 1406 is a connection wiring for transferring signals input to the scanning line side stick drivers 1411a and 1411b, the data line side stick drivers 1412a, 1412b, and 1412c, and the pixel portion 1402 and receives an image signal and a control signal from an FPC (flexible printed circuit) 1407 as a connection terminal to an external semiconductor device. Also, the lead line 1410 is a wiring for inputting output signals from the scanning line side stick drivers 1411a and 1411b and the data line side stick drivers 1412a, 1412b, and 1412c to the pixel portion 1402.

Figure 14B:
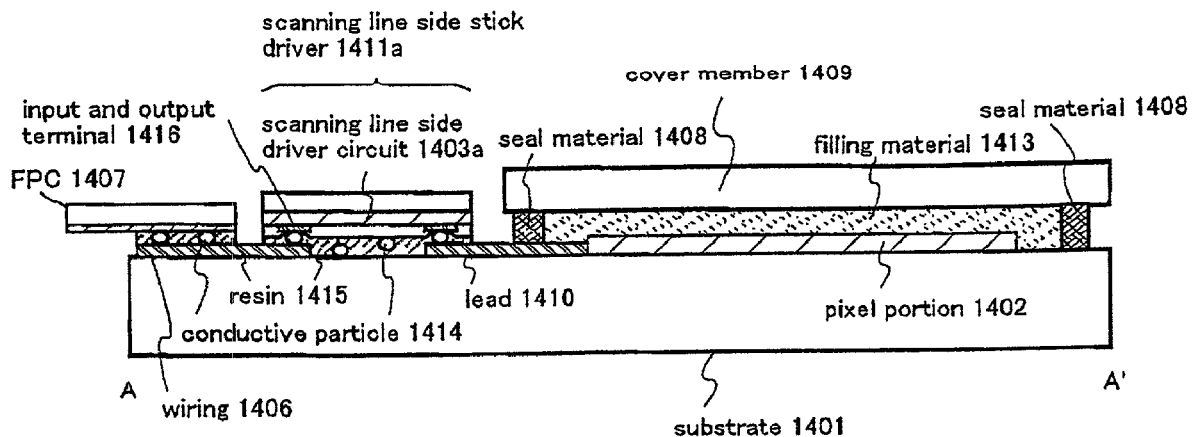

Next, a cross sectional view corresponding to a cross section taken along A–A' in FIG. 14(A) is shown in FIG. 14(B). Note that in FIGS. 14(A) and 14(B), the same symbols are used for the same portions.

In FIG. 14(B), on the substrate 1401, the pixel portion 1402, the wiring 1406, and the lead line 1410 are formed and the scanning line side stick driver 1411a is mounted.

Here, with respect to a region in which the two substrate are adhered to each other, as in the case of the cross sectional view shown in FIG. 13(B) (see Embodiment 7), the substrate 1401 and the cover member 1409 are adhered to each other through the seal material and the filling material 1413 is filled therebetween. Note that the same material plate for the substrate 1401 may be used for the cover member 1409.

Also, one edge of the wiring 1406 and the FPC 1407 are adhered to each other through an anisotropic conductive material. The anisotropic conductive material is made of a resin 1415 and conductive particles 1414 in which Au or the like is plated on the surface and which has a diameter of several tens to several hundred μm. The wiring 1406 and the FPC 1407 are electrically connected with each other through the conductive particles 1414.

Note that a second seal material may be provided so as to cover an exposed portion of the seal material 1408, a portion of the FPC 1407, a part of the scanning line side stick drivers 1411a and 1411b, and a part of the data line side stick drivers 1412a, 1412b, and 1412c.

The same method as described in Embodiment 5 may be used for a method of mounting the stick driver. A cross sectional view of the scanning line side stick driver 1411a is shown in FIG. 14(B) and has the scanning line side driver circuit 1403a and input and output terminals 1416. Further, the scanning line side stick driver 1411a is adhered to the substrate 1401 through the anisotropic conductive material. The input and output terminals 1416 provided in the scanning line side stick driver 1411a are electrically connected with the lead line 1410 and the wiring 1406 through the conductive particles 1414 mixed into the resin 1415.

The above mounting method is also used for all the stick drivers mounted on the semiconductor device of this embodiment. Also, the mounting method for the stick driver is not limited to the method shown in FIG. 14(B), and thus a COG method, a wire bonding method, or a TAB method, which is known, in addition to the method as described here can be used.

Note that the stick driver may be formed on any substrate among a silicon substrate, an SOI substrate, and a substrate having an insulating surface. In particular, the case where the stick driver has the same thickness as the cover member is preferable in the point that this contributes to thinness of the entire semiconductor display device. Also, when the stick driver is made of the same material as the substrate 1401, even if a change in temperature is caused in the EL display device, thermal stress is not produced. This is preferable in the point that characteristics of circuits manufactured using TFTs are not deteriorated.

Note that the structure of this embodiment can be freely combined with any structure of Embodiments 1, 2 and 6.

Embodiment 9

The present invention in the application can be also applied to a passive matrix display device.

Figure 15A:
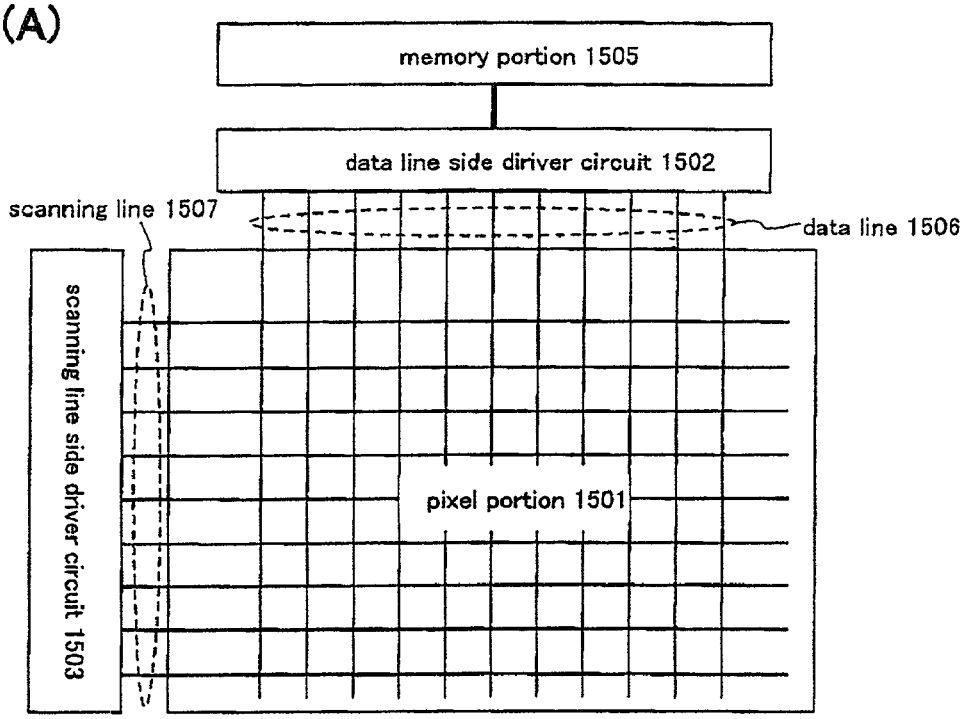
FIGS. 15(A) and 15(B) Views showing a structure of a passive matrix display device.

FIG. 15(A) is a block diagram of a passive matrix display device. The passive matrix display device shown in FIG. 15(A) has a pixel portion 1501, a data line side driver circuit 1502, a scanning line side driver circuit 1503, and a memory portion 1505. The pixel portion 1501 is formed such that data lines 1506 connected with the data line side driver circuit 1502 intersect the scanning lines 1507 connected with the scanning line side driver circuit 1503.

Note that the data lines and the scanning lines are formed in upper and lower positions sandwiching a liquid crystal layer or a self luminescent layer. In the case of the liquid crystal display device, these are formed on a first substrate and a second substrate. In the case of the EL display device, the data lines, the EL layer, and the scanning lines are laminated on a substrate.

The data line side driver circuit 1502, the scanning line side driver circuit 1503, and the memory portion 1505 may be directly formed on the substrate on which the pixel portion is formed or may be mounted thereon using the stick drivers.

Figure 15B:
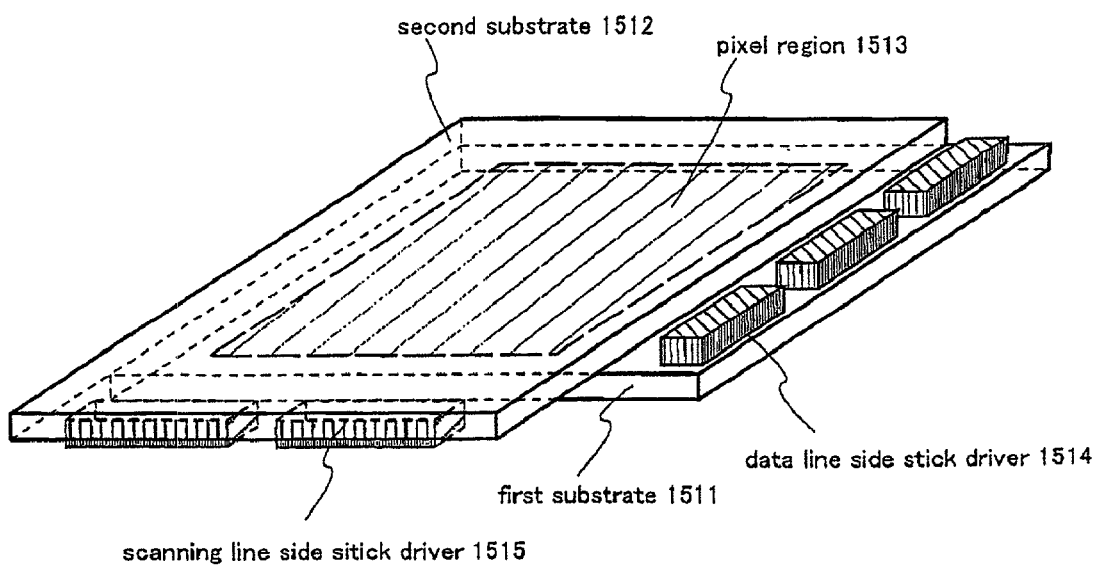

FIG. 15(B) shows one example of a passive matrix liquid crystal display device using stick drivers. In FIG. 15(B), data line side stick drivers 1514 and scanning line side stick drivers 1515 are mounted on a first substrate 1511 and a second substrate 1512, respectively. A pixel region 1513 is formed such that a plurality of data lines formed in the first substrate side 1511 intersect a plurality of scanning lines formed in the second substrate side.

Although not shown, the scanning line side stick drivers mounted on the first substrate have scanning line side driver circuits and are connected with the FPC through the scanning lines and wirings. Further, the data line side stick drivers mounted on the second substrate have data line side driver circuits and memory portions and are connected with the FPC through the data lines and wirings. A liquid crystal layer is formed between the first substrate and the second substrate.

It is preferable that the substrate in which the stick drivers are formed has the same thickness and the same material quality as the substrate on which the pixel portion is formed. Of course, it may be formed on any substrate among a silicon substrate, an SOI substrate, and a substrate having an insulating surface.

Note that the structure of this embodiment can be combined with any structure of Embodiments 1 and 2. That is, the control circuit described in Embodiment 1 may be provided in the semiconductor display device of this embodiment. Alternatively, the semiconductor display device of this embodiment may be incorporated in the semiconductor device of Embodiment 2.

Embodiment 10

In the present invention in the application, a memory composing a memory portion may be an SRAM, a DRAM, or an EEPROM. In this embodiment, a block diagram of the memory portion and basic operation thereof will be described.

FIG. 16 shows one example of a block diagram of a memory portion composing the present invention in the application. In FIG. 16, the memory portion is composed of a memory cell array 1602 in which respective memory cells capable of storing one bit data are arranged in matrix, an X-address decoder 1603, a Y-address decoder 1604, a multiplexer 1606, a write circuit 1605, a readout circuit 1607, and other peripheral circuits 1608 and 1609. The memory portion may be any one of an SRAM, a DRAM, or an EEPROM. The memory cells, the write circuit, the readout circuit, the peripheral circuits, and the like are selected corresponding to an application. A plurality of bit lines 1611 are connected with the X-address decoder 1603 and the multiplexer 1606 and a plurality of word lines 1610 are connected with the Y-address decoder 1604. The respective memory cells are connected with the word lines and the bit lines. Other peripheral circuits includes an address buffer circuit, a control logic circuit, a redundancy circuit, and the like and are provided if necessary. It is preferable that a sense amplifier is provided in the readout circuit.

With respect to the respective memory cells, Embodiments 11 to 13 can be referred to. Further, with respect to the other circuits, known circuit structures may be used.

Next, the basic operation of the memory portion will be described. First, when address information for the memory cell is input from the outside of the memory portion, one word line and one bit line are selected by the X-address decoder and the Y-address decoder and thus one memory cell is selected. Simultaneously, either readout operation or write operation is selected in accordance with a control signal from the outside of the memory portion. When the readout operation is performed, the bit line connected with the selected memory cell is connected with the readout circuit and is output to the outside. When the write operation is performed, the bit line connected with the selected memory cell is connected with the write circuit and input data is written into the memory cell through the bit line.

The above operation may be generally common in any memory among an SRAM, a DRAM, and an EEPROM. Note that there is the case where bit line pairs are connected with the respective memory cells in accordance with a kind of the memory. In this case, the selection of the memory cell is performed by selecting one word line and a pair of bit lines. In the case of the EEPROM, delete operation is performed in addition to the write operation and the readout operation. With respect to the write operation, the readout operation, or the delete operation individually corresponded to respective memories, known operational methods suitable for respective circuit structures may be used.

According to the present invention in the application, the memory portion is formed on the substrate on which the pixel portion is formed or formed on the substrate composing the stick driver. The memory portion may be formed on any substrate among a bulk silicon substrate, an SOI substrate, and a substrate having an insulating surface in accordance with a mounting mode.

This embodiment may be combined with any structure of Embodiments 1 to 9.

Embodiment 11

According to the present invention in the application, a memory composing a memory portion may be any one of an SRAM, a DRAM, or an EEPROM. In this embodiment, the case where the SRAM is used as the memory portion will be described.

The SRAM has a characteristic that a write speed is very high as compared with the DRAM and the EEPROM. Further, if the power source is not turned off, the input data is kept until next data is input. Thus, refresh operation required in the DRAM is not necessary. Further, the SRAM can be formed using only a transistor. Thus, the SRAM can be integrally formed with the pixel portion and the driver circuits for the pixel portion without increasing the number of manufacturing steps.

Figure 17A:
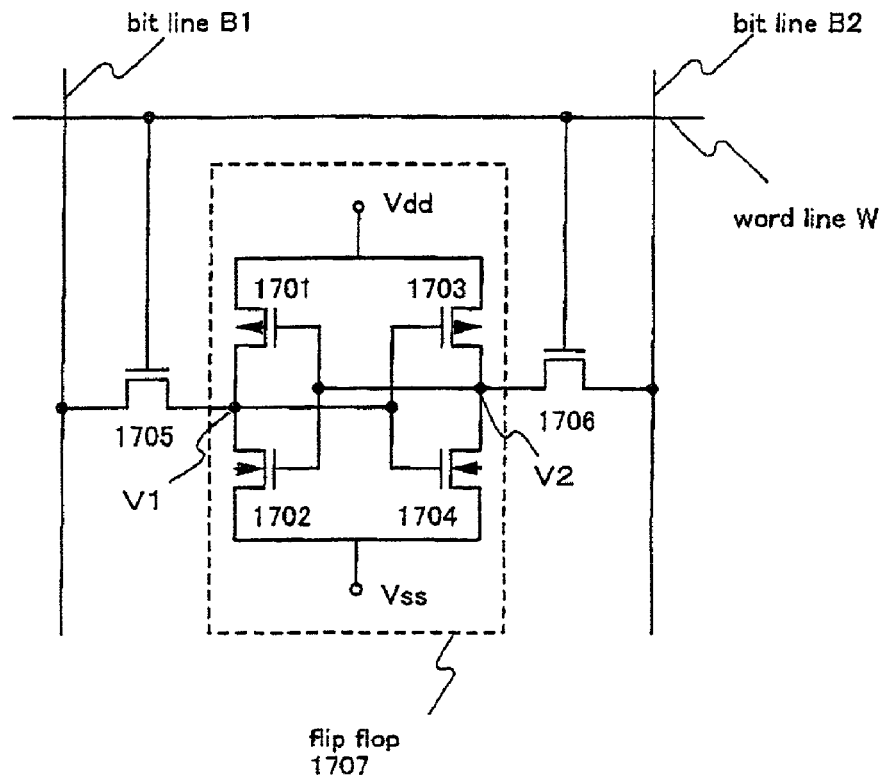
FIGS. 17(A) and 17(B) Circuit diagrams of a memory cell of an SRAM.
Figure 17B:
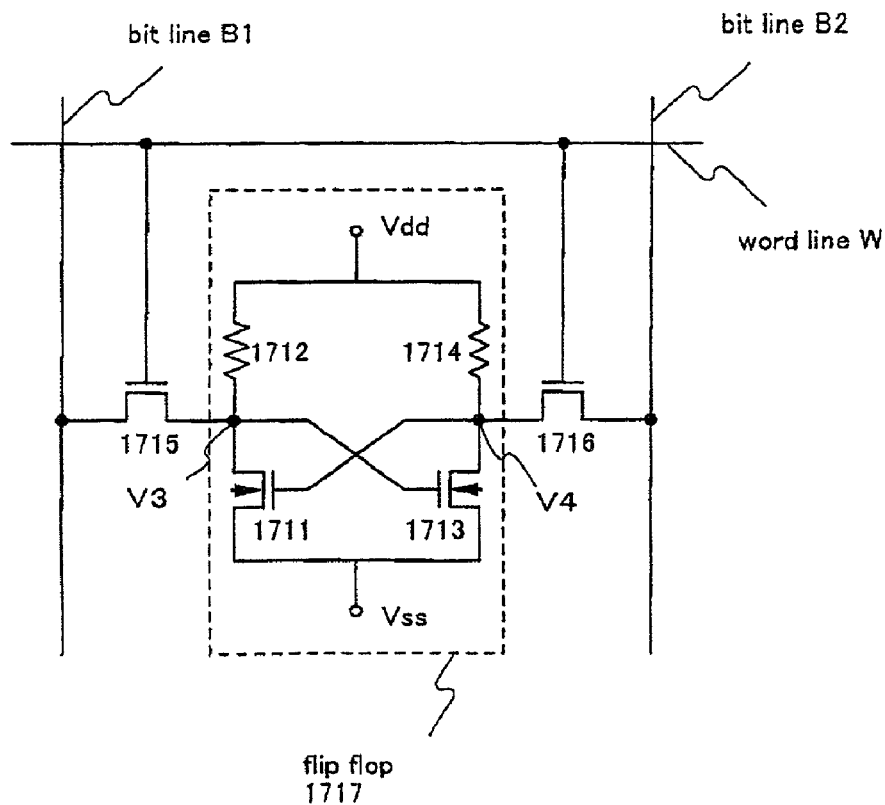

FIGS. 17(A) and 17(B) show an example of a memory cell of the SRAM.

In FIG. 17(A), the memory cell is composed of a flip flop 1707 having two p-channel transistors 1701 and 1703 and two n-channel transistors 1702 and 1704 and two switching transistors 1705 and 1706.

In the flip flop 1707, the source regions of the p-channel transistors 1701 and 1703 are connected with a high voltage side of Vdd and the source regions of the n-channel transistors 1702 and 1704 are connected with a low voltage side of Vss. The p-channel transistor 1701 and the n-channel transistor 1702 make a pair and the p-channel transistor 1703 and the n-channel transistor 1704 make a pair. In the p-channel transistors and the n-channel transistors, which made pairs, their drain regions are connected with each other. In the p-channel transistors and the n-channel transistors, which made pairs, their gate electrodes are connected with each other. The drain regions of the p-channel and n-channel transistors as one of pairs are electrically connected with the gate electrodes of the p-channel and n-channel transistors as the other of pairs. The drain regions (potential is given as V1) of the p-channel transistor 1701 and the n-channel transistor 1702 are connected with one of the source and drain regions of the switching transistor 1705. The drain regions (potential is given as V2) of the p-channel transistor 1703 and the n-channel transistor 1704 are connected with one of the source and drain regions of the switching transistor 1706.

The flip flop 1707 is designed such that the potentials V1 and V2 becomes inverse potentials each other. That is, when the potential V1 is Vdd, the potential V2 becomes Vss. When the potential V2 is Vss, the potential V1 becomes Vdd.

When a word line W and a bit line pair (B1 and B2) which are connected with the memory cell are selected, the switching transistor 1705 and 1706 become an on-state. At the time of write, signals input to the bit line pair (B1 and B2) are written into the flip flop 1707. At the time of readout, the potentials V1 and V2 of the flip flop 1707 is read out through the bit line pair (B1 and B2).

Next, a memory cell different from that in FIG. 17(A) is shown in FIG. 17(B). In FIG. 17(B), the memory cell is composed of a flip flop 1717 having two n-channel transistors 1711 and 1713 and two resistors 1712 and 1714, and two switching transistors 1715 and 1716.

In the flip flop 1717, the drain regions of the n-channel transistors 1711 and 1713 are connected with a high voltage side of Vdd through the resistors 1712 and 1714, and the source regions are connected with a low voltage side of Vss. The drain regions of the n-channel transistors are electrically connected with the gate electrodes of the n-channel transistors with each other. The drain regions (potential is given as V3) of the n-channel transistor 1711 are connected with one of the source and drain regions of the switching transistor 1715. The drain regions (potential is given as V4) of the n-channel transistor 1713 are connected with one of the source and drain regions of the switching transistor 1716.

The flip flop 1717 is designed such that the potentials V3 and V4 become inverse potentials with each other. That is, when the potential V3 is Vdd, the potential V4 becomes Vss. When the potential V4 is Vss, the potential V3 becomes Vdd.

When a word line W and a bit line pair (B1 and B2) which are connected with the memory cell are selected, the switching transistors 1715 and 1716 become an on-state. At write, signals input to the bit line pair (B1 and B2) are written into the flip flop 1717. At readout, the potentials V1 and V2 of the flip flop 1717 are read out through the bit line pair (B1 and B2).

Note that the memory cell of the SRAM is not limited to that shown in FIG. 18. A memory cell of another known SRAM may be used.

This embodiment maybe combined with any structure of Embodiments 1 to 10.

Embodiment 12

According to the present invention in the application, a memory composing a memory portion may be any one of an SRAM, a DRAM, or an EEPROM. In this embodiment, the case where the DRAM is used as the memory portion will be described.

In the DRAM, since a memory cell is composed of one transistor and one capacitor, as described later, the memory cell having a smaller area than the SRAM can be realized. As a result, a memory having a larger capacity and a lower cost than the SRAM can be realized. Further, an operational speed is inferior to the SRAM but superior to the EEPROM. The DRAM can be formed using a transistor and a capacitor. Thus, when only a capacitor forming process is added, the DRAM can be integrally formed with the pixel portion and the driver circuits for the pixel portion.

FIG. 18 shows one example of a memory cell of the DRAM. In FIG. 18, the memory cell is composed of a capacitor 1802 for storing charge and a switching transistor 1801 for controlling charge and discharge. The gate electrode of the switching transistor 1801 is connected with a word line W, one of the source and drain regions is connected with a bit line B, and the other of the source and drain regions is connected with the capacitor 1802. A standard potential is provided for the other electrode of the capacitor 1802.

The DRAM stores one bit information in accordance with a state whether or not charge is stored in the capacitor composing the memory cell. In data write, the switching transistor 1801 connected with the word line W is made to be an on-state and the potential of the bit line B is made to be a high potential or a low potential. Thus, the amount of charge stored in the capacitor 1802 of the memory cell is controlled. On the other hand, in data readout, the switching transistor connected with the word line W is made to be an on-state 1801 and the capacitance of the capacitor 1802 of the memory cell and a parasitic capacitance of the bit line B are redistributed. Thus, a change in a potential of the bit line B is detected by a readout circuit having a sense amplifier.

Note that in the DRAM, loss of charge stored in the capacitor is caused for a short time by an off current of the switching TFT. In order to prevent this in the DRAM, refresh operation such as readout and rewrite are performed every predetermined period is required.

Note that a known structure may be used as the structure of the memory cell composing the DRAM (in particular, the structure of the capacitor).

This embodiment may be combined with any structure of Embodiments 1 to 10.

Embodiment 13

According to the present invention in the application, a memory composing a memory portion may be any one of an SRAM, a DRAM, or an EEPROM. In this embodiment, the case where the EEPROM is used as the memory portion will be described.

The EEPROM is a nonvolatile memory and different from the SRAM and the DRAM. Thus, when the EEPROM is used as the memory portion of the present invention in the application, even if the power source is turned off, loss of the memory is not caused. Thus, a still image before the power source is turned off can be again displayed.

The EEPROM has a defect that write operation is late. However, the memory cell can be constructed by one memory transistor. As a result, the area of the memory cell can be decreased relatively to the SRAM and the DRAM and the memory having a large memory capacity can be realized.

The EEPROM is formed by the memory transistor. As a typical memory transistor, there is a memory transistor having a floating gate electrode. In this case, in a manufacturing process, by addition of a step of forming the floating gate electrode, the EEPROM can be integrally formed with the pixel portion and the driver circuits for the pixel portion.

The EEPROMs are classified in a full functional EEPROM capable of performing operation every one bit and a flash memory for performing delete operation every block. The flash memories are further classified in several kinds of memories such as a NOR type and a NAND type. Since the memory cell is composed of two memory transistors, the full functional EEPROM is not suitable to increase in capacity but has a high function. On the other hand, since the memory cell is composed of one memory transistor, a high integration density in the flash memory can be realized. Of course, in the present invention in the application, when the EEPROM is used as the memory portion, any known EEPROMs including the above EEPROM may be used.

FIG. 19 is a circuit view of a memory cell of a NOR type flash memory as one example of the EEPROM. In FIG. 19, the memory cell is composed of one memory transistor 1901. The control gate electrode of the memory transistor is connected with a word line W and one of the source and the drain regions is connected with a bit line B. A potential V0 is provided for the other of the source and drain regions. The memory transistor 1901 may be an n-channel or a p-channel. In this embodiment, it is made to be the n-channel.

The EEPROM stores one bit information in accordance with the presence of charge in the floating gate electrode of the memory transistor composing the memory cell. Hereinafter, basic write, readout, and delete operations will be described.

When data is written into the memory transistor 1901, the potential V0 is made to be GND and a positive high voltage (for example 20 V) is applied to the bit line B and the word line W, respectively. As a result, a hot electron produced by impact ionization is injected into the floating gate electrode and the write is performed. A threshold voltage of the memory transistor is changed depending on the amount of charge stored in the floating gate electrode.

When the data memorized in the memory transistor 1901 is read out, the potential V0 is made to be GND and a predetermined voltage (described later) is applied to the word line W. Then, the data stored in the memory cell is read out from the bit line B in accordance with the threshold voltages in the case where the charge is stored in the floating gate electrode of the memory transistor 1901 and in the case where the charge is not stored therein.

Note that the predetermined voltage may be set to be a value between a threshold voltage in a deleted state (state that an electron is not stored in the floating gate electrode) and a threshold in a written state (state that an electron is stored in the floating gate electrode). For example, when a memory TFT with a deleted state has a threshold voltage of 0.5 V to 3.5 V and a memory TFT with a written state has a threshold voltage of 6.5 V or higher, for example, 5 V can be used as the predetermined voltage.

Finally, when the deletion in the memory transistor 1901 is performed, the potential V0 and the word line W are fallen in GND. Then, when a positive high voltage (for example, 20 V) is applied to the bit line B, in the memory transistor 1901, an electron stored in the floating gate electrode is injected into the drain region by a tunnel current and thus the memorized data is deleted.

Note that this embodiment may be combined with any structure of Embodiments 1 to 10.

Embodiment 14

According to the present invention in the application, a memory portion may be composed of a plurality of memories. In this embodiment, a semiconductor display device in which the memory portion is composed of an SRAM and a flash memory will be described.

The SRAM can perform high speed data write as compared with a DRAM and an EEPRAM. On the other hand, the flash memory can realize a high integration scale as compared with the SRAM and the DRAM. In this embodiment, characteristics of such memories are used and thus the SRAM is used as a cache memory and flash memory is used as a main memory.

FIG. 20 is a block diagram of a semiconductor display device of this embodiment. In a semiconductor display device 2001 of this embodiment, a memory portion 2009 composed of flash memory 2004 and an SRAM 2003, a pixel portion 2007, a scanning line side driver circuit 2006, a data line side driver circuit 2005, and a memory control circuit 2002 are provided. Also, an image signal, various control signals, and the like are transmitted through a FPC (flexible printed circuit) 2008.

In this embodiment, the memory control circuit 2002 controls operations for storing and reading out image data into and from the SRAM 2003 and the flash memory 2004. When the memory portion 2009 is controlled by a control circuit outside of the semiconductor display device 2001, the memory control circuit 2002 may be not provided.

The semiconductor device 2001 of this embodiment may be a mode in which the memory portion 2009, the pixel portion 2007, the scanning line side driver circuit 2006, the data line side driver circuit 2005, and the memory control circuit 2002 are integrally formed on the same substrate. Alternatively, it may be a mode in which a stick driver in which the memory portion 2009, the data line side driver circuit 2005, and the memory control circuit 2002 are integrally formed and a stick driver including the scanning line side driver circuit 2006 are mounted on which the pixels are formed.

First, the case where an image is displayed will be described. In the semiconductor display device 2001 of this embodiment, an image signal and control signals, which are transmitted from the outside, are input to the memory control circuit 2002 through the FPC 2008. The image signal is firstly stored in the SRAM 2003, then again read out, and transferred to the data line side driver circuit 2005 and the flash memory 2004. The image signal is displayed in the pixel portion 2007 and stored in the flash memory 2004. Note that multibit simultaneous write is performed as a write method for the flash memory 2004 and thus it is preferable that the write speed is enhanced.

When a still image is displayed, only control signals are input to the memory control circuit 2002 through the FPC 2008 from the outside of the semiconductor display device 2001. Then, image data stored in the flash memory is displayed in the pixel portion in accordance with control signals output from the memory control circuit 2002.

Thus, when the SRAM is used as the cache memory, even in the flash memory in which the write speed is late, the storage of image data can be performed. Also, when the flash memory having a high integration scale is used as the main memory, a large number of image data can be stored as compared with the case where the SRAM or the DRAM is used.

For example, the SRAM may be set to be 1 kbit to 1 Mbit and the flash memory may be set to be 1 Mbit to 10 Gbit. In particular, when a flash memory having a large capacity is provided, a moving image with a short time can be also displayed using the image data stored in the memory portion.

Note that the structure of this embodiment can be embodied by being freely combined with any structure of Embodiments 1 to 13.

Embodiment 15

In this embodiment, driver circuits for a pixel portion according to the present invention in the application will be described.

FIG. 21 shows one example of a circuit structure of a scanning line side driver circuit. In FIG. 21, a shift register circuit 2101, a level shifter circuit 2102, and a buffer circuit 2103 are provided in the scanning line side driver circuit from a signal input side. Although the shift register circuit 2101 is operated with a power source voltage of 3 to 5 V, the buffer circuit 2103 is operated with a voltage capable of driving a switching TFT composing a pixel. For example, about 16 V in an active matrix liquid crystal display device using polysilicon films, about 20 to 30 V in an active matrix liquid crystal display device using amorphous silicon films, and about 10 V in an active matrix EL display device using polysilicon films are required.

Therefore, it is necessary to improve a withstanding voltage of TFTs in circuits subsequent to the level shifter circuit 2102. Concretely, it is preferable that a channel length is set to be 5 μm or longer and a structure in which an LDD region overlapped with a gate electrode is provided is used. Also, it is desirable that a gate insulating film is formed at a thickness of 100 to 200 nm. In addition, in order to improve the withstanding voltage of the TFTs, a multi gate structure in which a plurality of gate electrodes are provided may be used.

Figure 22:
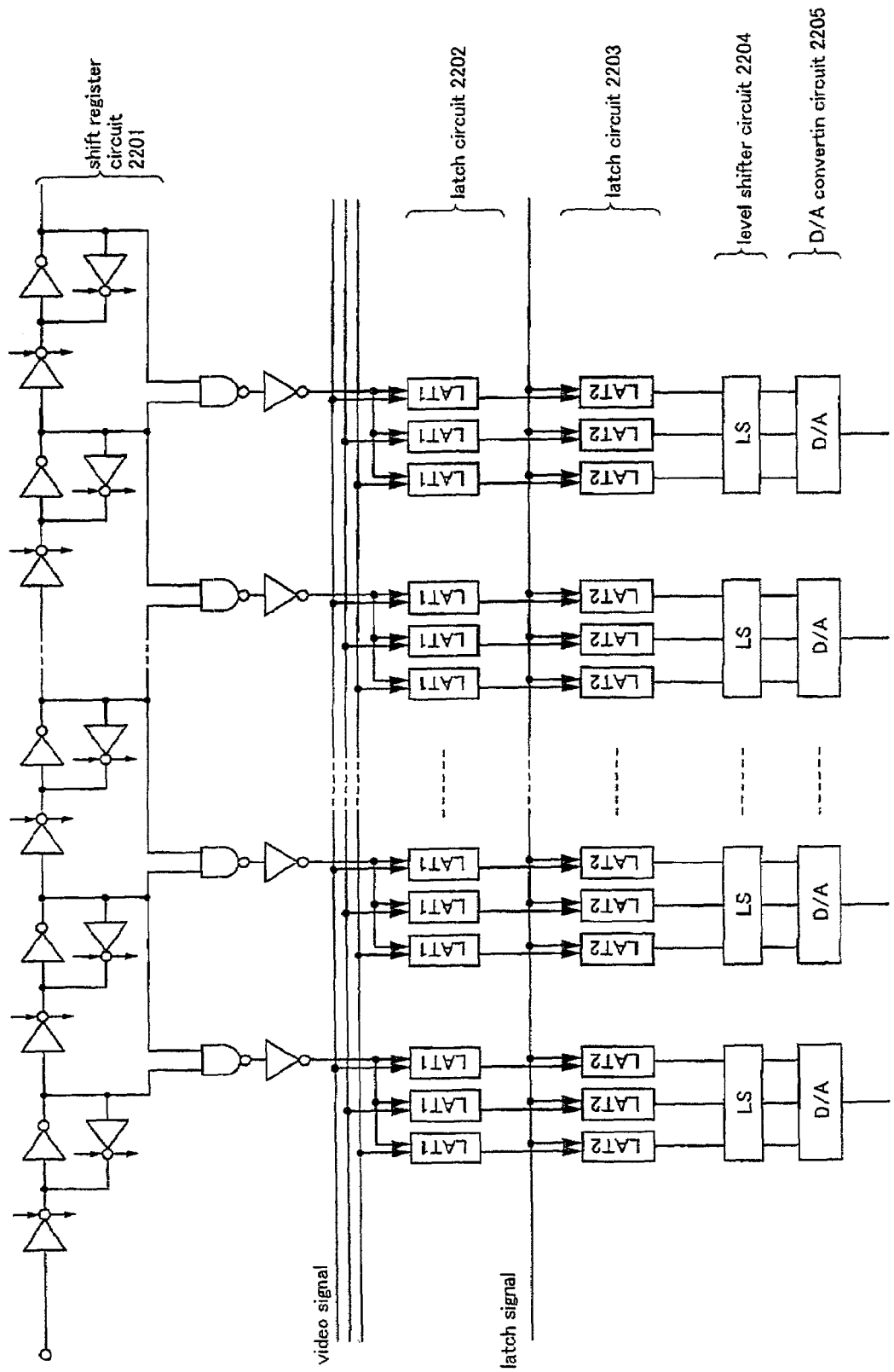
FIG. 22 A view showing a structure of a data line side driver circuit.

On the other hand, FIG. 22 shows one example of a circuit structure of a data line side driver circuit. In FIG. 22, a shift register circuit 2201, latch circuits 2202 and 2203, a level shifter circuit 2204, and a D/A converting circuit 2205 are provided in the data line side driver circuit from a signal input side. In this embodiment, a digital signal having 3 bits is input and an image signal converted into an analog signal by the D/A converting circuit 2205 is output. Although the shift register circuit 2201 and the latch circuits 2202 and 2203 are operated with 3 to 5 V, the D/A converting circuit 2205 is preferably operated with a driver voltage suitable for each semiconductor display device. For example, 10 to 15 V in an active matrix liquid crystal display device and about 10 V in an active matrix EL display device may be operated driving.

With respect to the data line side driver circuit, it is unnecessary to largely consider a withstanding voltage in circuits subsequent to the level shifter circuit 2204. However, high speed operation with 10 MHz or higher is required. In order to realize the high speed operation, it is desirable that a channel length is set to be 0.5 to 5 μm and a thickness of a gate insulating film is set to be 40 to 100 nm, preferably 75 nm. Also, it is preferable that an LDD region overlapped with a gate electrode is formed at a length of 0.5 to 1 μm and thus it is preferable that the influence of a parasitic capacitance is minimized.

Note that this embodiment can be embodied by being combined with Embodiments 1 to 14.

Embodiment 16

In this embodiment, a method of manufacturing the semiconductor device according to the present invention in the application on a substrate having an insulating surface will be described. The present invention in the application includes an active matrix display device (EL display device or liquid crystal display device) in which a pixel portion, driver circuits for the pixel portion, and a memory portion are integrally formed on the same substrate, a passive matrix display device (EL display device or liquid crystal display device) and the like. However, in this embodiment, a method of simultaneously manufacturing a pixel portion of the active matrix EL display device, driver circuits for the pixel portion, and a memory portion composed of an SRAM on a substrate having an insulating surface will be described.

In order to make the description simple, a switching TFT (n-channel TFT) and an EL driving TFT (p-channel TFT), which is composing a pixel, as a representative of the pixel portion, and a p-channel TFT and an n-channel TFT, which compose a CMOS circuit as representatives of the driver circuits for the pixel portion, a memory cell of the SRAM and its driver circuit, are simultaneously manufactured. Also, in this embodiment, steps after a pixel electrode in the pixel portion is manufactured are omitted. A known manufacturing method may be used for steps after a pixel electrode in the EL display device is manufactured.

Note that when it is based on this embodiment, a method of manufacturing another mode of the present invention in the application can be easily considered. For example, although the pixel in the liquid crystal display device is composed of a switching TFT, this switching TFT can be formed by the same manufacturing steps as the switching TFT composing the pixel in the EL display device. Also, a stick driver using a substrate having an insulating surface can be manufactured by the manufacturing steps except for the pixel portion in this embodiment. Note that as to a method of manufacturing a memory TFT composing a memory cell of a flash memory, Embodiment 17 can be referred to.

First, as shown in FIG. 23(A), a base film 5002 made from an insulating film such as a silicon oxide film, a silicon nitride film, or a silicon oxynitride film is formed on a substrate 5001 made of glass such as barium borosilicate glass which represents #7059 glass, #1737 glass, or the like, produced by Corning Inc. or aluminoborosilicate glass. For example, a silicon oxynitride film 5002a made of $SiH_4$, $NH_3$, and $N_2O$ is formed at 10 to 200 nm (preferably 50 to 100 nm) by a plasma CVD method, and similarly a silicon hydroxynitride film 5002b made of $SiH_4$ and $N_2O$ is laminated at a thickness of 50 to 200 nm (preferably 100 to 150 nm). In this embodiment, the base film 5002 is indicated as a two-layers structure. However, a single layer film of the above insulating film or a structure in which at least two layers are laminated may be used.

Island-like semiconductor layers 5003 to 5006 are formed of crystalline semiconductor films obtained by crystallizing semiconductor films having amorphous structures with a laser crystallization method or a known thermal crystallization method. The island-like semiconductor layers, 5003 to 5006 are formed at a thickness of 25 to 80 nm (preferably 30 to 60 nm). Although a material of the crystalline semiconductor film is not limited, it is preferably formed with silicon, a silicon germanium (SiGe) alloy, or the like.

When the crystalline semiconductor film is formed with the laser crystallization method, pulse oscillation type or continuous light emission type excimer laser, YAG laser, or YVO$_4$ laser is used. In the case where those lasers are used, a method of irradiating the semiconductor film with laser light which is radiated from a laser oscillator and condensed in a linear form by an optical system is preferably used. A crystallization condition is suitably selected by an operator. However, in the case where the excimer laser is used, a pulse oscillation frequency is set to be 30 Hz and a laser energy density is set to be 100 to 400 mJ/cm$^2$ (typically 200 to 300 mJ/cm$^2$). Also, in the case where the YAG laser is used, it is preferable that a pulse oscillation frequency is set to be 1 to 10 kHz using the second harmonic, and a laser energy density is set to be 300 to 600 mJ/cm$^2$ (typically 350 to 500 mJ/cm$^2$). Then, the entire surface of the substrate is irradiated with laser light which is condensed in a linear form with a width of 100 to 1000 μm, for example, 400 μm. At this time, an overlap ratio of linear formed laser light is set to be 80 to 98%.

A gate insulating film 5007 is formed using an insulating film including silicon at a thickness of 40 to 150 nm by a plasma CVD method or a sputtering method. In this embodiment, it is formed using a silicon oxynitride film at a thickness of 120 nm. Of course, the gate insulating film is not limited to such silicon oxynitride film, and insulating film including another silicon may be used as a single layer or a laminate structure. For example, in the case where a silicon oxide film is used, TEOS (tetraethyl orthosilicate) and O$_2$ are mixed and discharge can be produced with a reaction pressure of 40 Pa, a substrate temperature of 300 to 400° C., a high frequency (13.56 MHz), and a power density of 0.5 to 0.8 W/cm$^2$ and formed by a plasma CVD method. When thermal-annealed at 400 to 500° C., the thus formed silicon oxide film can obtain a satisfactory characteristic for the gate insulating film.

Then, a first conductive film 5008 and a second conductive film 5009 for forming a gate electrode (two-layers structure in this embodiment) are formed on the gate insulating film 5007. The first conductive film 5008 is formed using Ta at a thickness of 50 to 100 nm and the second conductive film 5009 is formed using W at a thickness of 100 to 300 nm.

A Ta film is formed by a sputtering method using Ta as a target. In this case, when a proper amount of Xe or Kr is added to Ar, internal stress in the Ta film is relaxed and peeling of the film can be prevented. Also, a resistivity of the Ta film of α phase is about 20 μΩcm and it can be used as a gate electrode. However, a resistivity of the Ta film of β phase is about 180 μΩcm and it is not suitable for the gate electrode. When tantalum nitride having a crystalline structure near to the α phase in Ta is formed as a base of Ta at a thickness of about 10 to 50 nm, the Ta film of α phase can be easily obtained.

A W film is formed by a sputtering method using W as a target. In addition, it can be also formed by a thermal CVD method using tungsten hexafluoride (WF$_6$). Even in any case, in order to use it as a gate electrode, a low resistance is required. With respect to the W film, when crystal grain is enlarged, the resistivity can be lowered. However, when the amount of impurity element such as oxygen in W is large, crystallization is suppressed and resistance is increased. A W target having a purity of 99.9999% is used as a target of W. Further, the W film is formed with sufficient consideration so that an impurity is not entered from gas phase at film formation. Thus, the resistivity of 9 to 20 μΩcm can be realized.

Note that in this embodiment, the first conductive film 5008 is Ta and the second conductive film 5009 is W. However, the present invention is not limited to these materials, and an element selected from Ta, W, Ti, Mo, Al, and Cu, or an alloy material or a compound material, which includes mainly the above element can also be used. Also, a semiconductor film represented by a polycrystalline silicon film in which an impurity element such as phosphorus is doped may be used. As preferable examples of another combination except for this embodiment, there are a combination in which the first conductive film is formed using tantalum nitride (TaN) and the second conductive film is formed using W, a combination in which the first conductive film is formed using tantalum nitride (TaN) and the second conductive film is formed using Al, and a combination in which the first conductive film is formed using tantalum nitride (TaN) and the second conductive film is formed using Cu.

Next, as shown in FIG. 23(B), a mask 5010 by a resist is formed and first etching processing is performed. The etching method is not limited, but in this embodiment, an ICP (inductively coupled plasma) etching method is used. CF$_4$ and Cl$_2$ are mixed with an etching gas, and RF power having 500 W and 13.56 MHz is supplied to a coil-shaped electrode at a pressure of 1 Pa to produce plasma. Also, RF power having 100 W and 13.56 MHz is supplied to a substrate side (sample stage) to apply a substantially negative self bias voltage. When CF$_4$ and Cl$_2$ are mixed, both the W film and Ta film are etched to the same degree.

In the first etching processing, first conductive layers and second conductive layers are processed such that these end portions become taper shapes. An angle of taper portions is set to be 15 to 45°. In order to perform etching without leaving the residue on the gate insulating film, an etching time is preferably increased at a ratio of about 10 to 20%. Since a selection ratio of the silicon oxynitride film to the W film is 2 to 4 (typically 3), an exposed surface of the silicon oxynitride film is etched at about 20 to 50 nm by overetching processing. Thus, first shaped conductive layers 5011 to 5015 made from the first conductive layers and the second conductive layers (first conductive layers 5011a to 5015a and second conductive layers 5011b to 5015b) are formed by the first etching processing. Note that in the gate insulating film, regions which are not covered with the first shaped conductive layers 5011 to 5015 are etched at about 20 to 50 nm and become thin.

Next, first doping processing is performed to add an impurity element imparting an n-type. As the doping method, an ion doping method or an ion implantation method is preferably used. As a condition of the ion doping method, a dose is set to be 1×10$^{13}$ to 5×10$^{14}$ atoms/cm$^2$ and an accelerating voltage is set tot be 60 to 100 keV. In this case, the conductive layers 5011 to 5015 become masks against the impurity element imparting an n-type and thus first impurity regions 5017 to 5025 are formed in a self-aligning manner. As the impurity element imparting an n-type, an element that belongs to group 15, typically, phosphorus (P) or arsenic (As) is preferably used. The impurity element imparting an n-type (phosphorus (P) in this embodiment) is added to the first impurity regions 5017 to 5025 at a concentration range of 1×10$^{20}$ to 1×10$^{21}$ atoms/cm$^3$.

Next, second etching processing is performed. In this embodiment, CF$_4$, Cl$_2$, and O$_2$ are used as an etching gas and etching by an ICP apparatus is performed. In the second etching process, the W film is selectively etched such that the conductive layers become second shaped conductive layers 5026 to 5030 shown in FIG. 23(C) (first conductive layers 5026*a* to 5030*a* and second conductive layers 5026*b* to 5030*b*). At this time, in the gate insulating film, regions which are not covered with the second shaped conductive layers 5026 to 5030 are further etched at about 20 to 50 nm and become thin.

Then, second doping processing is performed as shown in FIG. 24(A). In this case, with a condition in which a dose is low and an accelerating voltage is high as compared with the first doping processing, an impurity element imparting an n-type is doped. For example, an accelerating voltage is set to be 70 to 120 keV and it is performed at a dose of $1 \times 10^{13}$ atoms/cm$^2$ to form new impurity regions inside the first impurity regions formed in the island-like semiconductor layers as shown in FIG. 23(B). The second shaped conductive layers 5026 to 5030 are used as masks against an impurity element and doping is performed such that the impurity element is also added to regions under the first conductive layers 5026*a* to 5030*a*. Thus, the second impurity regions 5032 to 5036 are formed. The concentration of phosphorus (P) added to the second impurity regions 5032 to 5036 has a gentle concentration gradient in accordance with a film thickness of taper portions of the first conductive layers 5026*a* to 5030*a*. However, the concentration becomes substantially the same degree.

As shown in FIG. 24(B), third etching processing is performed. CHF$_6$ is used as an etching gas and etching is performed by using a reactive ion etching method (RIE method). By the third etching processing, the taper portions of the first conductive layers 5026*a* to 5030*a* are partially etched to shorten regions in which the first conductive layers are overlapped with the semiconductor layers. Third shaped conductive layers 5037 to 5041 (first conductive layers 5037*a* to 5041*a* and second conductive layers 5037*b* to 5041*b*) are formed by the third etching processing. At this time, in the gate insulating film, regions which are not covered with the third shaped conductive layers 5037 to 5041 are further etched at about 20 to 50 nm and become thin.

By the third etching processing, third impurity regions 5032*a* to 5036*a* overlapped with the first conductive layers 5037*a* to 5041*a* and fourth impurity regions 5032*b* to 5036*b* between the first impurity regions and the third impurity regions are formed.

Then, as shown in FIG. 24(C), fifth impurity regions 5052 to 5063 having a conductivity type inverse to a first conductivity type are formed in the island-like semiconductor layers 5004 and 5006 forming a p-channel TFT. The second conductive layers 5038*b* and 5041*b* are used as masks against the impurity element and the impurity regions are formed in a self-alignment manner. At this time, the entire surface of the island-like semiconductor layers 5003 and 5005 forming an n-channel TFT are covered with a resist mask 5200. Phosphorus is added to the impurity regions 5052 to 5063 with different concentrations. The impurity regions are formed by an ion doping method using diborane (B$_2$H$_6$) and an impurity concentration in any region is set to be $2 \times 10^{20}$ to $2 \times 10^{21}$ atoms/cm$^3$.

By the above steps, the impurity regions are formed in the respective island-like semiconductor layers. The third shaped conductive layers 5037 to 5041 overlapped with the island-like semiconductor layers function as gate electrodes.

After the resist mask 5200 is removed, for the purpose of conductivity type control, a step of activating the impurity element added to the respective island-like semiconductor layers is performed. This step is performed by a thermal anneal method using a furnace anneal furnace. In addition, a laser anneal method or a rapid thermal anneal method (RTA method) can be applied. The thermal anneal method is preferably performed in a nitrogen atmosphere at an oxygen concentration of 1 ppm or lower, preferably 0.1 ppm or lower and 400 to 700° C., typically 500 to 600° C. In this embodiment, thermal treatment is performed at 500° C. for 4 hours. Note that, when wiring materials used for the third shaped conductive layers 5037 to 5041 is sensitive to heat, it is preferable that activation is performed after an interlayer insulating film (including mainly silicon) is formed for protecting wirings and the like.

Further, thermal treatment is performed in an atmosphere containing hydrogen at 3 to 100% at 300 to 450° C. for 1 to 12 hours to perform a step of hydrogenating the island-like semiconductor layers. This step is a step of terminating dangling bonds of the semiconductor layers by thermally excited hydrogen. As another means for hydrogenation, plasma hydrogenation (hydrogen excited by plasma is used) may be performed.

Figure 25:
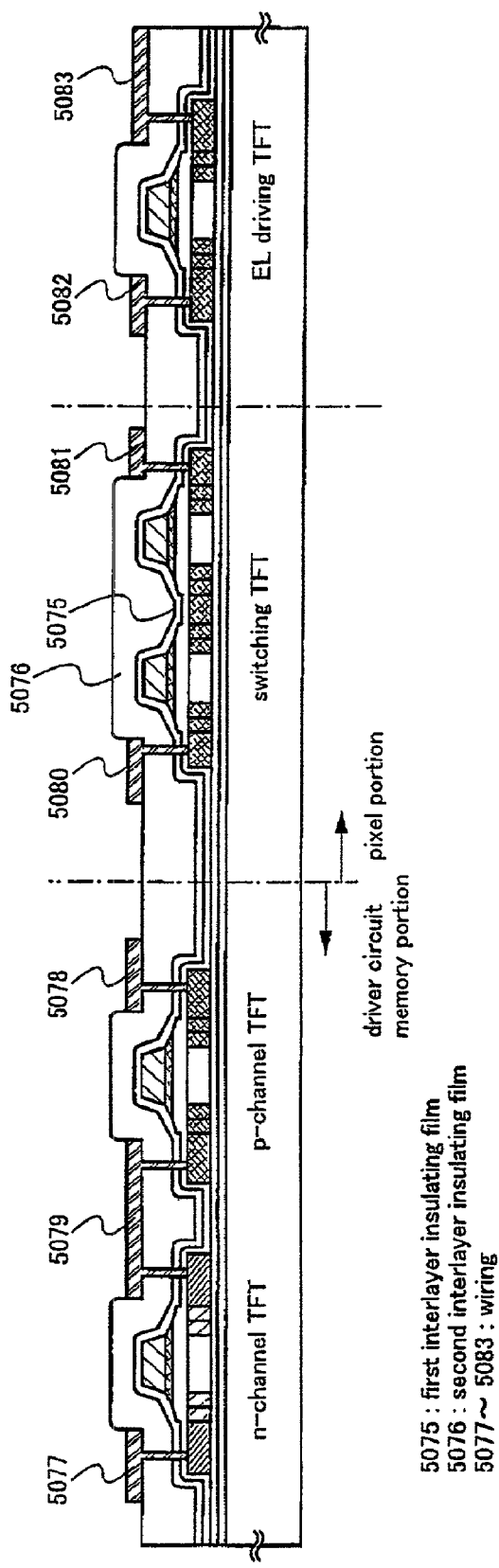
FIG. 25 A view showing manufacturing steps of the semiconductor device according to the present invention in the application.

Next, as shown in FIG. 25, a first interlayer insulating film 5075 is formed using a silicon oxynitride film at a thickness of 100 to 200 nm and a second interlayer insulating film 5076 made of an organic insulator material is formed thereon. After that, contact holes are formed in the first interlayer insulating film 5075, the second interlayer insulating film 5076, and the gate insulating film 5007 and respective wirings (including connection wirings and signal lines) 5077 to 5083 are formed by patterning. The wirings are formed using a Ti film having 50 to 200 nm, an Al film having 100 to 300 nm, and a tin (Sn) film or a Ti film having 50 to 200 nm. With respect to the wirings 5077 to 5083 formed with such a structure, the Ti film to be formed first is in contact with the semiconductor layers and a heat resistance in a contact portion is improved.

By the above steps, the pixel portion immediately before the pixel electrode shown in FIG. 24(A) is formed, the driver circuits for the pixel portion, and the memory portion can be simultaneously manufactured on the substrate having the insulating surface.

In the case of this embodiment, an active layer of the n-channel TFT includes a source region, a drain region, LDD regions (Lov regions) which are overlapped with the gate electrode with a state that the gate insulating film is sandwiched therebetween, LDD regions (Loff regions) which are not overlapped with the gate electrode with a state that the gate insulating film is sandwiched therebetween, and a channel forming region. Thus, when the Lov regions are provided, the deterioration of the TFT by a hot carrier effect can be prevented. Even if a high voltage of 10 V or higher is applied, extremely stable operation can be obtained. Also, when the Loff regions are provided, an off current can be suppressed to low. In particular, in scanning line side driver circuit for driving the pixel portion formed by amorphous silicon layers, a power source voltage of 20 to 30 V is used. Thus, such a structure is essential.

Also, according to the steps described in this embodiment, the number of photo masks required for manufacturing the TFT can be suppressed to 5 items. Concretely, there are a mask for dividing the semiconductor layer into island shapes, a mask for forming the gate electrode, a doping mask, a mask for forming the contact holes, and a mask for forming wirings. As a result, the step is shortened and the reduction of a manufacturing cost and the improvement of a yield can be provided.

Note that this embodiment can be embodied by being combined with Embodiments 1 to 15.

Embodiment 17

In this embodiment, a method of manufacturing the semiconductor device according to the present invention in the application, which is a manufacturing method different from Embodiment 16 will be described. In this embodiment, a method of simultaneously manufacturing a pixel portion of the active matrix liquid crystal display device, driver circuits for the pixel portion, and a memory portion composed of a flash memory on a substrate having an insulating surface will be described.

In order to make the description simple, a switching TFT composing a pixel as a representative of the pixel portion, a p-channel TFT and an n-channel TFT, which compose a CMOS circuit as representatives of the driver circuits for the pixel portion and the driver circuit for the memory portion, and a memory TFT composing a memory cell of the flash memory, are simultaneously manufactured. Also, in this embodiment, steps after a pixel electrode in the pixel portion is manufactured are omitted. A known manufacturing method may be used for steps after a pixel electrode in the liquid crystal display device is manufactured.

Note that this embodiment can be applied to a method of manufacturing another mode of the present invention in the application. For example, a switching TFT and an EL driving TFT, which compose a pixel of an EL display device can use the same manufacturing steps as the switching TFT composing the pixel of the liquid crystal display device. Also, a stick driver using a substrate having an insulating surface can be manufactured by the manufacturing steps except for the pixel portion in this embodiment. Further, since the SRAM is composed of the CMOS circuit, the manufacturing steps for the driver circuits of this embodiment can be used.

In FIG. 26(A), a substrate 2601, a base film 2602 (2602a and 2602b), and island-like semiconductor layers 2603 to 2606 are similar to Embodiment 16 and thus the descriptions are omitted here. Note that, in order to control the threshold voltage (Vth) of the n-channel TFT, an impurity element imparting a p-type may be added to the semiconductor layers 2604 to 2606 at a concentration of about $1 \times 10^{16}$ to $5 \times 10^{17}$ atoms/cm$^3$.

A first gate insulating film 2608 is formed using an insulating film including silicon at film thickness of 40 to 200 nm by a plasma CVD method or a sputtering method. For example, a silicon oxynitride film having a thickness of 75 nm is preferably formed. Note that a thickness of the first gate insulating film composing the memory TFT may be set to be 10 to 50 nm and a thickness of the first gate insulating film composing another element may be set to be 50 to 250 nm. The gate insulating film is not limited to such a silicon oxynitride film, and insulating film including another silicon may be used as a single layer or a laminate structure.

Next, in order to form LDD regions (Lov regions) of the n-channel TFT, resist masks 2609 and 2610 are formed and then the impurity element imparting the n-type is selectively added to the semiconductor layer 2604. Doping is performed by an ion doping method using phosphine (PH$_3$) as a typical method. An impurity region to be formed is defined as a low concentration n-type impurity region 2607. A phosphorus (P) concentration in this region is set to be a range of $2 \times 10^{16}$ to $5 \times 10^{19}$ atoms/cm$^3$.

After the resist masks 2609 and 2610 are removed, in order to form an overlap region of the memory TFT, a resist mask 2611 is formed and then the impurity element imparting the n-type is selectively added to the semiconductor layer 2606 (FIG. 26(B)). A dose is controlled such that an n-type impurity region 2612 formed by this step includes the n-type impurity element at a concentration of $1 \times 10^{20}$ to $1 \times 10^{21}$ atoms/cm$^3$ (typically $2 \times 10^{20}$ to $5 \times 10^{20}$ atoms/cm$^3$). As the n-type impurity element, arsenic (As) may be used in addition to phosphorus (P). In this embodiment, phosphorus (P) is used.

After that, the resist mask 2611 is removed and processing for activating the added impurity element is performed. The activation processing is easy if the laser anneal method is used. As one example of its condition, a laser pulse oscillation frequency is set to be 1 kHz and a laser energy density is set to be 100 to 300 mJ/cm$^2$ (typically 150 to 250 mJ/cm$^2$). Then, the entire surface of the substrate is irradiated with a linear beam. At this time, an overlap ratio of linear beam is set to be 80 to 99% (preferably 95 to 99%). As a laser oscillator used in the laser anneal method, an excimer laser as a gas laser, a YGA laser, a YV0$_4$ laser, a YAlO$_3$ laser, a YLF laser, or the like as a solid laser can be used. In the case of the solid laser such as the YAG laser, the second harmonic (532 nm) or the third harmonic (355 nm) can be used in addition to the fundamental wave (1064 nm). Thus, when the activation processing is performed, a junction between the channel forming region and the overlap region and a junction between the channel forming region and the low concentration n-type impurity region can be made preferable.

Next, as shown in FIG. 26(C), gate electrodes 2613 to 2616 and a floating gate electrode 2617 are formed on the first gate insulating film 2608. The gate electrodes 2613 to 2616 and the floating gate electrode 2617 are preferably formed using an element selected from tantalum (Ta), titanium (Ti), molybdenum (Mo), and tungsten (W), an alloy containing mainly the element, an alloy film in which the elements are combined (typically, Mo—W alloy film or Mo-Ta alloy film), or a silicon film for which a conductivity is provided. Under the conductive layer made of such a material, nitride such as tantalum nitride (TaN), tungsten nitride (WN), titanium nitride (TiN) film, or molybdenum nitride (MoN), or silicide such as tungsten silicide, titanium silicide, or molybdenum silicide, may be formed. The gate electrodes are formed at a thickness of 200 to 400 nm (preferably 250 to 350 nm).

The floating gate electrode 2617 of the memory TFT is formed to partially overlap the n-type impurity region 2612. The overlapped region is called an overlap region and becomes a region to flow a tunnel current at deletion in the memory TFT. Also, the gate electrode 2614 is formed to partially overlap the low concentration n-type impurity region 2607.

After that, n-type impurity elements (phosphorus in this embodiment) 2618 to 2626 are added in a self-alignment manner using the gate electrodes 522 to 524 as masks to form low concentration n-type impurity regions. The low concentration n-type impurity regions are controlled such that a phosphorus concentration becomes $1 \times 10^{17}$ to $1 \times 10^{19}$ atoms/cm$^3$.

Then, as shown in FIG. 26(D), high concentration n-type impurity regions which function the source region or the drain region in the n-channel TFT are formed. First, resist masks 2638 to 2640 are formed and then the impurity element imparting the n-type is added to form high concentration n-type impurity regions 2631 to 2637. Phosphorus (P) is used as the impurity element imparting the n-type and an ion doping method using phosphine (PH$_3$) is performed such that the concentration becomes a range of $1 \times 10^{20}$ to $1 \times 10^{21}$ atoms/cm$^3$.

Then, as shown in FIG. 26(E), high concentration p-type impurity regions 2641 and 2642 composing the source region and the drain region are formed in the semiconductor layer 2603 which the p-channel TFT is formed. An ion doping method using diborane ($B_2H_6$) is performed using the gate electrode 2613 as a mask to form high concentration p-type impurity regions in a self-aligning manner. At this time, the entire surface of the semiconductor films 2604 to 2606 composing the n-channel TFTs is covered with a resist mask 2643. A boron (B) concentration in this region is set to $3\times10^{20}$ to $3\times10^{21}$ atoms/cm$^3$.

A second gate insulating film 2751 is formed using an insulating film including silicon at a film thickness of 40 to 200 nm by a plasma CVD method or a sputtering method. For example, a silicon oxynitride film having a thickness of 75 nm is preferably formed. The second gate insulating film is not limited to such a silicon oxynitride film, and insulating film including another silicon may be use as a single layer or a laminate structure.

After that, the n-type or the p-type impurity element added at respective concentrations is activated. As activation means, a furnace anneal, a laser anneal, a lump anneal, or a method by a combination of them is preferably used. A thermal annealing method is performed in a nitrogen atmosphere at an oxygen concentration of 1 ppm or lower, preferably 0.1 ppm or lower at 400 to 700° C., typically 500 to 600° C. Typically, thermal treatment is performed at 550° C. for 4 hours.

Figure 27A:
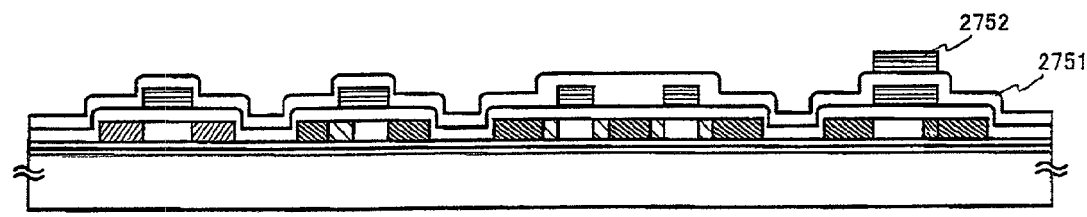
FIGS. 27(A) and 27(B) Views showing manufacturing steps of the semiconductor device according to the present invention in the application.

Next, a conductive film having 200 to 400 nm is formed and patterned to form a control gate electrode 2752 (FIG. 27(A)). The control gate electrode 2752 is formed so as to partially or entirely overlap with the floating gate electrode 2617 through the second gate insulating film 2751. Note that the control gate electrode 2752 is preferably formed using an element selected from tantalum (Ta), titanium (Ti), molybdenum (Mo), and tungsten (W), an alloy containing mainly the element, an alloy film in which the elements are combined (typically, Mo—W alloy film or Mo—Ta alloy film), or a silicon film for which a conductivity is provided. Under the conductive layer made of such a material, nitride such as tantalum nitride (TaN), tungsten nitride (WN), titanium nitride (TiN) film, or molybdenum nitride (MoN), or silicide such as tungsten silicide, titanium silicide, or molybdenum silicide, may be formed. The gate electrodes are formed at a thickness of 200 to 400 nm (preferably 250 to 350 nm).

Figure 27B:
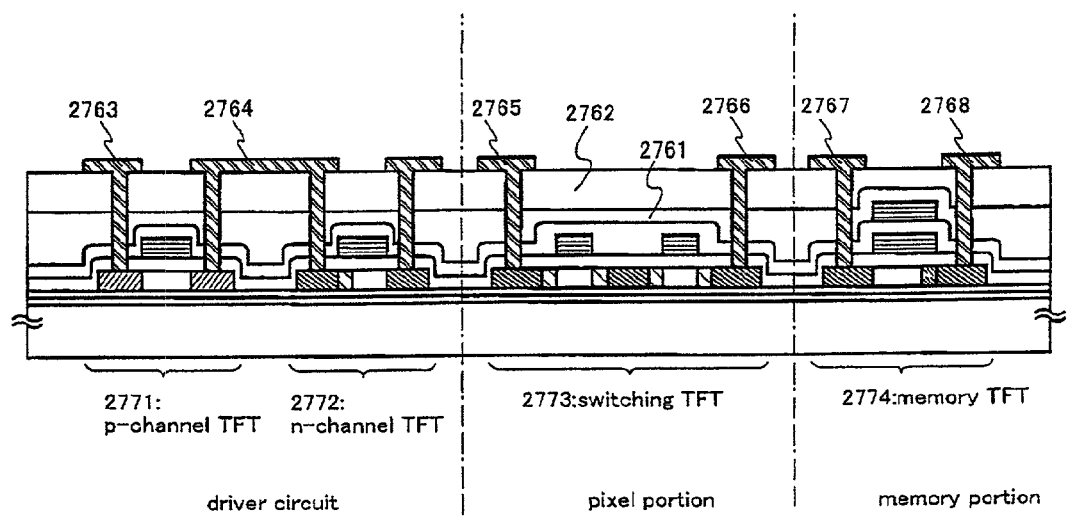

After that, as shown in FIG. 27(B), a first interlayer insulating film 2761 is formed from the above of the control gate electrode and the second gate insulating film. The first interlayer insulating film 2761 is formed using a silicon oxide film, a silicon oxynitride film, a silicon nitride film, or a laminate film in which these are combined at a thickness of 100 to 200 nm. For example, in the case where a silicon oxide film is used, TEOS (tetraethyl orthosilicate) and $O_2$ are mixed and discharge is produced with a reaction pressure of 40 Pa, a substrate temperature of 300 to 400° C., a high frequency (13.56 MHz), and a power density of 0.5 to 0.8 W/cm$^2$ to form by a plasma CVD method. In the case where a silicon oxynitride film is used, it is preferably formed using a silicon oxynitride film manufactured from $SiH_4$, $N_2O$, and $NH_3$ or a silicon oxynitride film manufactured from $SiH_4$ and $N_2O$ by a plasma CVD method. With respect to a manufacturing condition in this case, it can be formed at a reaction pressure of 20 to 200 Pa, a substrate temperature of 300 to 400° C., a high frequency (60 MHz), and a power density of 0.1 to 1.0 W/cm$^2$. Also, a silicon hydroxynitride film manufactured from $SiH_4$, $N_2O$, and $H_2$ may be applied. Similarly, a silicon nitride film can be manufactured from $SiH_4$ and $NH_3$ by a plasma CVD method.

After the thermal treatment is performed, thermal treatment is further performed in an atmosphere containing hydrogen at 3 to 100% at 300 to 450° C. for 1 to 12 hours to perform a step of hydrogenating the island-like semiconductor films. This step is a step of terminating dangling bonds having $10^{16}$ to $10^{18}$/cm$^3$, which are present in the island-like semiconductor films by thermally excited hydrogen. As another means for hydrogenation, plasma hydrogenation (hydrogen excited by plasma is used) may be performed.

Then, the second interlayer insulating film 2762 made of an organic insulator material is formed at an average film thickness of 1.0 to 2.0 µm. As the organic resin material, polyimide, acrylic, polyamide, polyimideamide, BCB (benzocyclobutene) or the like can be used. Thus, when the interlayer insulating film is formed using the organic insulator material, the surface can be preferably leveled. Also, since the organic resin material has generally low permittivity, a parasitic capacitance can be reduced and this becomes very important element in the case where the TFT is operated at high speed. However, these organic insulator materials have hygroscopic property and are not suitable as a protective film. Thus, it is preferable to use by being combined with the silicon oxide film, the silicon oxynitride film, the silicon nitride film, or the like, which is formed as the first interlayer insulating film 2761.

After that, contact holes are formed in the first and second interlayer insulating films and source or drain wirings 2763 to 2768 are formed as in the case of Embodiment 16. The contact holes are formed by a dry etching method. A mixture gas of $CF_4$, $O_2$, and He is used as an etching gas. First, the interlayer insulating films made of the organic resin materials are etched. Subsequently, a protective insulating film 146 is etched using $CF_4$ and $O_2$ as etching gases. Further, in order to improve a selection ratio to the semiconductor layer, the etching gas is changed into $CHF_3$ and the gate insulating film is etched. Thus, the contact holes can be preferably formed. After wirings are formed, hydrogenation processing and sintering processing can be simultaneously performed at a temperature of about 300° C. and an electrical characteristic of a TFT can be improved.

Thus, the pixel portion immediately before the pixel electrode shown in FIG. 27(B) is formed, the driver circuits for the pixel portion, and the memory portion can be simultaneously manufactured on the substrate having the insulating surface.

In the case of this embodiment, a p-channel TFT 2771 has a single drain structure in which a channel forming region and a source or drain region made from the high concentration p-type impurity region are formed. An n-channel TFT 2772 has a channel forming region, LDD regions (Lov regions) which are overlapped with the gate electrode 613 and a source or drain region. Thus, when the Lov regions are provided, a high electric field produced near the drain region is relaxed and the generation of hot carrier is prevented. Thus, the characteristic deterioration of the TFT can be prevented. Note that the Lov region is formed in only the drain region side. When such a structure is used, the characteristic deterioration by a hot carrier effect is prevented, the parasitic capacitance is suppressed to minimize, and high speed operation is allowed. Further, end portions of the source and drain regions is substantially aligned with end portions of the gate electrode, and thus a resistance loss is decreased and current drive power can be improved. Thus, the TFT having a structure for reducing a hot carrier injection so as to minimize the decrease of an operational speed is suitable as a TFT composing the CMOS circuit composing the driver circuit portion.

A switching TFT 2773 has a double gate structure, and also has a channel forming region, LDD regions (Loff regions) which is not overlapped with the gate electrode, and source and drain regions. When the double gate structure is used and Loff regions are provided, an off current can be reduced. In the switching TFT composing the pixel in the liquid crystal display device, it is necessary to suppress the off current to a minimum. Thus, the TFT having such a structure is suitable as the switching TFT composing the pixel in the liquid crystal display device.

A memory TFT 2774 has a high concentration n-type impurity region (referred to as an overlap region) in one of the source and drain regions. The overlap region is a region to flow a tunnel current at deletion in the memory TFT.

Thus, according to the liquid crystal display device of this embodiment, TFTs having suitable structures are arranged in the pixel portion, the driver circuits, and the memory portion, respectively, and thus a semiconductor device having high reliability and a preferable operational characteristic can be manufactured.

Note that when the pixel portion of the EL display device is manufactured by this embodiment, the following TFT structures are preferably used. The switching TFT composing the pixel in the EL display device is the double gate structure and is the n-channel TFT having Loff regions in the source region and drain region. Also, the EL driving TFT composing the pixel in the EL display device is the TFT structure having Lov regions in the source region and the drain region. When such structures are used, the off current can be suppressed in the switching TFT and the characteristic deterioration by the hot carrier effect can be prevented in the EL driving TFT.

In addition, when a CMOS circuit such that a current bidirectionally flows in the channel forming region, that is, a CMOS circuit such that a role of the source region and a role of the drain region are exchanged is used in the driver circuits, it is preferable that LDD regions are formed to sandwich the channel forming region in both sides of channel forming region thereof in the n-channel TFT composing the CMOS circuit. As such an example, there are a transmission gate used for point sequential drive, and the like. Also, when a CMOS circuit in which minimum suppression of the off current is required is used in the driver circuits, it is preferable that the n-channel TFT composing the CMOS circuit has both Lov regions and Loff regions. As such an example, similarly, there are a transmission gate used for point sequential drive, and the like. The TFT having such a structure can be also manufactured by the manufacturing method of this embodiment.

Note that this embodiment can be implemented by being combined with Embodiments 1 to 15.

Embodiment 18

The semiconductor device of the present invention in the application can be applied to various electronic equipment. Given as such electronic equipment are a video camera, a digital camera, a projector (rear type or front type), a head mounted display, a goggle type display, a game machine, an automobile navigation system, a personal computer, a portable information terminal (mobile computer, cellular phone, electronic book or the like). One Example of those is shown in FIG. 28 and FIG. 29.

Figure 28A:
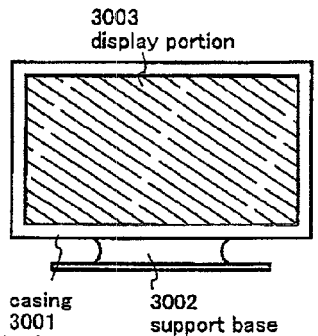
FIGS. 28(A) to 28(F) Views showing one example of an electronic equipment to which the present invention in the application is applied.

FIG. 28A is a display, which contains a casing 3001, a support base 3002, a display portion 3003, and the like. The active matrix or passive matrix liquid crystal display device or EL display device in the present invention can be applied to the display portion 3003.

Figure 28B:
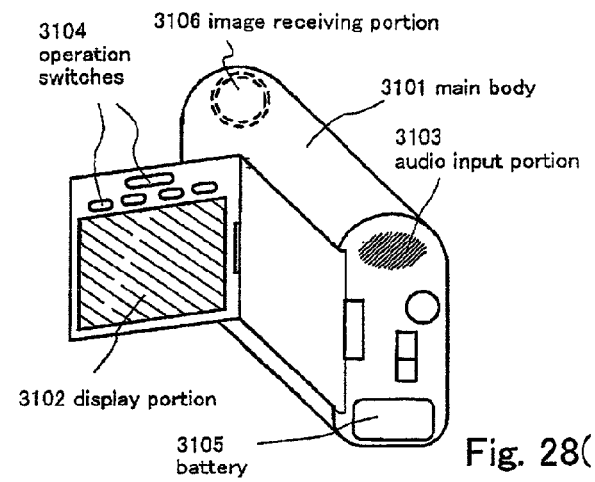

FIG. 28B is a video camera, which is composed of a main body 3101, a display portion 3102, an audio input portion 3103, operation switches 3104, a battery 3105, and an image receiving portion 3106. The active matrix or passive matrix liquid crystal display device or EL display device in the present invention can be applied to the display portion 3102.

Figure 28C:
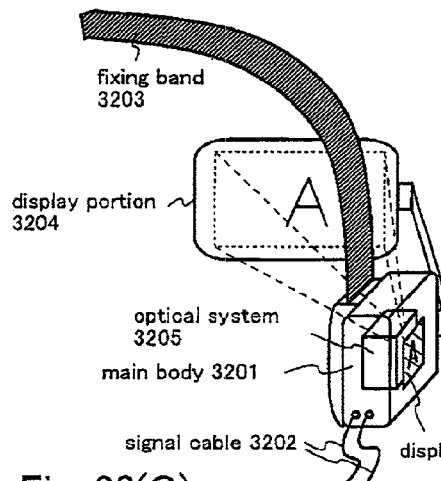

FIG. 28C is a part (right piece side) of a head mounted display, which contains a main body 3201, a signal cable 3202, a head portion fixing band 3203, a display portion 3204, an optical system 3205, a display device 3206, and the like. The active matrix or passive matrix liquid crystal display device or EL display device in the present invention can be applied to the display device 3206.

Figure 28D:
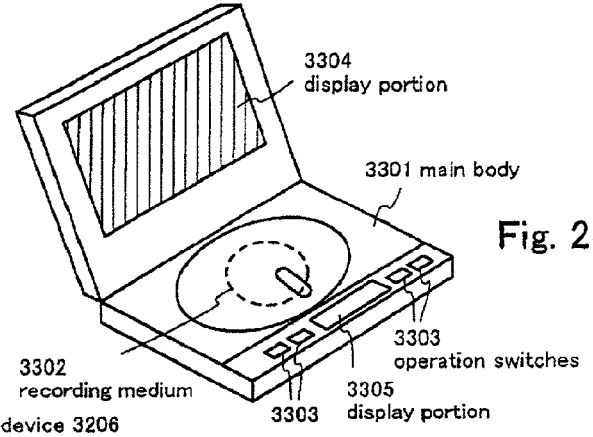

FIG. 28D is an image playback device provided with a recording medium (specifically, DVD playback device), which is composed of a main body 3301, a recording medium 3302, operation switches 3303, display portions 3304 and 3305, and the like. Note that this device uses a DVD (digital versatile disk), CD or the like as the recording medium, whereby music appreciation, film appreciation, games, and the Internet can be performed. The active matrix or passive matrix liquid crystal display device or EL display device in the present invention can be applied to the display portions 3304 and 3305.

Figure 28E:
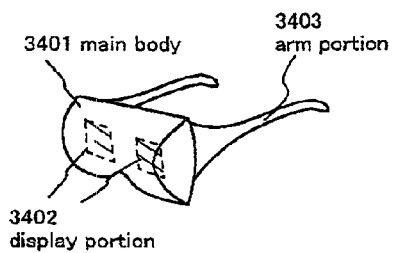

FIG. 28E is a goggle type display, which contains a main body 3401, a display portion 3402, and arm portions 3403. The active matrix or passive matrix liquid crystal display device or EL display device in the present invention can be applied to the display portion 3402.

Figure 28F:
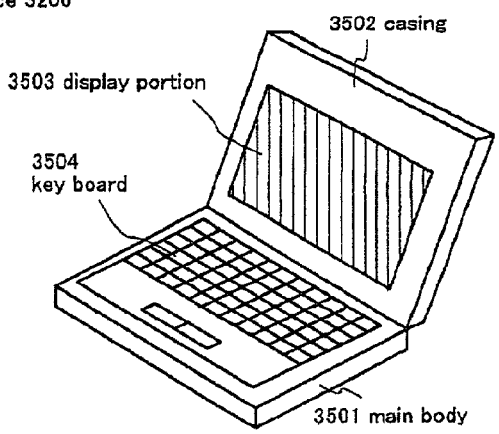

FIG. 28F is a personal computer, which is composed of a main body 3501, a casing 3502, a display portion 3503, a key board 3504, and the like. The active matrix or passive matrix liquid crystal display device or EL display device in the present invention can be applied to the display portion 3503.

Figure 29A:
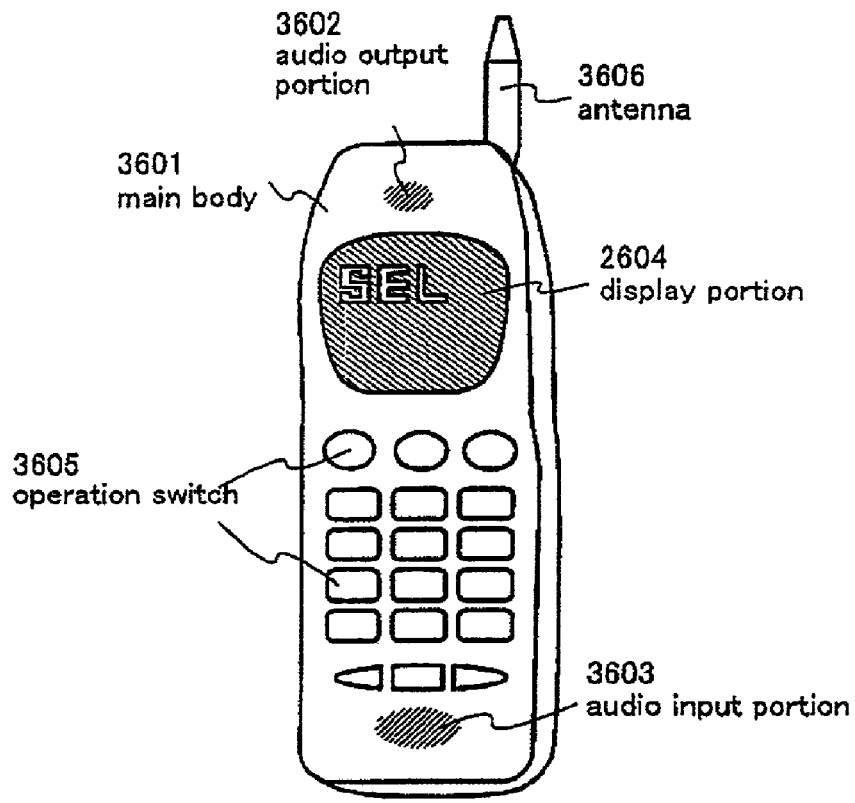
FIGS. 29(A) and 29(B) Views showing one example of an electronic equipment to which the present invention in the application is applied.

FIG. 29A is a cellular phone, which contains a main body 3601, an audio output portion 3602, an audio input portion 3603, a display portion 3604, operation switches 3605, and an antenna 3606. The active matrix or passive matrix liquid crystal display device or EL display device in the present invention can be applied to the display portion 3604.

Figure 29B:
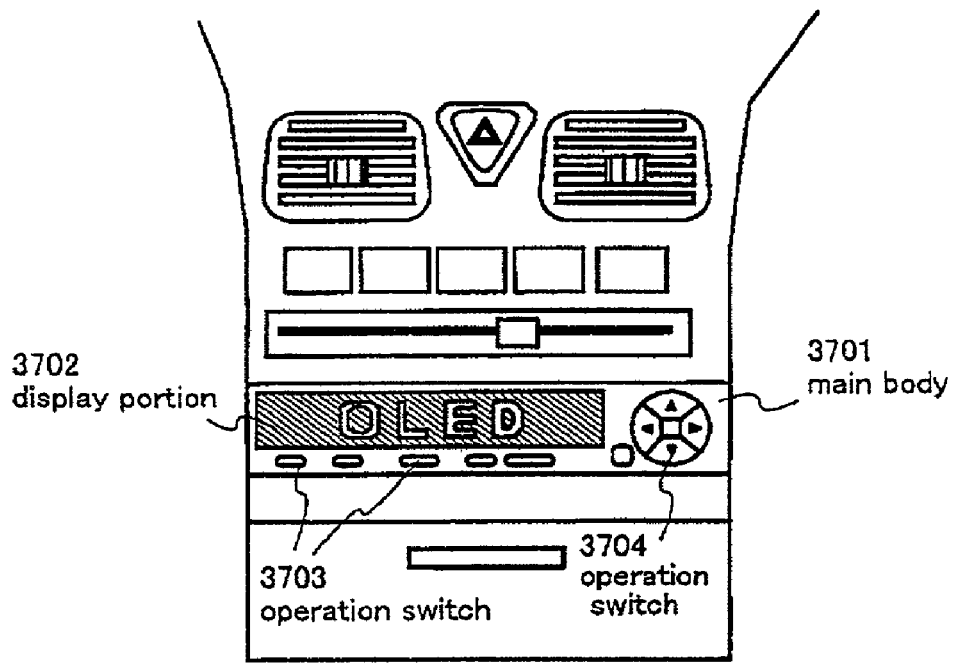

FIG. 29B is a sound playback device, specifically, a car audio system, which contains a main body 3701, a display portion 3702, and operation switches 3703 and 3704. The active matrix or passive matrix liquid crystal display device or EL display device in the present invention can be applied to the display portion 3702. Also, in this embodiment, an audio mounted in an automobile is shown, however, may be used as a cellular type or domestic sound playback device.

As described above, the application range of the present invention is so wide that it can be applicable to electronic equipment in all fields. The electronic equipment of this embodiment can be obtained by using any structure resulting from any combination of Embodiments 2 to 17. Note that although the TFT is disclosed as the switching element of the pixel in the preferred embodiments of the present invention, a TFD (thin film diode) or the like may be used as the switching element of the pixel.

Effects of the Invention

According to the present invention in the application, in the semiconductor device in which the semiconductor display device capable of displaying a still image (or moving image with a short time) is incorporated, the memory portion is mounted on the substrate on which the pixel portion is formed. As result, there are provided the semiconductor display device capable of suppressing consumption power to low in the case where the still image is displayed and the semiconductor device in which the semiconductor display device is incorporated.

Also, according to the present invention in the application, the memory portion and the memory control circuit may be provided on the substrate on which the pixel portion is formed. When such a structure is used, the still image (or moving image with a short time) can be displayed by inputting only simple control signals from the outside of the substrate on which the pixel portion is formed. Thus, the semiconductor display device having low consumption power and the semiconductor device in which the semiconductor display device is incorporated are realized.

The invention claimed is:

1. A semiconductor device including at least a pixel portion, a data line side driver circuit, a scanning line side driver circuit, and a memory portion, wherein,
said pixel portion is formed over a first substrate,
said data line side driver circuit and said memory portion are formed over a second substrate,
said scanning line side driver circuit is integrally formed over a third substrate,
said second substrate and said third substrate are provided in a region except for said pixel portion over said first substrate and are connected with said pixel portion such that a signal from said data line side driver circuit and a signal from said scanning line side driver circuit are input to the pixel region, and
the semiconductor device has a function for displaying an image in accordance with image data stored in said memory portion.

2. A semiconductor device according to claim 1, wherein said second substrate and said third substrate have the same thickness as said first substrate.

3. A semiconductor device according to claim 1, wherein said second substrate and said third substrate are made of the same material as said first substrate.

4. A semiconductor device according to claim 1, wherein said second substrate and said third substrate are one of a substrate having an insulating surface, an SOI substrate, and a silicon substrate.

5. A semiconductor device according to claim 1, wherein said semiconductor device has a function of displaying a still image in accordance with the image data stored in said memory portion.

6. A semiconductor device according to claim 1, wherein said semiconductor device includes a memory control circuit, and
said memory control circuit and said memory portion are formed over the same substrate.

7. A semiconductor device according to claim 1, wherein said semiconductor device is composed of a first region having a function of displaying the image and a second region having a function of supplying the image data to said first region,
said first region includes the substrate on which the pixel portion is formed, and
the semiconductor device includes a first display method of displaying the image in accordance with the image data supplied from said second region and a second display method of displaying the image in accordance with the image data stored in the memory portion provided in said first region.

8. A semiconductor device of claim 7, wherein power consumed in said semiconductor device by said second display method is 70% or lower of power consumed in said semiconductor device by said first display method.

9. A semiconductor device of claim 7, wherein when said second display method is performed, 50% or higher of power consumed in said semiconductor device is consumed in said first region.

10. A semiconductor device of claim 7, wherein when said second display method is performed, 90% or higher of power consumed in said semiconductor device is consumed in said first region.

11. A semiconductor device of claim 7, wherein said first display method is controlled by a CPU provided in said second region,
said second display method is controlled by a control circuit provided in said first region, and
said second display method can be performed with a state in which a power source of said CPU is turned off.

12. A semiconductor device group composed of a first semiconductor device having a function of displaying an image and a second semiconductor device having a function of supplying image data to said first semiconductor device,
said first semiconductor device is a semiconductor device according to claim 1, wherein,
said semiconductor device group includes a first display method of displaying the image data supplied from said second semiconductor device and a second display method of displaying the image in accordance with the image data stored in the memory portion included in said first semiconductor device.

13. A device comprising:
a pixel portion over a first substrate;
a data line side driver circuit provided over a second substrate and operationally connected to the pixel portion;
a memory portion provided over the second substrate and operationally connected to the data line side driver circuit;
a memory control circuit provided over the second substrate and operationally connected to the memory portion wherein an image signal is input to said memory control circuit, and said image signal is transferred from said memory control circuit to said memory portion, and further from said memory portion to said data line side driver circuit,
wherein said second substrate is provided in a region except for said pixel portion over said first substrate.

14. The device according to claim 13 wherein said memory is selected from the group consisting of SRAM, DRAM, and EEPROM.

15. A device comprising:
a pixel portion over a first substrate;
a data line side driver circuit provided over a second substrate and operationally connected to the pixel portion;
a memory portion provided over the second substrate and operationally connected to the data line side driver circuit;
a memory control circuit provided over the second substrate and operationally connected to the memory portion and the data line side driver circuit wherein an image signal is input to said memory control circuit, and said image signal is transferred from said memory control circuit to said memory portion, and further from said memory portion to said data line side driver circuit, wherein said second substrate is provided in a region except for said pixel portion over said first substrate.

16. The device according to claim 15 wherein said memory is selected from the group consisting of SRAM, DRAM, and EEPROM.

17. A device comprising:
an input terminal;
a first control circuit operationally connected to the input terminal;
a second control circuit operationally connected to the first control circuit;
at least one first memory operationally connected to the first control circuit;
a memory control circuit operationally connected to the second control circuit;
a memory portion operationally connected to the memory control circuit;
a data line side driver circuit operationally connected to the memory portion; and
a pixel portion operationally connected to the data line side driver circuit,
wherein all of the first control circuit, the second control circuit, the first memory, the memory control circuit, the memory portion, the data line side driver circuit and the pixel portion are provided adjacent to a same substrate.

18. The device according to claim 17 wherein said memory is selected from the group consisting of SRAM, DRAM, and EEPROM.

* * * * *